(12) United States Patent
Kobayashi et al.

(10) Patent No.: US 8,928,130 B2
(45) Date of Patent: Jan. 6, 2015

(54) LEAD FRAME INCLUDING AN INSULATING RESIN LAYER ENTIRELY COVERING LEAD SURFACE, AND SEMICONDUCTOR DEVICE INCLUDING THE SAME

(71) Applicant: Shinko Electric Industries Co., Ltd., Nagano-ken (JP)

(72) Inventors: Toshio Kobayashi, Nagano (JP); Hiroshi Shimizu, Nagano (JP); Toshiyuki Okabe, Nagano (JP); Yasuyuki Kimura, Nagano (JP); Kazutaka Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/848,225

(22) Filed: Mar. 21, 2013

(65) Prior Publication Data

US 2013/0256854 A1 Oct. 3, 2013

(30) Foreign Application Priority Data

Mar. 27, 2012 (JP) ................................. 2012-072110
Jul. 4, 2012 (JP) ................................. 2012-150495

(51) Int. Cl.
*H01L 23/495* (2006.01)
*H01L 23/36* (2006.01)
*H01L 23/498* (2006.01)
*H01L 21/48* (2006.01)
*H01L 23/00* (2006.01)
*H01L 25/065* (2006.01)

(52) U.S. Cl.
CPC .... *H01L 23/49586* (2013.01); *H01L 23/49568* (2013.01); *H01L 23/36* (2013.01); *H01L 23/49861* (2013.01); *H01L 21/4828* (2013.01); *H01L 23/49548* (2013.01); *H01L 2224/48137* (2013.01); *H01L 24/49* (2013.01); *H01L 2224/16245* (2013.01); *H01L 2224/45124* (2013.01); *H01L 2224/45144* (2013.01); *H01L 2224/48091* (2013.01); *H01L 2224/4911* (2013.01); *H01L 2924/18301* (2013.01); *H01L 2224/48248* (2013.01); *H01L 24/16* (2013.01); *H01L 24/48* (2013.01); *H01L 2224/13111* (2013.01); *H01L 2224/13116* (2013.01); *H01L 2224/13144* (2013.01); *H01L 2224/16238* (2013.01); *H01L 25/0655* (2013.01); *H01L 2924/3025* (2013.01)
USPC ............... 257/675; 257/666; 257/72; 257/73; 257/717; 257/720; 257/738; 257/737; 257/778; 257/784; 257/786; 257/698; 257/774; 257/773

(58) Field of Classification Search
USPC ......... 257/675, 666, 712, 713, 717, 720, 738, 257/737, 778, 784, 786, 698, 774, 773
See application file for complete search history.

(56) References Cited

U.S. PATENT DOCUMENTS 6,870,244 B2 * 3/2005 Yamashita et al. ............ 257/668
7,514,772 B2 * 4/2009 Kobayashi et al. ........... 257/686
2006/0244131 A1 * 11/2006 Kobayashi et al. ........... 257/724

FOREIGN PATENT DOCUMENTS

JP 2003-309241 10/2003

* cited by examiner

*Primary Examiner* — Alexander Oscar Williams
(74) *Attorney, Agent, or Firm* — Fish & Richardson P.C.

(57) ABSTRACT

A lead frame includes a plurality of leads defined by an opening extending in a thickness direction. An insulating resin layer fills the opening to entirely cover side surfaces of each lead and to support the leads. A first surface of each lead is exposed from a first surface of the insulating resin layer.

15 Claims, 29 Drawing Sheets

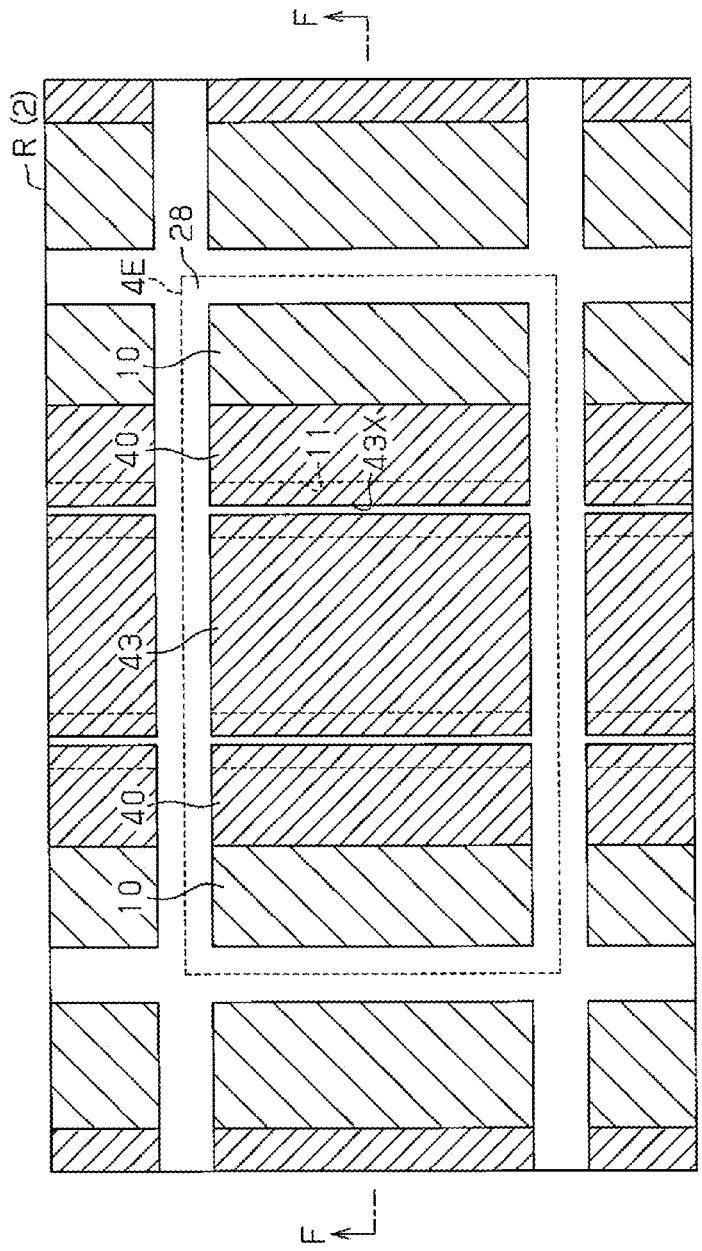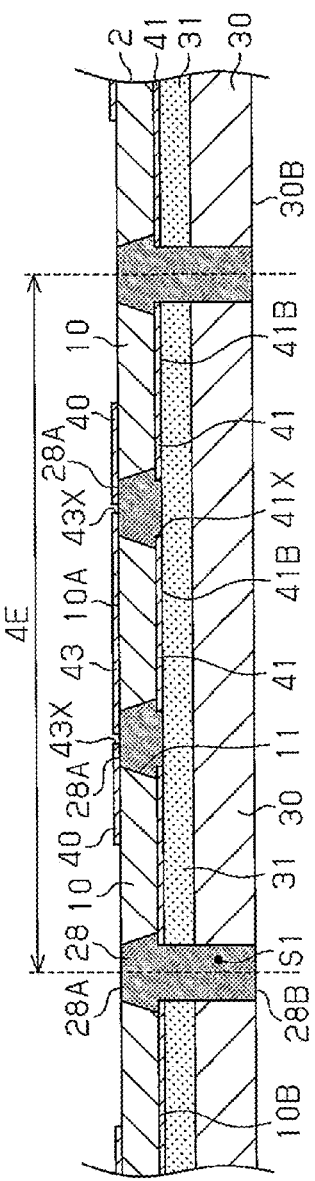
Fig.21A
Fig.21B

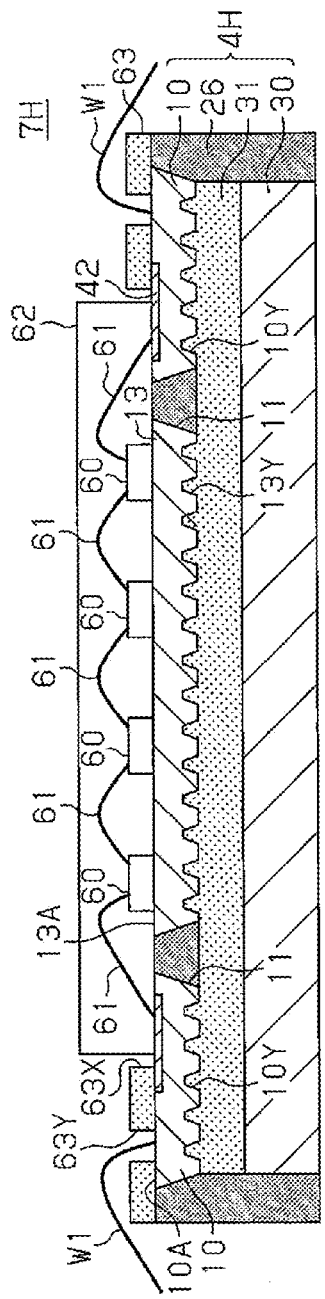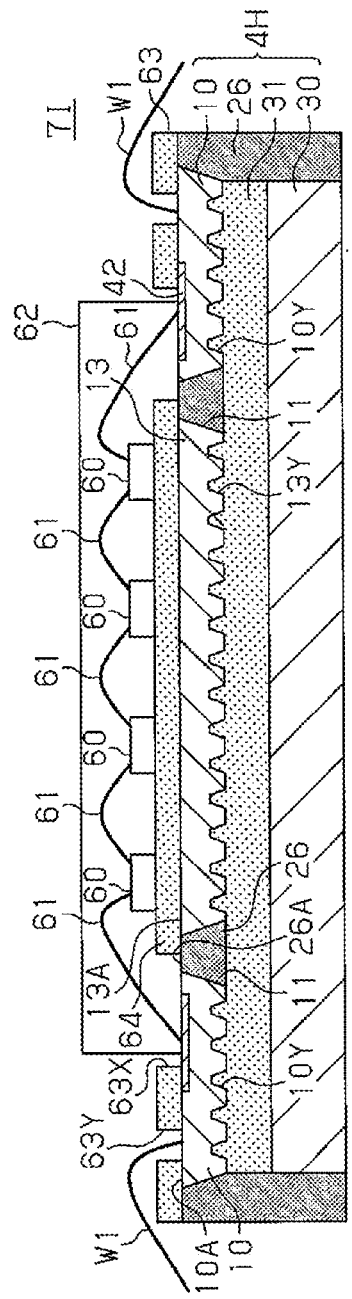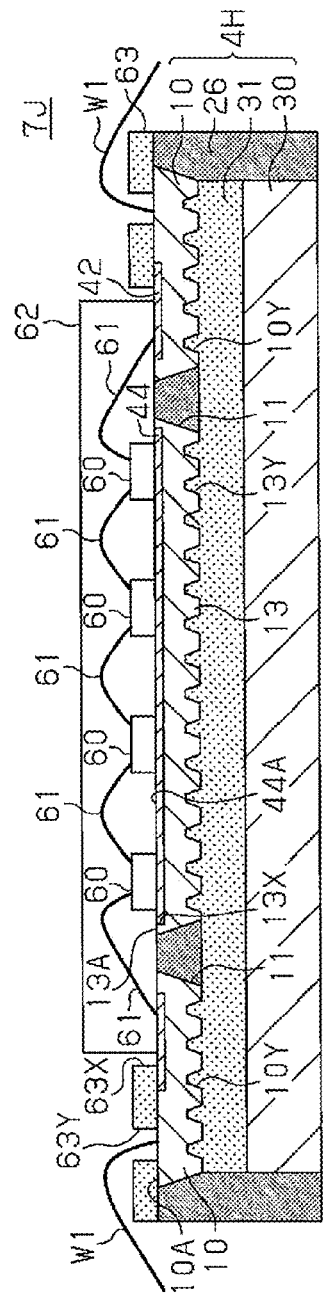

LEAD FRAME INCLUDING AN INSULATING RESIN LAYER ENTIRELY COVERING LEAD SURFACE, AND SEMICONDUCTOR DEVICE INCLUDING THE SAME

CROSS-REFERENCE TO RELATED APPLICATIONS

This application is based upon and claims the benefit of priority from prior Japanese Patent Application Nos. 2012-072110, filed on Mar. 27, 2012, and 2012-150495, filed on Jul. 4, 2012, the entire contents of which are incorporated herein by reference.

BACKGROUND ART

The present disclosure relates to a lead frame, a semiconductor device, and a method for manufacturing a lead frame.

FIGS. 27A and 27B illustrate an example of a conventional lead frame used to manufacture a quad flat no-leads (QFN) semiconductor device. FIG. 27A is a plan view illustrating a portion of a lead frame including an array of multiple unit lead frames. FIG. 27B illustrates a cross-section taken along line G-G in FIG. 27A.

As illustrated in FIG. 27A, a unit lead frame 70 includes a section bar 71 having the form of a grid, four support bars 72 extending from the section bar 71, a die pad 73 supported by the four support bars 72, and a plurality of leads 74 extending, like comb teeth, from the section bar 71 toward the die pad 73. The unit lead frame 70 includes openings 75 that form the section bar 71, the support bars 72, the die pad 73, and the leads 74. As illustrated in FIG. 27B, each opening 75 is filled with an insulating resin layer 76.

FIG. 27C illustrates a cross-section of a QFN semiconductor device 80 fabricated with the unit lead frame 70. The semiconductor device 80 includes the unit lead frame 70, a semiconductor element 81 mounted on the die pad 73, bonding wires 82 that electrically connect the semiconductor element 81 and the leads 74, and an encapsulating resin portion 83 that encapsulates the semiconductor element 81, the bonding wires 82, and other components.

A method for manufacturing the semiconductor device 80 includes mounting the semiconductor element 81 onto the die pad 73 of the unit lead frame 70 (die bonding), electrically connecting the electrode terminals of the semiconductor element 81 to the corresponding leads 74 with the bonding wires 82 (wire bonding), encapsulating the semiconductor element 81, the bonding wires 82, and other components with the resin portion 83, and dividing the lead frame illustrated in FIG. 27B into individual semiconductor devices by cutting the lead frame at the cutting lines (indicated by broken lines in the drawing) with, for example, a dicing saw (dicing). The use of the lead frame including the array of the multiple unit lead frames 70 is preferable because it enables mass production of semiconductor devices 80.

The above conventional technique is described in, for example, Japanese Laid-Open Patent Publication No. 2003-309241.

SUMMARY

Referring to FIG. 27C, the dicing removes the entire section bar 71. After the dicing, the cut side surfaces of the leads 74, previously supported by the section bar 71, are exposed. The leads 74 are typically formed from copper, which easily oxidizes and corrodes. The leads 74 having the exposed side surfaces can oxidize to form copper oxide on the surfaces. Such copper oxide increases the wiring resistance of the leads.

One aspect of the embodiments is a lead frame including a plurality of leads defined by an opening extending in a thickness direction, an insulating resin layer that fills the opening to entirely cover all side surfaces of each lead and to support the leads. A first surface of each lead is exposed from a first surface of the insulating resin layer.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF THE DRAWINGS

FIG. 21A is an enlarged plan view of a lead frame in a modification;

FIG. 21B is a schematic cross-sectional view taken along line F-F of FIG. 21A;

FIGS. 25A to 25C are schematic cross-sectional views of semiconductor devices;

DETAILED DESCRIPTION OF EMBODIMENTS

Embodiments will now be described with reference to the attached drawings. To facilitate understanding, the drawings illustrate the features of the embodiments in an enlarged state, and the illustrated components may not be depicted in actual state. Further, the cross-sectional views illustrate some components without hatching lines to facilitate understanding.

First Embodiment

A first embodiment will now be described with reference to FIGS. 1A to 3D.

Structure of Lead Frame of First Embodiment

Figure 1A:
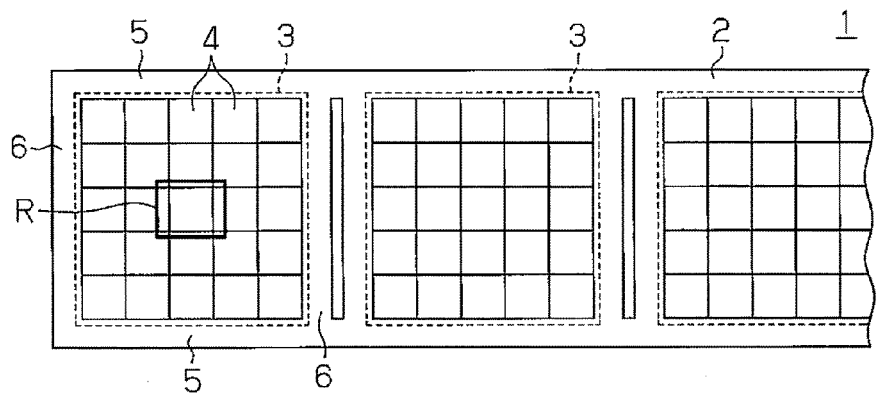
FIG. 1A is a schematic plan view of a lead frame according to a first embodiment.

As illustrated in FIG. 1A, a lead frame 1 includes a substrate frame 2, which is substantially tetragonal as viewed from above. The substrate frame 2 may be formed from, for example, copper, a copper-base alloy, a Fe—Ni alloy, or a Fe—Ni-base alloy. The substrate frame 2 has a thickness of, for example, about 0.05 to 0.25 mm.

The substrate frame 2 includes a plurality of (e.g., three) resin encapsulating areas 3, which are isolated from one another. Each resin encapsulating area 3 contains a matrix of (e.g., 5 by 5) unit lead frames 4. A semiconductor element such as a light-emitting element is mounted on each unit lead frame 4. Each unit lead frame 4 is then cut out as a semiconductor device (package). A pair of rails 5, which extend in a longitudinal direction (horizontal direction in FIG. 1A), and a pair of rails 6, which extend in a lateral direction (vertical direction in FIG. 1A), are arranged along the periphery of each resin encapsulating area 3. When assembling such semiconductor devices, molded array packaging is performed for each resin encapsulating area 3. This encapsulates the unit lead frames 4, on each of which a semiconductor element has been mounted, with resin.

Figure 1B:
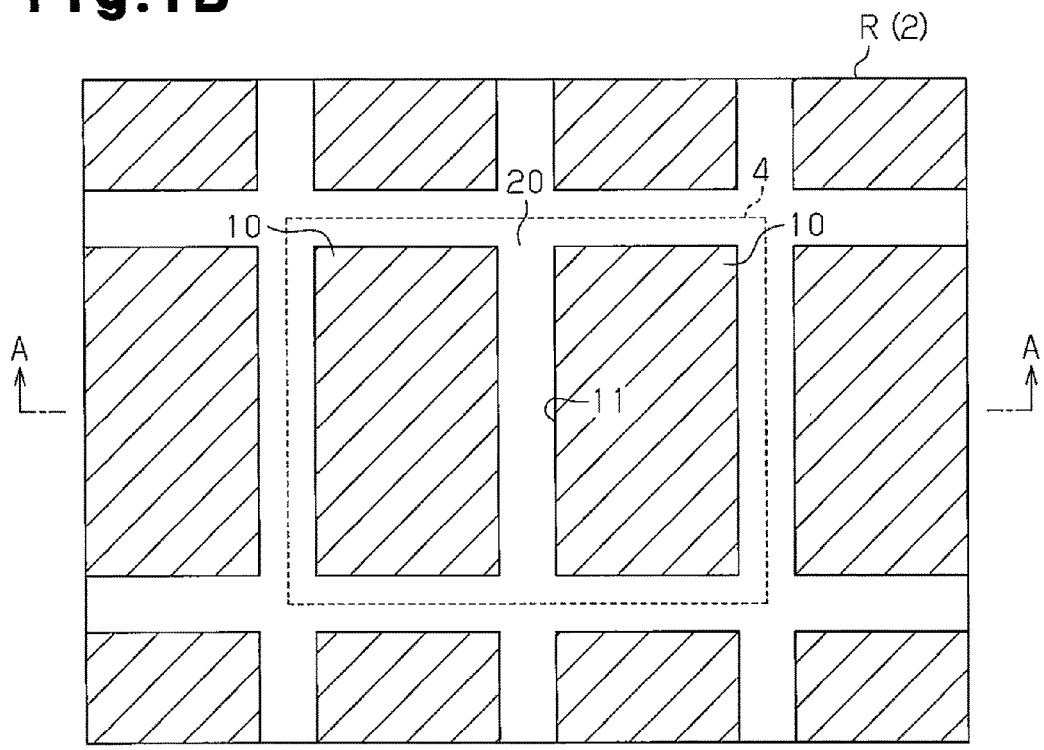
FIG. 1B is an enlarged plan view of area R illustrated in FIG. 1A.

As indicated by the broken lines in FIG. 1B, each unit lead frame 4 includes a plurality of (e.g., two) leads 10 and an insulating resin layer 20 formed between the leads 10.

Each lead 10 may be substantially tetragonal as viewed from above. The leads 10 arranged in each unit lead frame 4 extend parallel and proximal to one another in the middle portion of the unit lead frame 4. The leads 10 are physically separated from each other by an opening 11 formed in the substrate frame 2. The opening 11 also physically separates leads 10 of adjacent unit lead frames 4. In one example, each lead 10 may have a thickness of, for example, about 0.05 to 0.25 mm, in the same manner as the substrate frame 2.

Figure 1C:
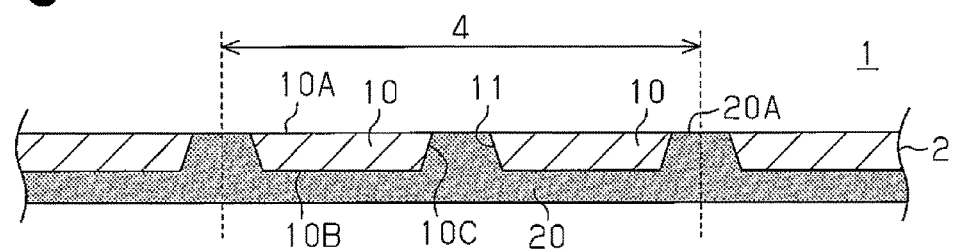
FIG. 1C is a schematic cross-sectional view taken along line A-A of FIG. 1B.

As illustrated in FIG. 1C, the opening 11 is a through hole extending in the thickness direction of the substrate frame 2. In a preferred example, the opening 11 has a diameter that increases from its end corresponding to a first surface (e.g., upper surface) 10A of the lead 10 toward its end corresponding to a second surface (e.g., lower surface) 10B of the lead 10. The inner wall surfaces of the opening 11 are the surfaces of the substrate frame 2 in the thickness direction, as well as the side surfaces of each lead 10.

The insulating resin layer 20 covers the entire side surfaces 10C of each lead 10. More specifically, the insulating resin layer 20 fills the opening 11. The insulating resin layer 20 also covers the lower surface 10B of each lead 10. The insulating resin layer 20 has an upper surface 20A substantially flush with the upper surface 10A of each lead 10 on which a semiconductor element is to be mounted. The insulating resin layer 20 supports the leads 10. More specifically, the insulating resin layer 20 supports the leads 10 arranged in each unit lead frame 4 on the rails 5 and 6 (refer to FIG. 1A).

The insulating resin layer 20 may be formed from molded resin obtained by, for example, transfer molding, compression molding, or injection molding. The molded resin may be, for example, heat-curable epoxy resin. The thickness of the insulating resin layer 20, or the distance from the lower surface 10B of the lead 10 to the lower surface of the insulating resin layer 20, may be, for example, about 50 to 150 μm.

Operation

The insulating resin layer 20, which covers the entire side surfaces 10C of each lead 10, supports the leads 10. This structure eliminates components used in conventional structures such as support bars and section bars. When the unit lead frames 4 are singulated by cutting the insulating resin layer 20 at the positions indicated by the broken lines illustrated in FIG. 1C, the cut surfaces include no exposed side surfaces of the substrate frame 2 (leads 10).

Method for Manufacturing Lead Frame of First Embodiment

Figure 2A:
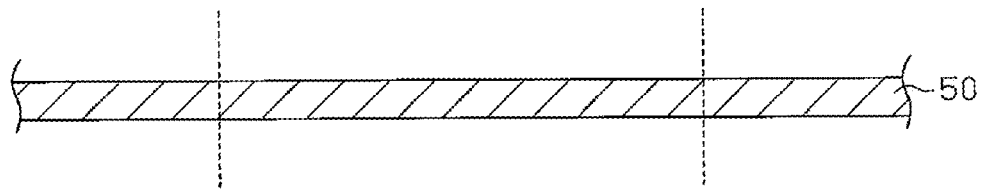
FIGS. 2A to 2D are schematic cross-sectional views illustrating a method for manufacturing the lead frame of the first embodiment, each illustrating a cross-section taken along line A-A of FIG. 1B.

As illustrated in FIG. 2A, a conductive substrate 50, which serves as a base material for the substrate frame 2, is prepared. The conductive substrate 50 may be a metal plate formed from Cu, a Cu-base alloy, a Fe—Ni alloy, or a Fe—Ni-base alloy. The conductive substrate 50 may have a thickness of, for example, about 0.05 to 0.25 mm.

Figure 2B:
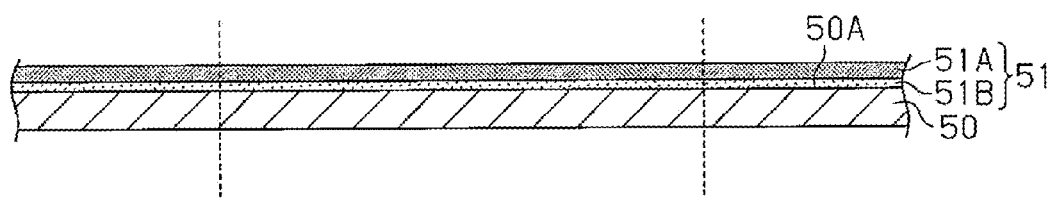

In the process (first process) illustrated in FIG. 2B, a tape 51 is adhered to a first surface (e.g., upper surface) 50A of the conductive substrate 50. In detail, the tape 51, which is formed by a sheet of a tape base 51A including an adhesive 51B applied to one of its sides, is adhered to the conductive substrate 50 with the surface 51C of the adhesive 51B adhered to the upper surface 50A. In one example, the sheet of tape 51 is laminated on the upper surface 50A of the conductive substrate 50 through thermocompression. The tape 51 may be formed from a material highly resistant to chemicals and to heat. In detail, the tape base 51A may be formed from a material with high processability, such as polyimide resin and polyester resin. The adhesive 51B may be formed from a material that can easily peel off from an insulating resin layer 20 (refer to FIG. 1C), which is formed by molding in a subsequent process. The adhesive 51B may be formed from a silicone adhesive material, an acrylic adhesive material, and/or an olefin adhesive material. The tape base 51A has a thickness of, for example, about 30 to 50 μm. The adhesive 51B has a thickness of, for example, about 20 to 30 μm.

Figure 2C:
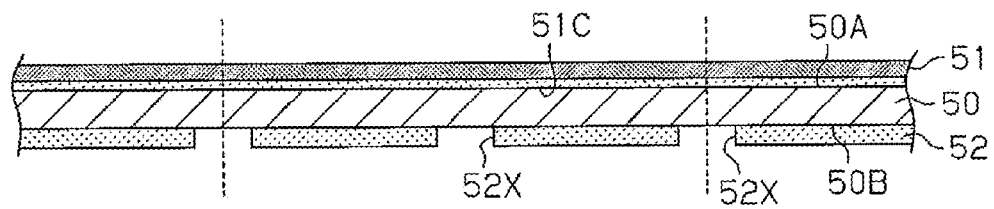

In the subsequent process illustrated in FIG. 2C, a resist layer 52, which includes openings 52X formed in conformance with the openings 11, is formed on a second surface (e.g., lower surface) 50B of the conductive substrate 50. The resist layer 52 may be formed from a material resistant to etching. In detail, the resist layer 52 may be formed from a photosensitive dry film resist or a liquid photoresist (dry film resist or liquid resist such as novolac resin or acrylic resin). When a photosensitive dry film resist is used, a dry film of the resist is laminated on the lower surface 50B of the conductive substrate 50 through thermocompression. The dry film is then patterned by exposure and development to form the resist layer 52. The resist layer 52 can also be formed from a liquid photoresist through the same process as described for the dry film resist.

Figure 2D:
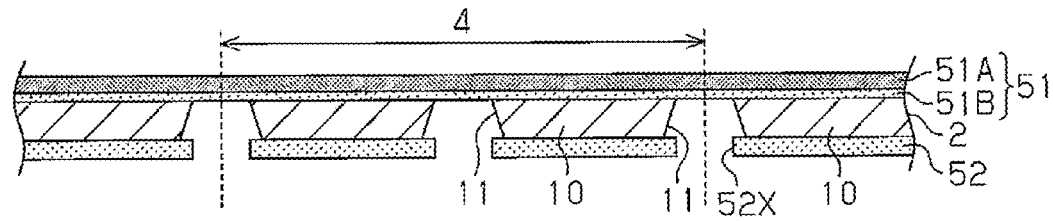

The conductive substrate 50 undergoes etching performed on its lower surface 50B using the resist layer 52 as an etching mask to form the substrate frame 2 illustrated in FIG. 2D (second process). More specifically, part of the conductive substrate 50 exposed through the opening 52X of the resist layer 52 is etched through the lower surface 50B to form an opening 11 in the conductive substrate 50. This completes the substrate frame 2. The opening 11 defines the plurality of leads 10 in each unit lead frame 4. When the conductive substrate 50 is patterned by performing wet etching (isotropic etching), an etchant used in the wet etching process should be selected in accordance with the material of the conductive substrate 50. For example, when the conductive substrate 50 is formed from copper, a ferric chloride solution may be used as the etchant. This allows for spray etching from the lower surface 50B of the conductive substrate 50 to pattern the conductive substrate 50. During such patterning performed by wet etching, side etching occurs in the conductive substrate 50 and the etching proceeds in the in-plane direction of the substrate. This shapes the leads 10 to have trapezoidal cross-sections. In this process, the tape 51 functions as an etching stopper layer.

In this process, as described above, when the tape 51 is adhered, the conductive substrate 50 is patterned to form the substrate frame 2 (leads 10). Even though the etching leaves only the leads 10, the tape 51 supports the leads 10. This differs from the conventional process in which the section bars and the support bars also remain after etching. In other words, the tape 51 in this process functions as a temporary base for supporting the substrate frame 2 (leads 10) at predetermined positions.

Figure 3A:
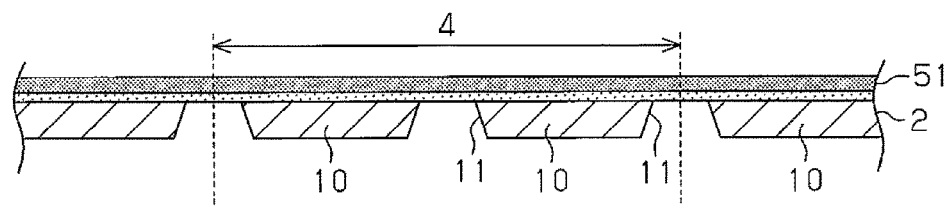
FIGS. 3A to 3D are schematic cross-sectional views illustrating a method for manufacturing the lead frame of the first embodiment, each illustrating a cross-section taken along line A-A in FIG. 1B.

In the process illustrated in FIG. 3A, the resist layer 52 illustrated in FIG. 2D is removed with, for example, an alkaline delamination solution.

Figure 3B:
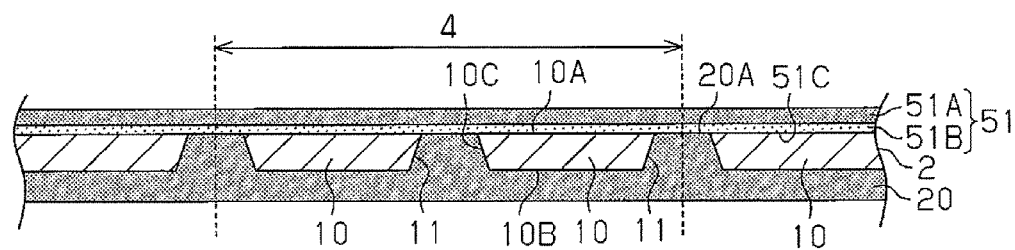

In the subsequent process (third process) illustrated in FIG. 3B, an insulating resin layer 20 is formed on the surface 51C of the tape 51 to encapsulate the substrate frame 2 (specifically, leads 10). More specifically, the insulating resin layer 20 is formed on the surface 51C of the tape 51 to cover the lower surfaces 10B and the side surfaces 10C of the leads 10. The insulating resin layer 20 can be formed by, for example, resin molding. When a heat-curable resin is used as the material of the insulating resin layer 20, the structure illustrated in FIG. 3A is first placed in a mold. The resin, provided from a gate (not illustrated), is then filled into the corresponding resin encapsulating area 3 (refer to FIG. 1A), while heating and pressurizing the structure. This forms the insulating resin layer 20, which fills the opening 11 and covers the lower surfaces 10B of the leads 10 as illustrated in FIG. 3B. In this manner, molded array packaging is performed for each resin encapsulating area 3 to form the insulating resin layer 20 embedding the leads 10 on the tape 51. The upper surface 10A of each lead 10 and the upper surface 20A of the insulating resin layer 20, which come in contact with the surface 51C of the tape 51, are formed to correspond with the surface 51C (flat surface) of the tape 51. The upper surface 10A of each lead 10 and the upper surface 20A of the insulating resin layer 20 are flat and flush with each other. The resin is filled by, for example, transfer molding or injection molding. During the encapsulation process, the tape 51 prevents leakage (also referred to as mold flash) of the insulating resin layer 20 onto the upper surface 10A of each lead 10.

After the encapsulation, the structure covered by the insulating resin layer 20 (refer to FIG. 3B) is removed from the mold. The insulating resin layer 20 formed in this process supports the leads 10 in each resin encapsulating area 3 on the rails 5 and 6 (refer to FIG. 1A).

Figure 3C:
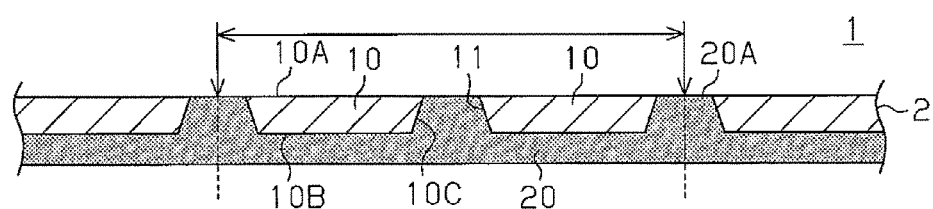

In the process (fourth process) illustrated in FIG. 3C, the tape 51 illustrated in FIG. 3B is delaminated and removed. However, after removal of the tape 51, the adhesive 51B on the tape 51 (refer to FIG. 3B) may partially remain on the upper surface 10A of the lead 10. The remaining adhesive 51B may be eliminated by, for example, performing asking (dry etching using an oxygen plasma). The removal of the tape 51 exposes the upper surfaces 10A of the leads 10 and the upper surface 20A of the insulating resin layer 20, which are flush with each other as described above.

The manufacturing processes described above yield the lead frame 1 having the structure illustrated in FIGS. 1A to 1C, which includes the matrix of unit lead frames 4 each including the leads 10 and the insulating resin layer 20. In one example, one or more semiconductor elements are mounted onto each unit lead frame 4 of the lead frame 1. The lead frame 1 then undergoes molded array packaging, which encapsulates the semiconductor devices mounted on the plurality of unit lead frames 4. Alternatively, the lead frame 1 may be first singulated into individual unit lead frames (lead frames) 4 by cutting the insulating resin layer 20 at positions indicated by the arrows in the figure with a dicing saw as illustrated in FIG.

3D. One or more semiconductor elements may then be mounted onto each individual unit lead frame 4. In this case, the semiconductor elements are encapsulated by molding one individual unit lead frame 4 at a time.

Advantages

The above embodiment has the advantages described below.

(1) The insulating resin layer 20, which covers the entire side surfaces 10C of each lead 10, supports the leads 10. This structure does not include components used in the conventional structures such as support bars and section bars. When these unit lead frames 4 are singulated by cutting the insulating resin layer 20 at the positions indicated by the broken lines illustrated in FIG. 1C, the cut surfaces include no exposed side surfaces 10C of the leads 10 (substrate frame 2). This prevents the leads 10 from oxidizing.

(2) Although the conventional semiconductor device 80 has poor insulation due to metal (leads 74) exposed partially on its side surfaces, the lead frame 1 of the present embodiment covers the entire side surfaces 10C of the leads 10 with the insulating resin layer 20 after the lead frame 1 is singulated into individual unit lead frames 4. This structure increases the insulation reliability of the unit lead frame 4 as well as by the semiconductor device including the unit lead frame 4.

(3) The conductive substrate 50, while adhered to the tape 51, is patterned to form the substrate frame 2 (leads 10). Even though only the leads 10 remain after etching, the tape 51 supports the leads 10. This differs from the conventional process that leaves the section bars and the support bars after etching. Further, the insulating resin layer 20 encapsulates the leads 10, which are supported by the tape 51. The tape 51 is then removed. In this process, the tape 51 is removed after the insulating resin layer 20 supporting the leads 10 is formed. The insulating resin layer 20 continues to hold (support) the leads 10 at predetermined positions after the tape 51 is removes. This structure eliminates the components for supporting the leads 10, such as section bars and support bars, which are included in the conventional structures.

Modification of First Embodiment

The first embodiment may be modified in the following forms.

In the first embodiment, the insulating resin layer 20 may be formed to expose the lower surfaces 10B of the leads 10. For example, the insulating resin layer 20 in the structure illustrated in FIG. 3B may be thinned until the lower surfaces 10B of the leads 10 are exposed. Alternatively, the structure illustrated in FIG. 3A and a semi-cured resin sheet on the lower surface of the structure may be arranged between two plates, an upper plate and a lower plate, to pressurize and heat the structure from two sides with a press machine. This melts the resin sheet. The molten resin fills the opening 11, forming the insulating resin layer 20. At the same time, the lower surfaces 10B of the leads 10 are exposed.

Second Embodiment

A second embodiment will now be described with reference to FIGS. 4A to 5D. A lead frame 1A of the present embodiment differs from the lead frame of the first embodiment in that each unit lead frame 4A includes a heat radiating plate 30. The second embodiment will now be described focusing on differences from the first embodiment.

Structure of Lead Frame of Second Embodiment

Figure 4A:
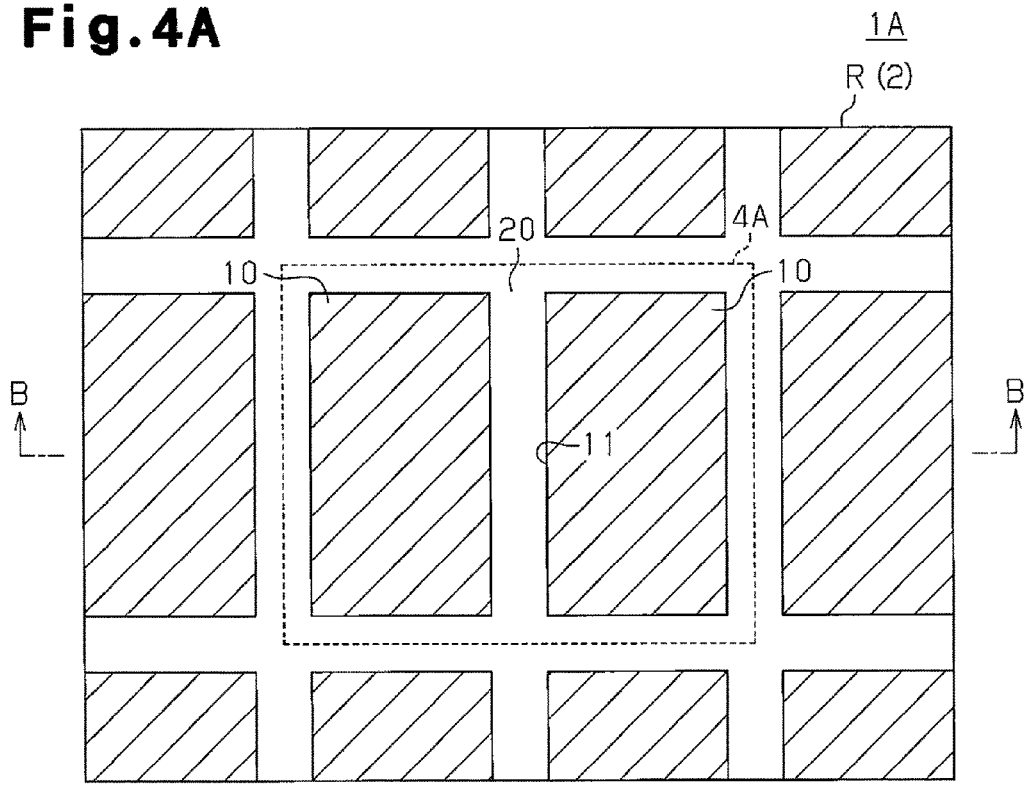
FIG. 4A is an enlarged plan view of a lead frame according to a second embodiment.
Figure 4B:
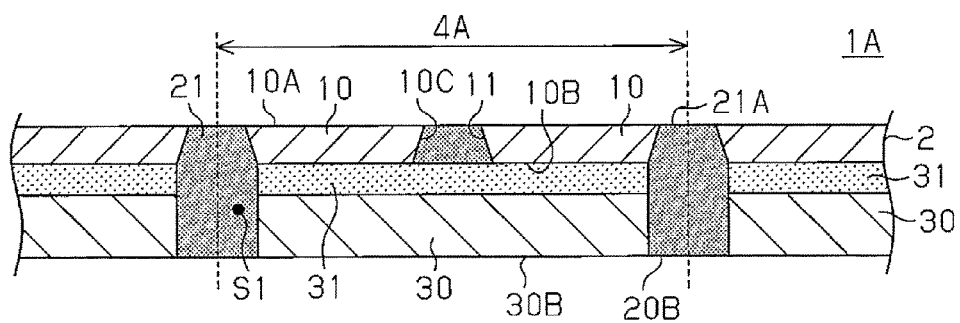
FIG. 4B is a schematic cross-sectional view taken along line B-B in FIG. 4A.

As illustrated in FIG. 4B, each unit lead frame 4A includes a plurality of leads 10, an adhesive layer 31, a heat radiating plate 30, and a resin layer 21.

The adhesive layer 31 is formed on the lower surfaces 10B of the leads 10 arranged in each unit lead frame 4A. More specifically, the adhesive layer 31 bridges the lower surfaces 10B of the opposed leads 10 arranged in the unit lead frame 4A. The adhesive layer 31 is used to adhere the leads 10 to the heat radiating plate 30 and also to insulate the leads 10 from the heat radiating plate 30. The adhesive layer 31 may be, for example, a heat-curable adhesive, such as an epoxy, polyimide, or silicone adhesive, or a thermosetting adhesive, such as a liquid crystal polymer. The adhesive layer 31 may be a heat conductive member formed from an organic resin binder containing a filler of highly-conductive inorganic material, such as silica, alumina, and boron nitride. The adhesive layer 31 may have a thickness of, for example, about 50 to 150 μm.

The heat radiating plate 30 is adhered to and thermally connected to the leads 10 by the adhesive layer 31. The heat radiating plate 30 is, for example, flat, and tetragonal as viewed from above. The heat radiating plate 30 may be formed from, for example, a metal with high heat conductivity or an alloy containing at least one such metal. The heat radiating plate 30 may be formed from, for example, a ceramic material having high heat conductivity, such as aluminum nitride or alumina. The heat radiating plate 30 may have a thickness of, for example, about 200 to 500 μm.

The resin layer 21 covers the entire side surfaces 10C of each lead 10. More specifically, the resin layer 21 fills the opening 11. The resin layer 21 also covers the entire side surfaces of the adhesive layer 31 as well as the entire side surfaces of the heat radiating plate 30. More specifically, the resin layer 21 fills a space S1 between adhesive layers 31 and heat radiating plates 30 of adjacent unit lead frames 4A. The resin layer 21 has an upper surface 21A substantially flush with the upper surfaces 10A of the leads 10. The resin layer 21 has a lower surface 21B substantially flush with a lower surface 30B of the heat radiating plate 30. The resin layer 21 supports the leads 10 arranged in the corresponding unit lead frame 4A on the rails 5 and 6 (refer to FIG. 1A).

The resin layer 21 may be formed from molded resin obtained by, for example, transfer molding, compression molding, or injection molding. The molded resin may be, for example, heat-curable epoxy resin. Preferably, the molded resin forming the resin layer 21 has a high heat conductivity. The thickness of the resin layer 21, from the upper surface 21A to the lower surface 21B, may be, for example, about 400 to 800 μm.

Method for Manufacturing Lead Frame of Second Embodiment

Figure 5A:
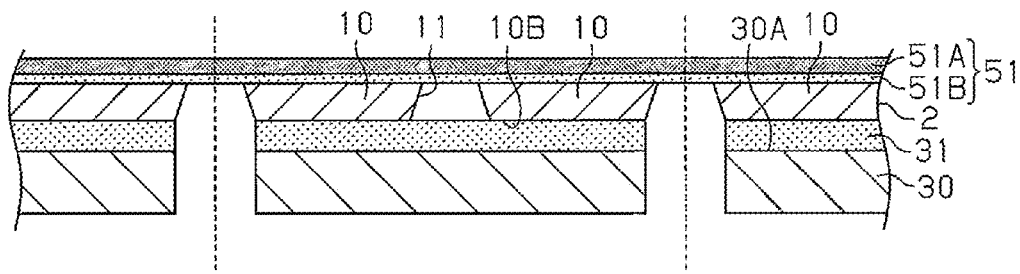
FIGS. 5A to 5D are schematic cross-sectional views illustrating a method for manufacturing the lead frame of the second embodiment, among which FIGS. 5A to 5C each illustrate a cross-section taken along line B-B in FIG. 4A.

In the process illustrated in FIG. 5A, the substrate frame 2 (leads 10) on which the tape 51 is adhered is prepared through the same processes as illustrated in FIGS. 2A to 3A. Subsequently, an adhesive layer 31 and a heat radiating plate 30 are placed on the lower surface of this structure. More specifically, the adhesive layer 31 and the heat radiating plate 30 are stacked on the lower surface of the structure so that the upper surface of the adhesive layer 31 faces the lower surfaces 10B of the leads 10 and the upper surface 30A of the heat radiating plate 30 faces the lower surface of the adhesive layer 31. In other words, the structure, the adhesive layer 31, and the heat radiating plate 30 are stacked so that the adhesive layer 31 is sandwiched between the leads 10 and the heat radiating plate 30. The adhesive layer 31 is in the B-stage (semi-cured).

The structure, the adhesive layer 31, and the heat radiating plate 30 in the above arrangement are heated and pressurized. This causes the upper surface of the adhesive layer 31 to come in contact with the lower surfaces 10B of the leads 10 and the upper surface 30A of the heat radiating plate 30 to come in contact with the lower surface of the adhesive layer 31. The adhesive layer 31 is cured to adhere the heat radiating plate 30 to the leads 10. In one example, the structure illustrated in FIG. 3A, the adhesive layer 31, and the heat radiating plate 30 stacked together as described above may be arranged between two paired heating plates, and the structure may be heated and pressurized from its upper and lower sides using, for example, a vacuum press. This forms the integrated structure illustrated in FIG. 5A.

Figure 5B:
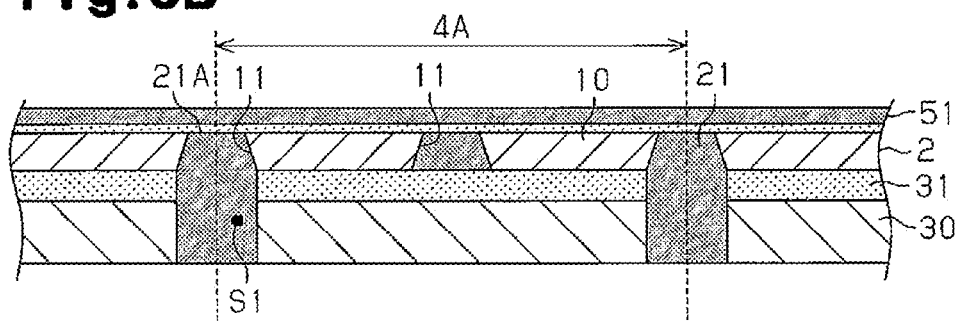

In the process (third process) illustrated in FIG. 5B, molded array packaging is performed to form the resin layer 21, which fills the opening 11 and the space S1 between adhesive layers 31 and heat radiating plates 30 of adjacent unit lead frames 4A. When a heat-curable resin is used as the material of the resin layer 21, the structure illustrated in FIG. 5A is first placed in a mold. The resin, provided from the gate (not illustrated), is then filled into the corresponding resin encapsulating area 3 (refer to FIG. 1A), while the structure is being heated and pressurized. This forms the resin layer 21, which fills the opening 11 and the space S1. The resin may be filled by, for example, transfer molding or injection molding.

Figure 5C:
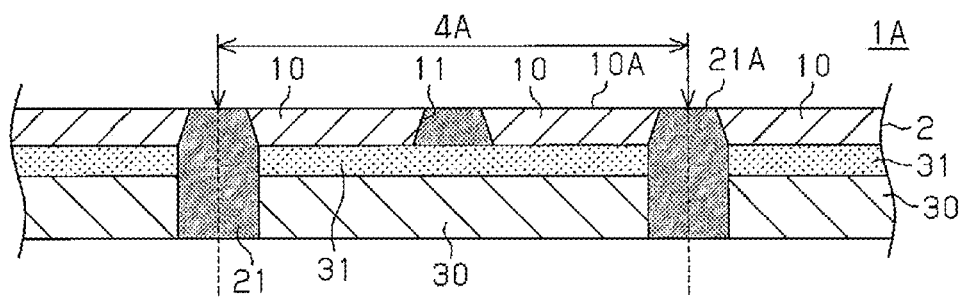

In the process (fourth process) illustrated in FIG. 5C, the tape 51 illustrated in FIG. 5B is removed. This exposes the upper surfaces 10A of the leads 10 and the upper surface 21A of the resin layer 21.

Figure 5D:
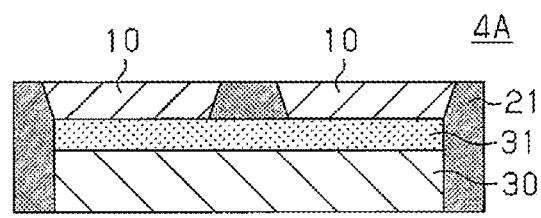

The manufacturing processes described above yield the lead frame 1A having the structure illustrated in FIGS. 4A and 4B, which includes the matrix of unit lead frames 4A each including the leads 10, the adhesive layer 31, the heat radiating plate 30, and the resin layer 21. In one example, one or more semiconductor devices are mounted on each unit lead frame 4A of the lead frame 1A. The lead frame 1A then undergoes molded array packaging, which encapsulates the semiconductor elements mounted on each unit lead frame 4A. Alternatively, the lead frame 1A may be first singulated into individual unit lead frames (lead frames) 4A by cutting the resin layer 21 at positions indicated by the arrows in the figure with a dicing saw as illustrated in FIG. 5D. One or more semiconductor elements may then be mounted on each individual unit lead frame 4A.

Advantages

The above embodiment has the advantage described below in addition to advantages (1) to (3) of the first embodiment.

(4) The heat radiating plate 30 is arranged on the lower surface 10B of each lead 10 by means of the adhesive layer 31. When, for example, one or more semiconductor elements are mounted on each unit lead frame 4A of the lead frame 1A, the heat radiating plate 30 efficiently radiates heat generated during operation of the semiconductor elements.

Modification of Second Embodiment

The second embodiment may be modified in the following forms.

In the second embodiment, each individual unit lead frame 4A includes a single heat radiating plate 30. However, there is no limitation to such a structure. For example, a single heat radiating plate may be commonly shared by a plurality of unit lead frames 4A. One example of a method for manufacturing a lead frame of this modification will now be described with reference to FIGS. 6A to 6D.

Figure 6A:
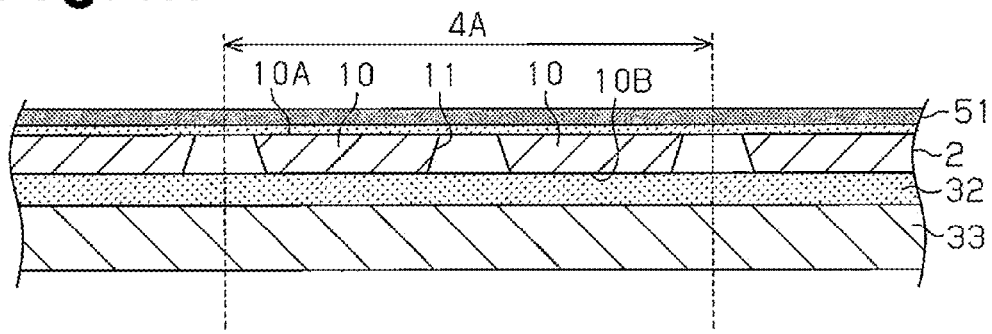
FIGS. 6A to 6D are schematic cross-sectional views illustrating a modification of the method for manufacturing a lead frame.

In the process illustrated in FIG. 6A, an adhesive layer 32 and a heat radiating plate 33 are arranged on the lower surface of the structure illustrated in FIG. 3A. More specifically, the structure, the adhesive layer 32, and the heat radiating plate 33 are stacked so that the adhesive layer 32 is sandwiched between a plurality of leads 10 arranged in a plurality of unit lead frames 4A and the heat radiating plate 33. The adhesive layer 32 and the heat radiating plate 33 may have substantially the same size and the same shape as viewed from above as the resin encapsulating area 3 (refer to FIG. 1A), for example. More specifically, the adhesive layer 32 and the heat radiating plate 33 are commonly shared by the plurality of unit lead frames 4A arranged in each resin encapsulating area. The adhesive layer 32 is in the B-stage (semi-cured).

The structure, the adhesive layer 32, and the heat radiating plate 33 in the above arrangement are heated and pressurized. This causes the upper surface of the adhesive layer 32 to come in contact with the lower surfaces 10B of the leads 10, and the upper surface of the heat radiating plate 33 to come in contact with the lower surface of the adhesive layer 32. The adhesive layer 32 is cured to adhere the heat radiating plate 33 to the leads 10. This forms the integrated structure illustrated in FIG. 6A.

Figure 6B:
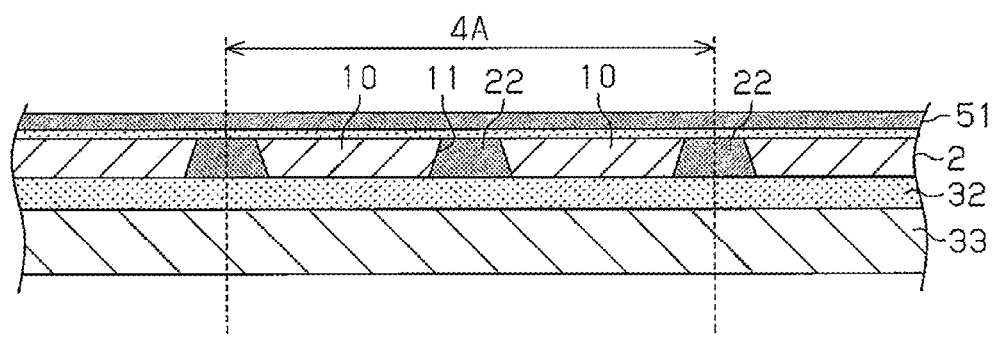
Figure 6C:
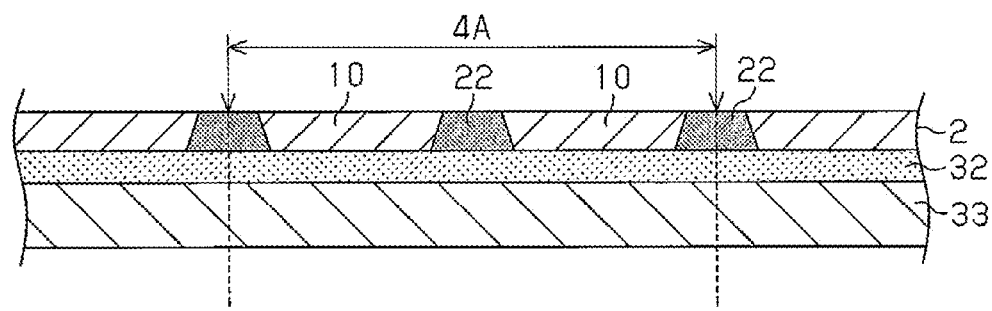

In the process illustrated in FIG. 6B, molded array packaging is performed to form a resin layer 22 in the opening 11. In the subsequent process illustrated in FIG. 6C, the tape 51 illustrated in FIG. 6B is removed. These processes yield the lead frame including the matrix of unit lead frames 4A each including the leads 10, the resin layer 22, the adhesive layer 32, and the heat radiating plate 33.

Figure 6D:
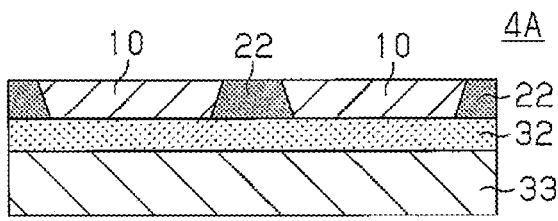

The unit lead frames 4A may be singulated by, for example, cutting the resin layer 22, the adhesive layer 32, and the heat radiating plate 33 at positions indicated by the arrows in the drawing with a dicing saw. This yields individual unit lead frames (lead frames) 4A, one of which is illustrated in FIG. 6D.

The manufacturing processes described above form the single adhesive layer 32 and the single heat radiating plate 33 for the plurality of unit lead frames 4A. This enables easy positioning of the adhesive layer 32 and the heat radiating plate 33 with the leads 10.

In this modification, the adhesive layer 32 may be formed from a thick material so that the adhesive layer 32 can be filled into the opening 11 in the process illustrated in FIG. 6A. This method eliminates the process for forming the resin layer 22.

Alternatively, a lead frame including a single heat radiating plate for a plurality of unit lead frames 4A may be formed through the manufacturing processes illustrated in FIGS. 7A to 7D.

Figure 7A:
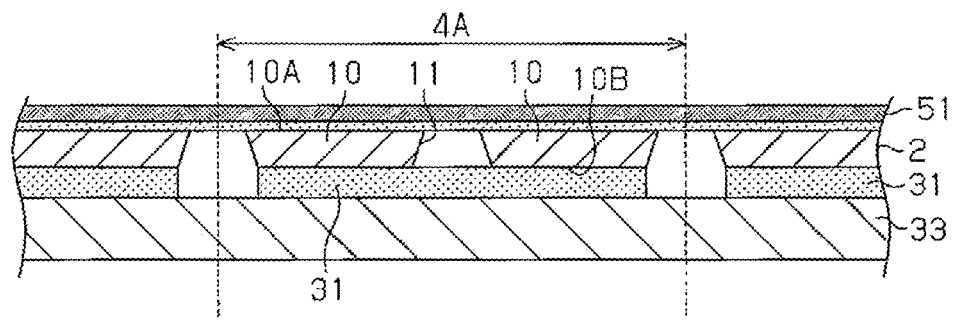
FIGS. 7A to 7D are schematic cross-sectional views illustrating a modification of the method for manufacturing a lead frame.

In detail, in the process illustrated in FIG. 7A, the adhesive layer 31 and the heat radiating plate 33 are arranged on the lower surface of the structure illustrated in FIG. 3A. More specifically, the structure, the adhesive layer 31, and the heat radiating plate 33 are stacked so that the adhesive layer 31 is sandwiched between a plurality of leads 10 arranged in a plurality of unit lead frames 4A and the heat radiating plate 33. The adhesive layer 31 bridges the lower surfaces 10B of facing leads 10 arranged in each unit lead frame 4A. In other words, the adhesive layer 31 is arranged for each unit lead frame 4A. The heat radiating plate 33 is commonly shared by a plurality of unit lead frames 4A arranged in one resin encapsulating area 3 (refer to FIG. 1A). The adhesive layer 31 is in the B-stage (semi-cured).

The structure, the adhesive layer 31, and the heat radiating plate 33 in the above arrangement are heated and pressurized. As illustrated in FIG. 7A, this causes the upper surface of the adhesive layer 31 to come in contact with the lower surfaces 10B of the leads 10 and the upper surface of the heat radiating plate 33 to come in contact with the lower surface of the adhesive layer 31. The adhesive layer 31 is cured to adhere the heat radiating plate 33 to the leads 10. This forms the integrated structure illustrated in FIG. 7A.

Figure 7B:
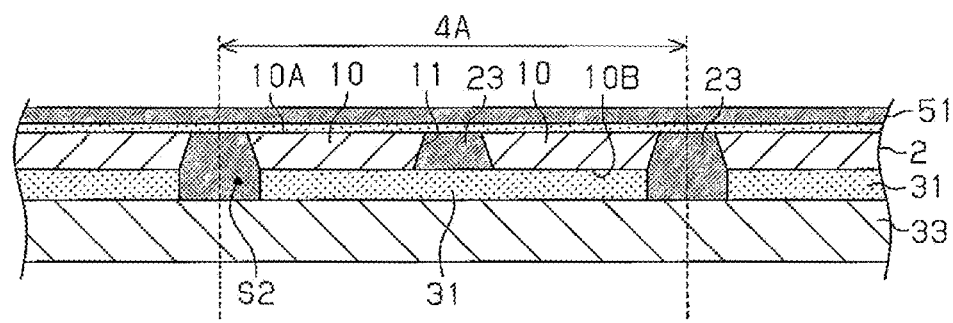
Figure 7C:
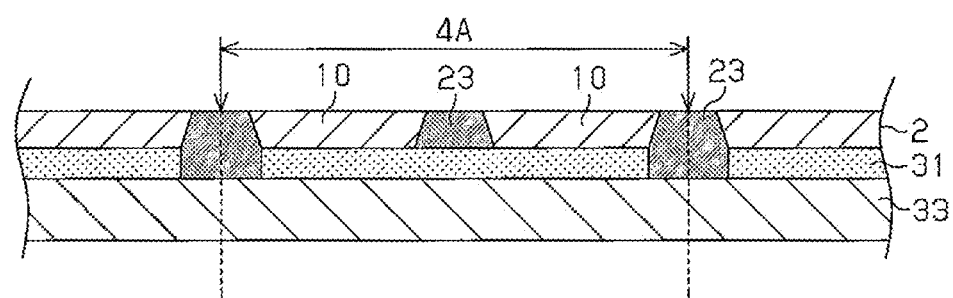

In the process illustrated in FIG. 7B, molded array packaging is performed to form a resin layer 23, which fills the opening 11 and a space S2 between adhesive layers 31 of adjacent unit lead frames 4A. In the subsequent process illustrated in FIG. 7C, the tape 51 illustrated in FIG. 7B is removed. These processes yield the lead frame including the matrix of unit lead frames 4A each including the leads 10, the resin layer 22, the adhesive layer 31, and the heat radiating plate 33.

Figure 7D:
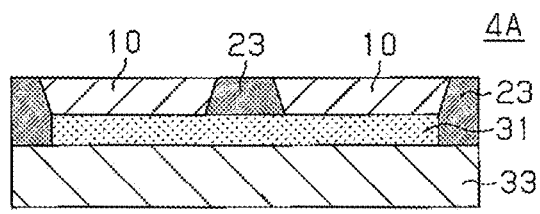

The unit lead frames 4A may be singulated by, for example, cutting the resin layer 23 and the heat radiating plate 33 at positions indicated by the arrows in the figure with a dicing saw. This yields individual unit lead frames (lead frames) 4A, one of which is illustrated in FIG. 7D.

The manufacturing processes described above form the single heat radiating plate 33 for the plurality of unit lead frames 4A. This enables easy positioning of the heat radiating plate 33 with the leads 10.

Third Embodiment

A third embodiment will now be described with reference to FIGS. 8A to 10D. A lead frame 1B of the present embodiment differs from the lead frame of the second embodiment in that each unit lead frame 4B includes plating layers 40 formed on the leads 10. The third embodiment will now be described focusing on differences from the second embodiment.

Structure of Lead Frame of Third Embodiment

Figure 8A:
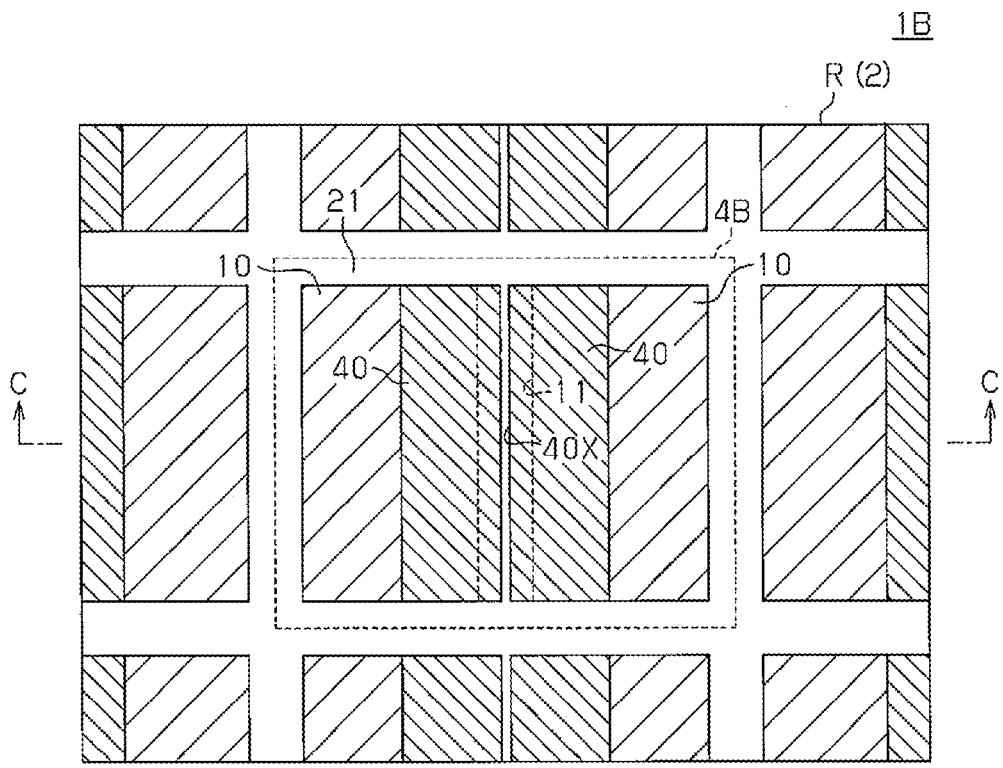
FIG. 8A is an enlarged plan view of a lead frame according to a third embodiment.
Figure 8B:
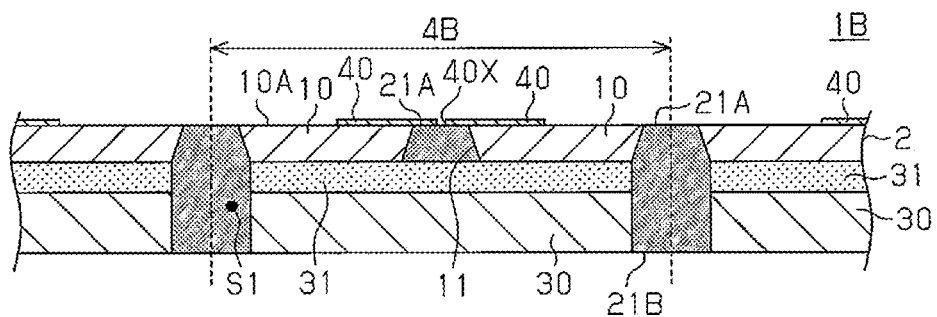
FIG. 8B is a schematic cross-sectional view taken along line C-C in FIG. 8A.

As illustrated in FIG. 8B, each unit lead frame 4B includes leads 10, a resin layer 21, an adhesive layer 31, a heat radiating plate 30, and plating layers 40 (first plating layers).

Each plating layer 40 is formed to cover a portion of the upper surface 10A of the lead 10. The plating layer 40 also covers part of the upper surface 21A of the resin layer 21 formed between the facing leads 10 arranged in each unit lead frame 4B. An opening 40X, which has a narrower opening width than the opening 11, is formed between the facing plating layers 40 arranged in each unit lead frame 4A. As illustrated in FIG. 8A, each plating layer 40 is substantially tetragonal as viewed from above. The plating layer 40 may be a metal layer including a laminate of a Ni layer and an Au layer formed on the upper surface 10A of the corresponding lead 10 in the stated order. The plating layer 40 may alternatively be a laminate of Ni, Pd, and Au layers arranged in the stated order, a laminate of Ni, Pd, and Ag layers arranged in the stated order, or a laminate of Ni, Pd, Ag, and Au layers arranged in the stated order. The Ni layer is a metal layer formed from Ni or a Ni alloy. The Au layer is a metal layer formed from Au or an Au alloy. The Pd layer is a metal layer formed from Pd or a Pd alloy. The Ag layer is a metal layer formed from Ag or an Ag alloy. It is preferable that the lowest metal layer contained in the plating layer 40 is formed from a metal having high hardness, such as Ni. When, for example, the plating layer 40 is a Ni—Au laminate layer, the Ni layer may have a thickness of about 1 to 10 µm, and the Au layer may have a thickness of about 0.1 to 1 µm. The opening 40X may have a width of, for example, about 20 to 100 µm.

Method for Manufacturing Lead Frame of Third Embodiment

Figure 9A:
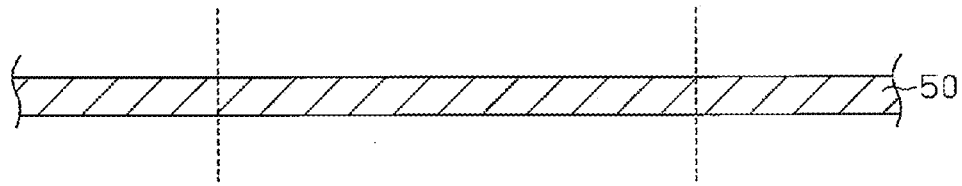
FIGS. 9A to 9E are schematic cross-sectional views illustrating a method for manufacturing the lead frame of the third embodiment, each illustrating a cross-section taken along line C-C in FIG. 8A.

A conductive substrate 50, which is a base material for the substrate frame 2, is prepared as illustrated in FIG. 9A.

Figure 9B:
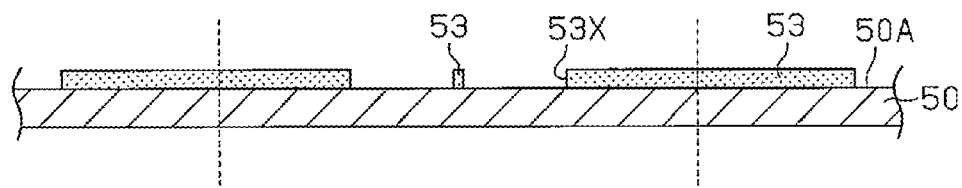

In the subsequent process (fifth process) illustrated in FIG. 9B, a resist layer 53 (first resist layer) having an opening pattern 53X (first opening pattern) is formed at a predetermined position on the upper surface 50A of the conductive substrate 50. The opening pattern 53X is formed to expose part of the conductive substrate 50 corresponding to where the plating layers 40 are to be formed. The resist layer 53 may be formed from a material resistant to plating. More specifically, the resist layer 53 may be formed from a photosensitive dry film or a liquid photoresist (dry film resist or liquid resist such as novolac resin or acrylic resin). When a photosensitive dry film resist is used, a dry film of the resist is laminated on the upper surface 50A of the conductive substrate 50 through thermocompression. The dry film is then patterned by photolithography to form the resist layer 53. The resist layer 53 can also be formed from a liquid photoresist through the same process as described for the dry film resist.

Figure 9C:
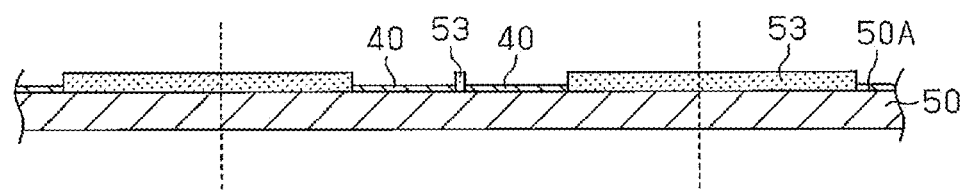

In the subsequent process (sixth process) illustrated in FIG. 9C, the upper surface 50A of the conductive substrate 50 is electrolytically plated by using the resist layer 53 as a plating mask. More specifically, parts of the upper surface 50A of the conductive substrate 50 exposed through the opening pattern 53X of the resist layer 53 are electrolytically plated to form the plating layers 40 on the conductive substrate 50. When, for example, the plating layer 40 is a Ni—Au layer, a Ni layer and an Au layer are formed in the stated order by electrolytic plating on the parts of the upper surface 50A of the conductive substrate 50 exposed through the opening pattern 53X of the resist layer 53. The resist layer 53 is removed by using, for example, an alkaline delamination solution.

Figure 9D:
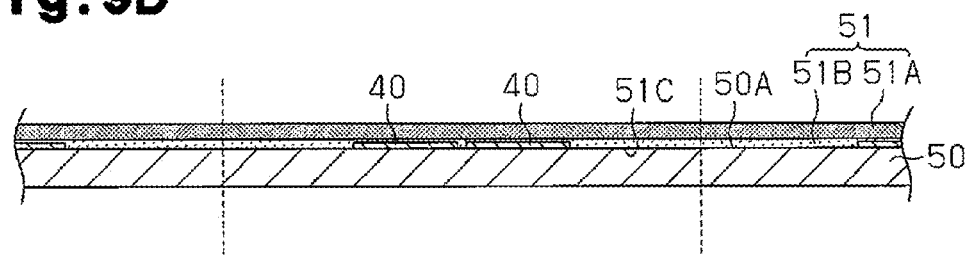

In the subsequent process (first process) illustrated in FIG. 9D, the tape 51 is adhered to the upper surface 50A of the conductive substrate 50. In detail, the tape 51, which is formed by a sheet of a tape base 51A having an adhesive 51B applied to one side, is adhered to the conductive substrate 50. The surface 51C of the adhesive 51B is adhered to the upper surface 50A. It is preferable that the adhesive 51B is thicker than the plating layer 40. More specifically, the plating layer 40 has a thickness of, for example, about 1 to 11 µm. The adhesive 51B has a thickness of, for example, about 20 to 30 µm. By setting the thickness in such a manner, the plating layers 40 are pressed into the adhesive 51B when, for example, the sheet of tape 51 is laminated onto the upper surface 50A of the conductive substrate 50 through thermocompression. The adhesive 51B covers the entire side surfaces and the entire upper surfaces of the plating layers 40. With the plating layers 40 being pressed in the adhesive 51B, the adhesive 51B covers irregularities on the upper surface 50A of the conductive substrate 50, which occur due to the formation of the plating layers 40. This structure prevents the adhesiveness and the contact between the tape 51 and the conductive substrate 50 from decreasing due to such irregularities.

Figure 9E:
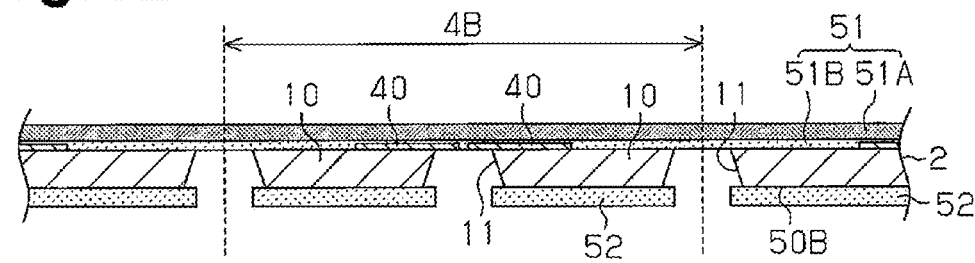

In the subsequent process (second process) illustrated in FIG. 9E, the resist layer 52 is formed on the lower surface 50B of the conductive substrate 50 by the same processes as illustrated in FIGS. 2C and 2D. The conductive substrate 50 undergoes etching performed on its lower surface 50B using the resist layer 52 as an etching mask to form the opening 11. The opening 11 defines a plurality of leads 10 in each unit lead frame 4B, and exposes a portion of the lower surface of each plating layer 40. The lowest layer included in the plating layer 40 is formed from a metal having a high hardness, and is supported by the adhesive 51B of the tape 51. This structure prevents the plating layers 40 from deforming (e.g., sagging) when the plating layers 40 exposed through the opening 11 become separated from the leads 10. An etchant used in this process should be selected in accordance with the material of the conductive substrate 50. For example, when the conductive substrate 50 is formed from copper, a ferric chloride solution may be used as the etchant. This allows for spray etching, or spraying the etchant onto the lower surface 50B of the conductive substrate 50 to achieve the above patterning. In this etching process, the tape 51 and the plating layers 40 function as etching stopper layers.

Figure 10A:
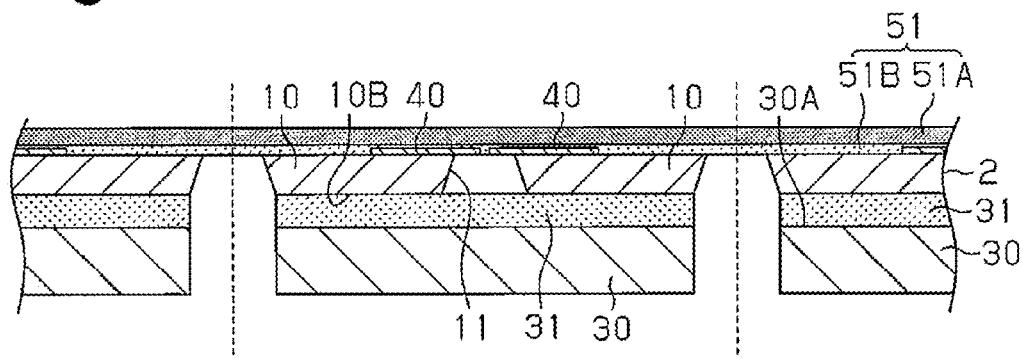
FIGS. 10A to 10D are schematic cross-sectional views illustrating a method for manufacturing the lead frame of the third embodiment, among which FIGS. 10A to 10C each illustrate a cross-section taken along line C-C in FIG. 8A.

In the subsequent process illustrated in FIG. 10A, the adhesive layer 31 and the heat radiating plate 30 are arranged on the lower surface of the structure illustrated in FIG. 9E. More specifically, the adhesive layer 31 and the heat radiating plate 30 are stacked on the lower surface of the structure so that the upper surface of the adhesive layer 31 faces the lower surfaces 10B of the leads 10 and the lower surface of the adhesive layer 31 faces the upper surface of the heat radiating plate 30. In other words, the structure, the adhesive layer 31, and the heat radiating plate 30 are stacked so that the adhesive layer 31 is sandwiched between the leads 10 and the heat radiating plate 30. The adhesive layer 31 is in the B-stage (semi-cured).

The structure, the adhesive layer 31, and the heat radiating plate 30 in the above arrangement are heated and pressurized. As illustrated in FIG. 10A, this causes the upper surface of the adhesive layer 31 to come in contact with the lower surfaces 10B of the leads 10, and the upper surface of the heat radiating plate 30 to come in contact with the lower surface of the adhesive layer 31. The adhesive layer 31 is cured to adhere the heat radiating plate 30 to the leads 10. This forms the integrated structure illustrated in FIG. 10A.

Figure 10B:
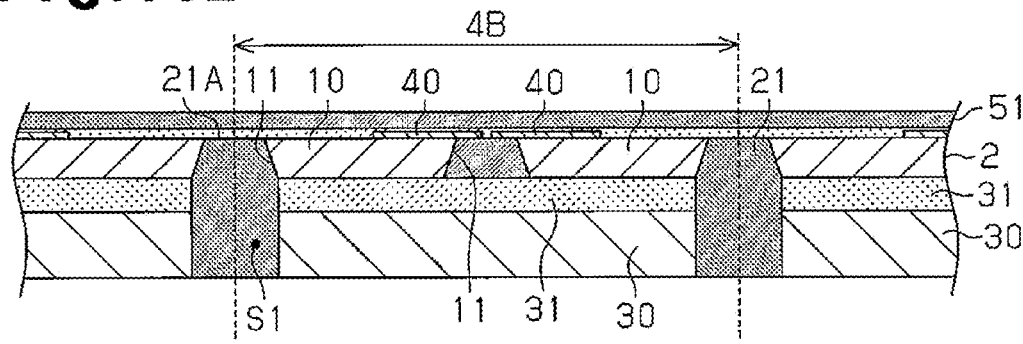
Figure 10C:
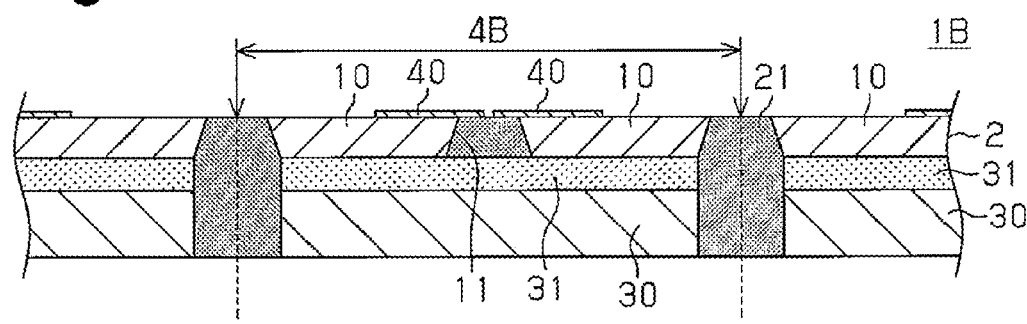

In the subsequent process (third process) illustrated in FIG. 10B, molded array packaging is performed to form the resin layer 21, which fills the opening 11 and the space S1 between adhesive layers 31 and heat radiating plates 30 of adjacent unit lead frames 4B. This causes a portion of the lower surface of each plating layer 40 exposed through the opening 11 to be covered by the resin layer 21. In the process (fourth process) illustrated in FIG. 10C, the tape 51 illustrated in FIG. 10B is removed.

Figure 10D:
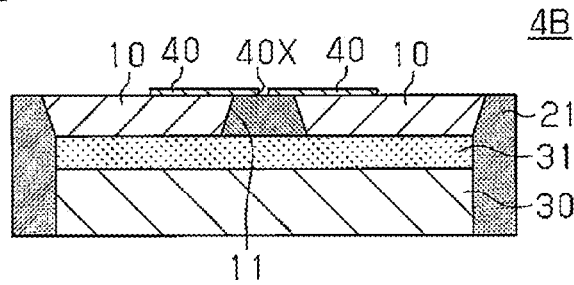

The manufacturing processes described above yield the lead frame 1B having the structure illustrated in FIGS. 8A and 8B, which includes the matrix of unit lead frames 4B each including the leads 10, the plating layers 40, the adhesive layer 31, the heat radiating plate 30, and the resin layer 21. In one example, one or more semiconductor devices are mounted on each unit lead frame 4B of the lead frame 1B. The lead frame 1B then undergoes molded array packaging, which encapsulates the semiconductor elements mounted on each unit lead frame 4B. Alternatively, the lead frame 1B may be first singulated into individual unit lead frames (lead frames) 4B as illustrated in FIG. 10D by cutting the resin layer 21 at positions indicated by the arrows with a dicing saw. One or more semiconductor elements may then be mounted on each individual unit lead frame 4B.

Advantages

The above embodiment has the advantage described below in addition to advantages (1) to (3) of the first embodiment and advantage (4) of the second embodiment.

The plating layers 40 are arranged on the upper surfaces 10A of the leads 10. This improves the contact between the unit lead frame 4B of the lead frame 1B and the semiconductor elements mounted on the unit lead frame 4B (reliability of wire bonding or solder joints).

(6) The resist layer 53 having the opening pattern 53X, which is formed by photolithography, is formed on the lower surface 50B of the conductive substrate 50, and the plating layers 40 are formed on parts of the conductive substrate 50 exposed through the opening pattern 53X by electrolytic plating performed using the conductive substrate 50 as a power supply layer. The opening pattern 53X, which determines the shape of the plating layers 40, is formed in the resist layer 53 by photolithography. This enables the opening pattern 53X and the plating layer 40 to be accurately shaped with the desired shape (designed shape) as viewed from above. Even when the designed pitch of the plating layers 40 is so narrow that the plating layers 40 cannot be formed by etching, the plating layers 40 allowing for such narrower pitches can be formed with high accuracy through photolithography and patterning.

(7) The adhesive 51B of the tape 51 is thicker than the plating layer 40. This causes the plating layers 40 to be pressed into the adhesive 51B when the sheet of tape 51 is laminated onto the upper surface 50A of the conductive substrate 50 through thermocompression. With the plating layers 40 being pressed into the adhesive 51B, the adhesive 51B covers irregularities on the upper surface 50A of the conductive substrate 50, which occur due to the formation of the plating layers 40. This structure prevents the adhesiveness and the contact between the tape 51 and the conductive substrate 50 from decreasing due to such irregularities.

Modification of Third Embodiment

The third embodiment may be modified in the following forms.

In the third embodiment, the heat radiating plate 30 and the adhesive layer 31 may be omitted. An example of a method for manufacturing a lead frame of this modification will now be described with reference to FIGS. 11A to 11D.

Figure 11A:
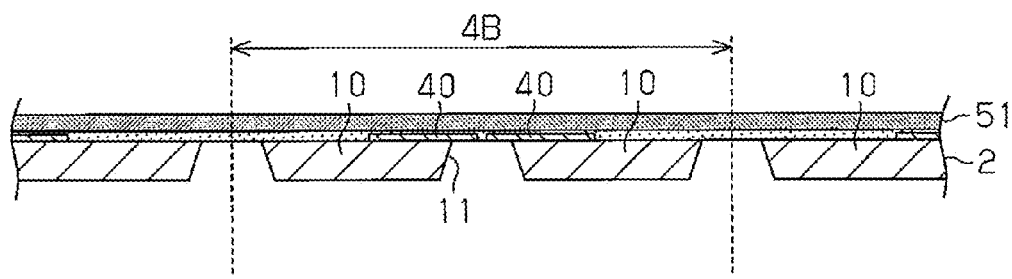
FIGS. 11A to 11D are schematic cross-sectional views illustrating a modification of the method for manufacturing a lead frame.
Figure 11B:
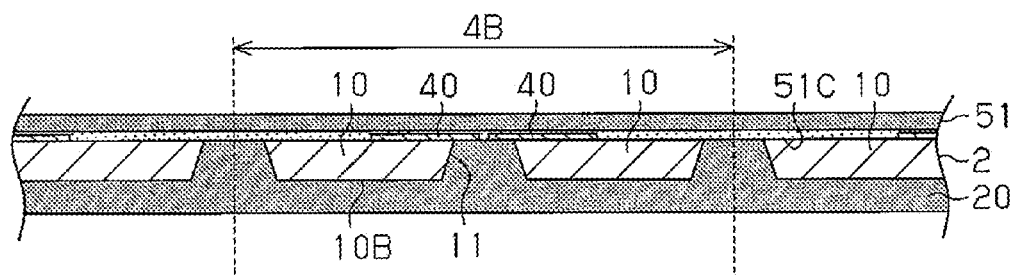

In the process illustrated in FIG. 11A, the resist layer 52 of the structure illustrated in FIG. 9E is removed by using an alkaline delamination solution. In the subsequent process illustrated in FIG. 11B, the resin layer 20 is formed on the surface 51C of the tape 51 to encapsulate the substrate frame 2 (more specifically, leads 10). Molded array packaging is performed for each resin encapsulating area 3 (refer to FIG. 1A) to form the resin layer 20 embedding the leads 10 on the tape 51. This forms the resin layer 20, which fills the opening 11 and covers the lower surfaces 10B of the leads 10 as illustrated in FIG. 11B. The resin layer 20 covers parts of the lower surfaces of the plating layers 40 exposed through the opening 11.

Figure 11C:
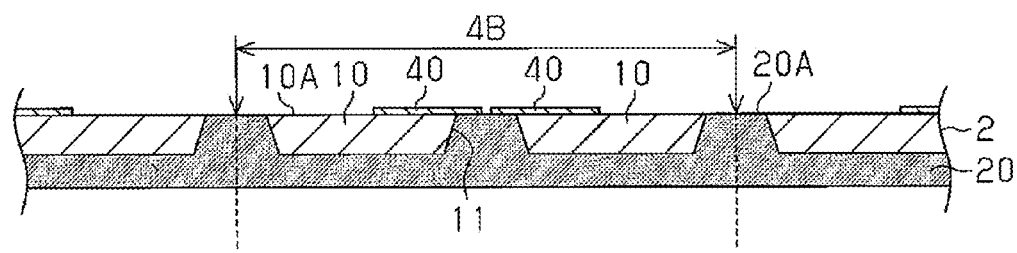

In the subsequent process illustrated in FIG. 11C, the tape 51 illustrated in FIG. 11B is removed. These processes yield the lead frame including the matrix of unit lead frames 4B each including the leads 10, the plating layers 40, and the resin layer 22.

Figure 11D:
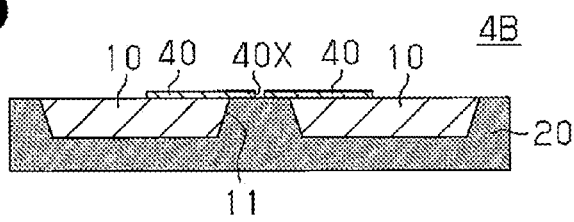

The unit lead frames 4B may be singulated by, for example, cutting the resin layer 20 at positions indicated by the arrows with a dicing saw. This yields individual unit lead frames (lead frames) 4B, one of which is illustrated in FIG. 11D.

In the modification illustrated in FIGS. 11A to 11D, the resin layer 20 may be formed to expose the lower surfaces 10B of the leads 10. For example, the resin layer 20 may be thinned until the lower surfaces 10B of the leads 10 are exposed after the structure illustrated in FIG. 11B is formed.

Fourth Embodiment

A fourth embodiment will now be described with reference to FIGS. 12A to 14D. A lead frame 1C of the present embodiment differs from the lead frame of the third embodiment in that each unit lead frame 4C includes plating layers 41 formed on the lower surfaces 10B of the leads 10. The fourth embodiment will be described focusing on differences from the third embodiment.

Structure of Lead Frame of Fourth Embodiment

Figure 12A:
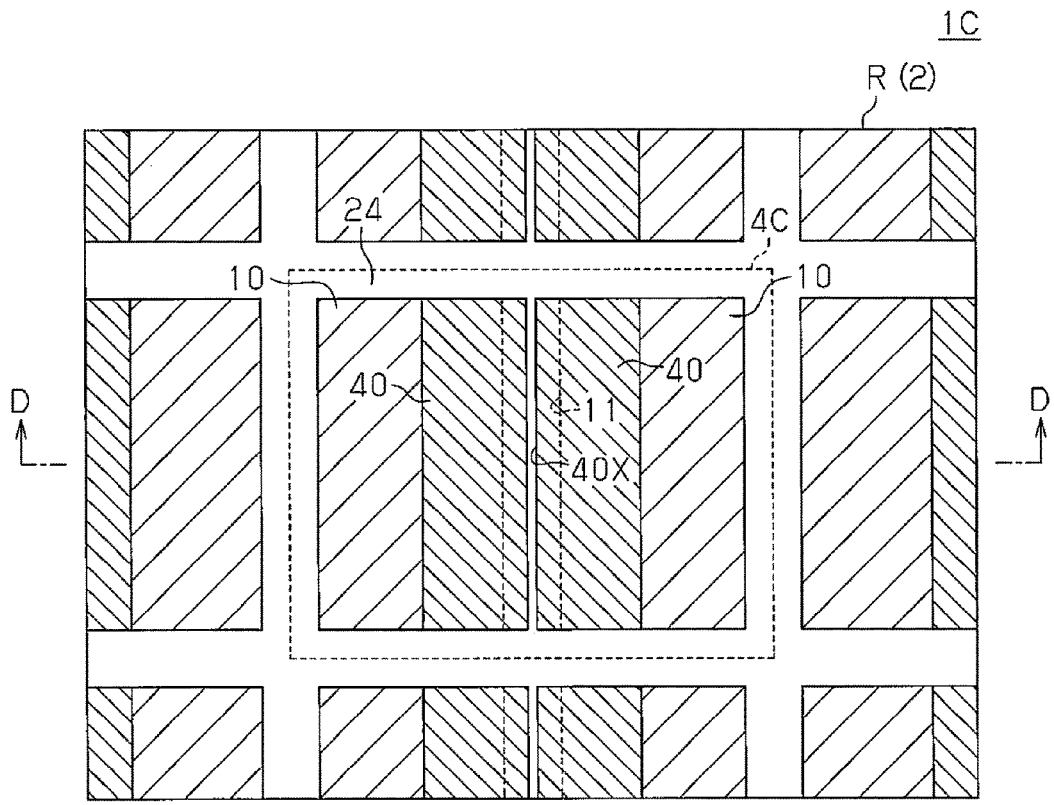
FIG. 12A is an enlarged plan view of a lead frame according to a fourth embodiment.
Figure 12B:
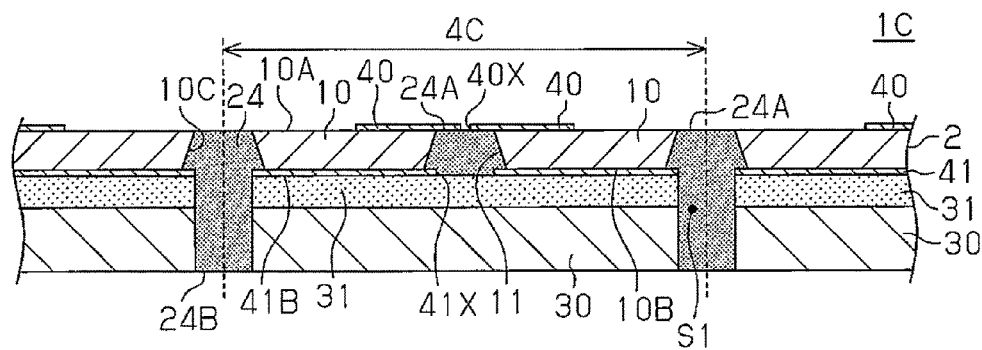
FIG. 12B is a schematic cross-sectional view taken along line D-D in FIG. 12A.

As illustrated in FIG. 12B, each unit lead frame 4C includes leads 10, plating layers 40, plating layers 41 (second plating layers), a resin layer 24, an adhesive layer 31, and a heat radiating plate 30.

The plating layers 41 cover the lower surfaces 10B of the leads 10. Although not illustrated in the drawings, the plating layers 41 are substantially tetragonal as viewed from above in the same manner as the leads 10. The plating layer 41 is slightly larger than the lower surface 10B of the lead 10 as viewed from above. Thus, as illustrated in FIG. 12B, the plating layer 41 has a peripheral portion projecting from the periphery of the lower surface 10B of the corresponding lead 10. The peripheral portion of the plating layer 41 protrudes like a flange from the lower surface 10B of the lead 10. An opening 41X is formed between the opposing facing plating layers 41 in each unit lead frame 4C. The opening 41X has a smaller width than an end portion of the opening 11 opposed to the plating layers 41.

The plating layer 41 may be a metal layer including a laminate of a Ni layer and an Au layer formed on the lower surface 10B of the corresponding lead 10 in the stated order. The plating layer 41 may alternatively be a laminate of Ni, Pd, and Au layers arranged in the stated order, a laminate of Ni, Pd, and Ag layers arranged in the stated order, or a laminate of Ni, Pd, Ag, and Au layers arranged in the stated order. When, for example, the plating layer 41 is a Ni—Au laminate layer, the Ni layer may have a thickness of about 1 to 10 μm, and the Au layer may have a thickness of about 0.1 to 1 μm. The opening 41X may have a width of, for example, about 20 to 100 μm.

The adhesive layer 31 is formed on the lower surfaces 41B of the plating layers 41 arranged in the unit lead frame 4C. More specifically, the adhesive layer 31 bridges the lower surfaces 41B of the facing plating layers 41 arranged in the unit lead frame 4C. The adhesive layer 31 is used to adhere the plating layers 41 to the heat radiating plate 30 and also to insulate the plating layers 41 from the heat radiating plate 30.

The resin layer 24 fills the opening 11 to cover the entire side surfaces 10C of the leads 10. Also, the resin layer 24 covers the entire side surfaces of the plating layers 41. More specifically, the resin layer 24 fills the opening 41X. Thus, the resin layer 24 is engaged with the peripheral edge of each plating layer 41. In detail, the space including the opening 11 and the opening 41X, which are filled with the resin layer 24, is defined by steps each formed by the periphery of the plating layer 41 and by the side surfaces 10C of the lead 10. When the resin layer 24 fills the space defined by the steps, the resin layer 24 is engaged with the upper surface of the peripheral edge of each plating layer 41. This increases the contact between the resin layer 24 and the substrate frame 2, and prevents the resin layer 24 from being separated from the opening 11.

The resin layer 24 further covers the side surfaces of the adhesive layer 31 and the side surfaces of the heat radiating plate 30. More specifically, the resin layer 24 fills a space S1 formed between adhesive layers 31 and heat radiating plates 30 of adjacent unit lead frames 4C. The resin layer 24 has an upper surface 24A substantially flush with the upper surfaces 10A of the leads 10. The resin layer 24 has a lower surface 24B substantially flush with the lower surface of the heat radiating plate 30. The resin layer 24 supports the plurality of leads 10 arranged in each unit lead frame 4C on the rails 5 and 6 (refer to FIG. 1A).

Method for Manufacturing Lead Frame of Fourth Embodiment

Figure 13A:
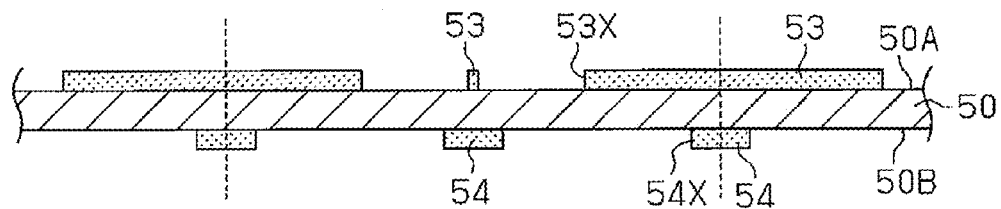
FIGS. 13A to 13D are schematic cross-sectional views illustrating a method for manufacturing the lead frame of the fourth embodiment, each illustrating a cross-section taken along line D-D in FIG. 12A.

In the process (fifth process) illustrated in FIG. 13A, a resist layer 53, which has an opening pattern 53X at a predetermined position, is formed on the upper surface 50A of the conductive substrate 50. A resist layer 54 (second resist layer), which has an opening pattern 54X (second opening pattern) at a predetermined position, is formed on the lower surface 50B of the conductive substrate 50. These opening patterns 53X and 54X are formed to expose parts of the conductive substrate 50 corresponding to where the plating layers 40 and 41 are to be formed. The resist layers 53 and 54 may be formed from a material resistant to plating. In detail, the resist layers 53 and 54 may be formed from a photosensitive dry film resist or a liquid photoresist (dry film resist or liquid resist such as novolac resin or acrylic resin).

Figure 13B:
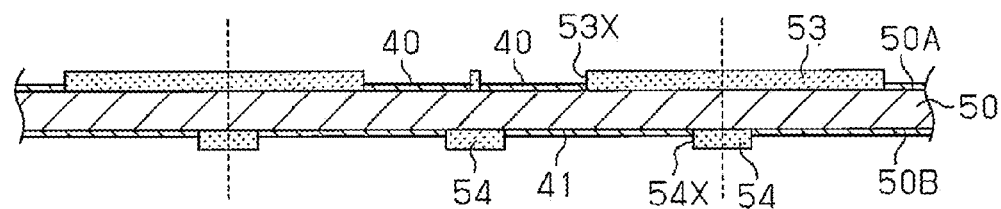

In the subsequent process (sixth process) illustrated in FIG. 13B, the upper surface 50A and the lower surface 50B of the conductive substrate 50 are electrolytically plated by using the resist layers 53 and 54 as plating masks and using the conductive substrate 50 as a plating power supply layer. More specifically, parts of the upper surface 50A of the conductive substrate 50 exposed through the opening pattern 53X of the resist layer 53 are electrolytically plated to form the plating layers 40 on the conductive substrate 50. Also, parts of the lower surface 50B of the conductive substrate 50 exposed through the opening pattern 54X of the resist layer 54 are electrolytically plated to form the plating layers 41 on the lower surface 50B of the conductive substrate 50. When, for example, the plating layers 40 and 41 are Ni—Au layers, a Ni layer and an Au layer are formed in the stated order by electrolytic plating portions of the upper surface 50A and the lower surface 50B of the conductive substrate 50 exposed through the opening patterns 53X and 54X of the resist layers 53 and 54. The resist layers 53 and 54 are removed by using, for example, an alkaline delamination solution.

Figure 13C:
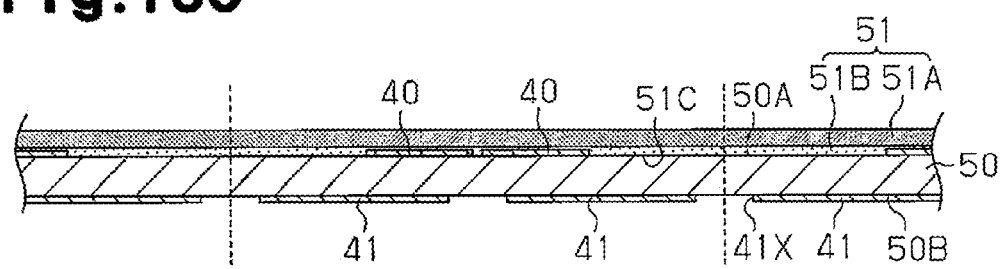

In the subsequent process (first process) illustrated in FIG. 13C, the tape 51 is adhered to the upper surface 50A of the conductive substrate 50.

Figure 13D:
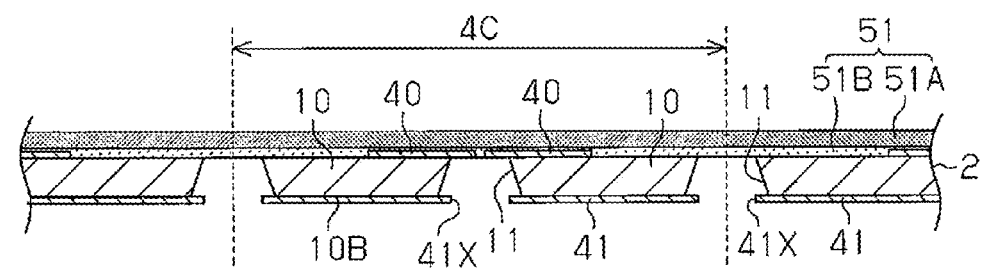

The conductive substrate 50 undergoes etching performed on its lower surface 50B using the plating layers 41 as an etching mask to form the opening 11 as illustrated in FIG. 13D (second process). The opening 11 defines a plurality of leads 10 in each unit lead frame 4C, and also exposes part of the lower surface of each plating layer 40 through the opening 11. When the conductive substrate 50 is patterned by wet etching (isotropic etching), an etchant used in the wet etching process should be selected in accordance with the material of the conductive substrate 50. For example, when the conductive substrate 50 is formed from copper, a ferric chloride solution may be used as the etchant. This allows for spray etching, or spraying the etchant onto the lower surface 50B of the conductive substrate 50 to achieve the above patterning. During such patterning performed by wet etching, side etching occurs in the conductive substrate 50, and the etching proceeds in the in-plane direction of the conductive substrate 50. This shapes the leads 10 to have trapezoidal cross-sections. More specifically, the wet etching (isotropic etching) proceeds not only in the direction perpendicular to the mask (plating layers 41) but also in the direction parallel to the mask. The part of the lead 10 immediately above the peripheral portion of each plating layer 41 is also etched as illustrated in FIG. 13D. This partially removes the side surfaces of the leads 10 so that the leads 10 recede from the ends of the plating layers 41. In other words, this forms an overhang structure, in which the peripheral portion of the plating layer 41 under the lead 10 protrudes from the lower surface 10B of the lead 10.

Figure 14A:
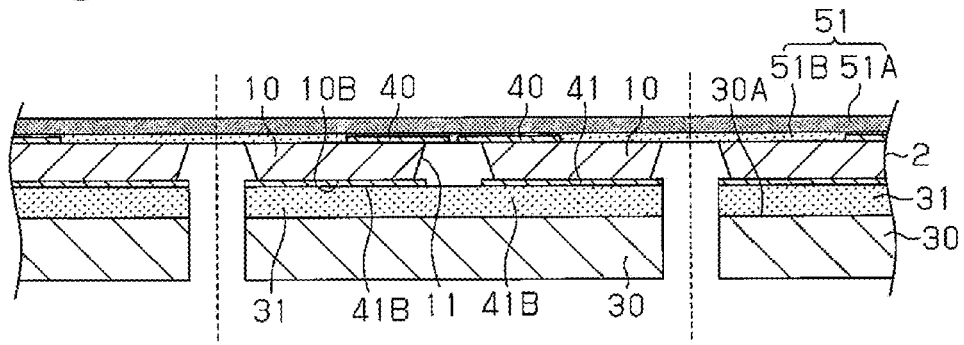
FIGS. 14A to 14D are schematic cross-sectional views illustrating a method for manufacturing the lead frame of the fourth embodiment, among which FIGS. 14A to 14C each illustrate a cross-section taken along line D-D in FIG. 12A.

In the process illustrated in FIG. 14A, an adhesive layer 31 and a heat radiating plate 30 are arranged on the lower surface of the structure illustrated in FIG. 13B. More specifically, the adhesive layer 31 and the heat radiating plate 30 are stacked on the lower surface of the structure so that the upper surface of the adhesive layer 31 faces the lower surfaces 41B of the plating layers 41, and the upper surface 30A of the heat radiating plate 30 faces the lower surface of the adhesive layer 31. In other words, the structure, the adhesive layer 31, and the heat radiating plate 30 are stacked so that the adhesive layer 31 is sandwiched between the plating layers 41 and the heat radiating plate 30. The adhesive layer 31 is in the B-stage (semi-cured).

The structure, the adhesive layer 31, and the heat radiating plate 30 in the above arrangement are heated and pressurized. This causes the upper surface of the adhesive layer 31 to come in contact with the lower surfaces 41B of the plating layers 41, and the upper surface 30A of the heat radiating plate 30 to come in contact with the lower surface of the adhesive layer 31. The adhesive layer 31 is cured to adhere the heat radiating plate 30 to the plating layers 41. This forms the integrated structure illustrated in FIG. 14A.

Figure 14B:
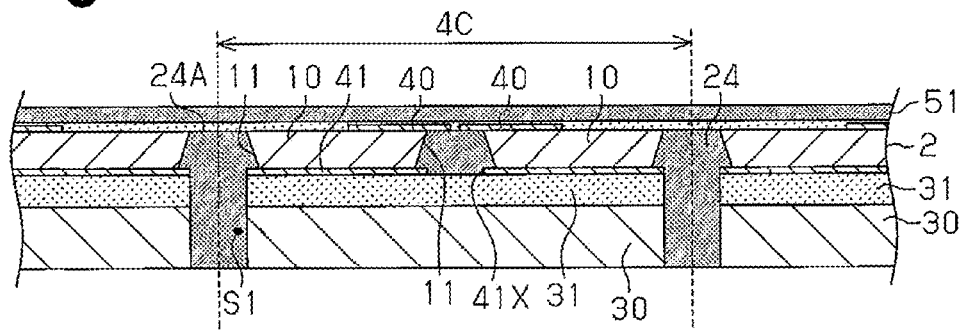
Figure 14C:
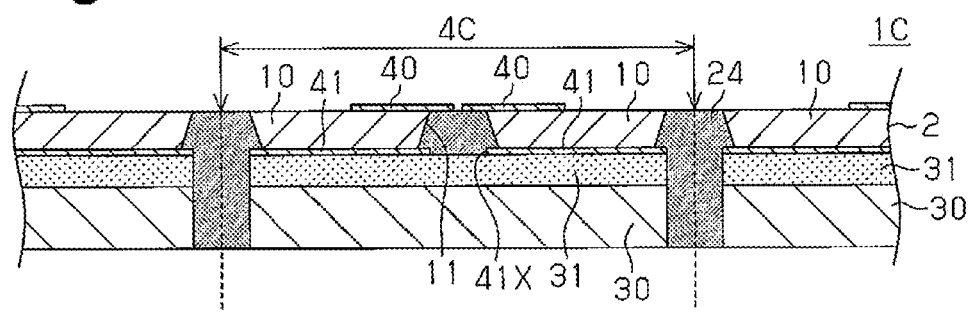

In the process (third process) illustrated in FIG. 14B, molded array packaging is performed to form the resin layer 24, which fills the space S1 between adhesive layers 31 and heat radiating plates 30 of adjacent unit lead frames 4C, the opening 11, and an opening 41X between the plating layers 41. This forms the resin layer 24 in the space including the opening 11 and the opening 41X having a smaller opening width than the opening 11, that is, the space defined by the steps each formed by the peripheral portion of the plating layer 41 and by the side surfaces of the corresponding lead 10. In the subsequent process (fourth process) illustrated in FIG. 14C, the tape 51 illustrated in FIG. 14B is removed.

Figure 14D:
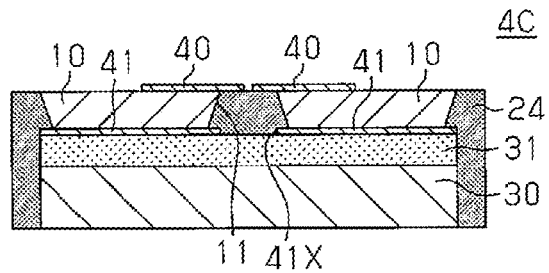

The manufacturing processes described above yield the lead frame 1C having the structure illustrated in FIGS. 12A and 12B, which includes the matrix of unit lead frames 4C each including the leads 10, the plating layers 40 and 41, the adhesive layer 31, the heat radiating plate 30, and the resin layer 24. In one example, one or more semiconductor devices are mounted on each unit lead frame 4C of the lead frame 1C. The lead frame 1C then undergoes molded array packaging, which encapsulates the semiconductor elements mounted on the unit lead frames 4C. Alternatively, the lead frame 1C may be first singulated into individual unit lead frames (lead frames) 4C by cutting the resin layer 24 at positions indicated by the arrows with a dicing saw as illustrated in FIG. 14D. One or more semiconductor elements may then be mounted on each individual unit lead frame 4C.

Advantages

The above embodiment has the advantage described below in addition to advantages (1) to (3) of the first embodiment, advantage (4) of the second embodiment, and advantages (5) to (7) of the third embodiment.

(8) The plating layer 41, which is slightly larger than the lower surface 10B of the lead 10, covers the lower surface 10B of the lead 10. The resin layer 24 is formed in the space including the opening 11 and the opening 41X having a smaller opening width than the opening 11, or in the space defined by the steps each formed by the peripheral portion of the plating layer 41 and by the side surfaces of the lead 10. When the resin layer 24 is formed in the space defined by the steps, the resin layer 24 is engaged with the upper surface of the peripheral edge of each plating layer 41. This increases the contact between the resin layer 24 and the substrate frame 2, and prevents the resin layer 24 from being separating through the opening 11.

(9) The plating layers 41 are formed on the lower surface 50B of the conductive substrate 50 before the tape 51 is adhered to the conductive substrate 50. The conductive substrate 50 undergoes etching using the plating layers 41 as an etching mask. This eliminates the need to form a resist layer by photolithography after the tape 51 is adhered to the conductive substrate 50, and thus reduces damage to the tape 51.

Modification of Fourth Embodiment

The fourth embodiment may be modified in the following forms.

In the fourth embodiment, the heat radiating plate 30 and the adhesive layer 31 may be omitted. An example of a method for manufacturing a lead frame of this modification will now be described with reference to FIGS. 15A to 15D.

Figure 15A:
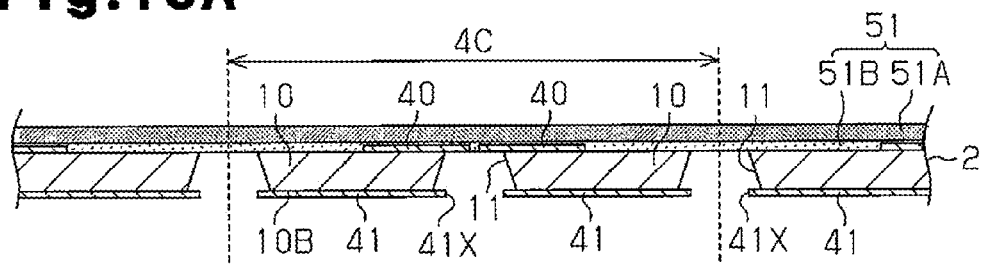
FIGS. 15A to 15D are schematic cross sectional views illustrating a modification of the method for manufacturing a lead frame.
Figure 15B:
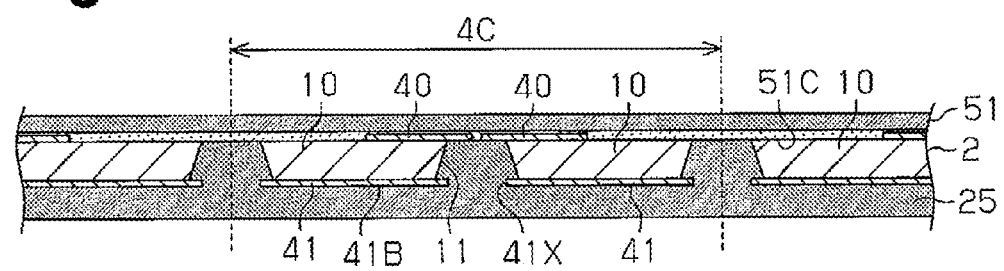

In the process illustrated in FIG. 15A, the same structure as illustrated in FIG. 13D is formed by the same processes as illustrated in FIGS. 13A to 13D. In the subsequent process illustrated in FIG. 15B, a resin layer 25 is formed on the surface 51C of the tape 51 to encapsulate the substrate frame 2 (more specifically, leads 10) and the plating layers 41. More specifically, molded array packaging is performed for each resin encapsulating area 3 (refer to FIG. 1A) to form the resin layer 25 embedding the leads 10 on the tape 51 and the plating layers 41. This forms the resin layer 25, which fills the openings 11 and 41X and covers the lower surfaces 41B of the plating layers 41 as illustrated in FIG. 15B. The resin layer 25 fills the space including the opening 11 and the opening 41X having a smaller opening width than the opening 11, or the space defined by the steps each formed by the peripheral portion of the plating layer 41 and by the side surfaces of the lead 10.

Figure 15C:
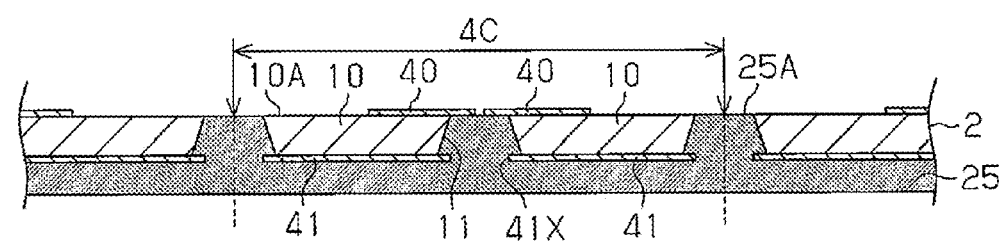

In the subsequent process illustrated in FIG. 15C, the tape 51 illustrated in FIG. 15B is removed. These processes yield the lead frame including the matrix of unit lead frames 4C each including the leads 10, the plating layers 40 and 41, and the resin layer 25.

Figure 15D:
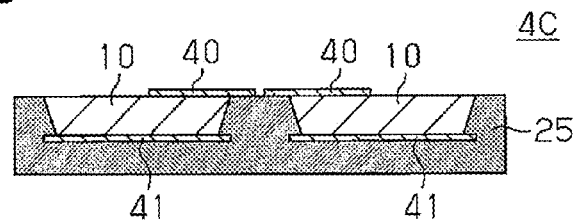

The unit lead frames 4C may be singulated by, for example, cutting the resin layer 25 at positions indicated by the arrows with a dicing saw. This yields individual unit lead frames (lead frames) 4C, one of which is illustrated in FIG. 15D.

In the modification illustrated in FIGS. 15A to 15D, the resin layer 25 may be formed to expose the lower surfaces 41B of the plating layers 41. For example, the resin layer 25 may be thinned until the lower surfaces 41B of the plating layers 41 are exposed after the structure illustrated in FIG. 15B is formed.

Fifth Embodiment

A fifth embodiment will now be described with reference to FIGS. 16A to 18D. A lead frame 1D of the present embodiment differs from the lead frame of the second embodiment in that each unit lead frame 4D includes plating layers 42 (first plating layers 42) embedded in the leads 10, and the lower surfaces 10B of the leads 10 have projections and recesses. The fifth embodiment will now be described focusing on differences from the second embodiment.

Structure of Lead Frame of Fifth Embodiment

Figure 16A:
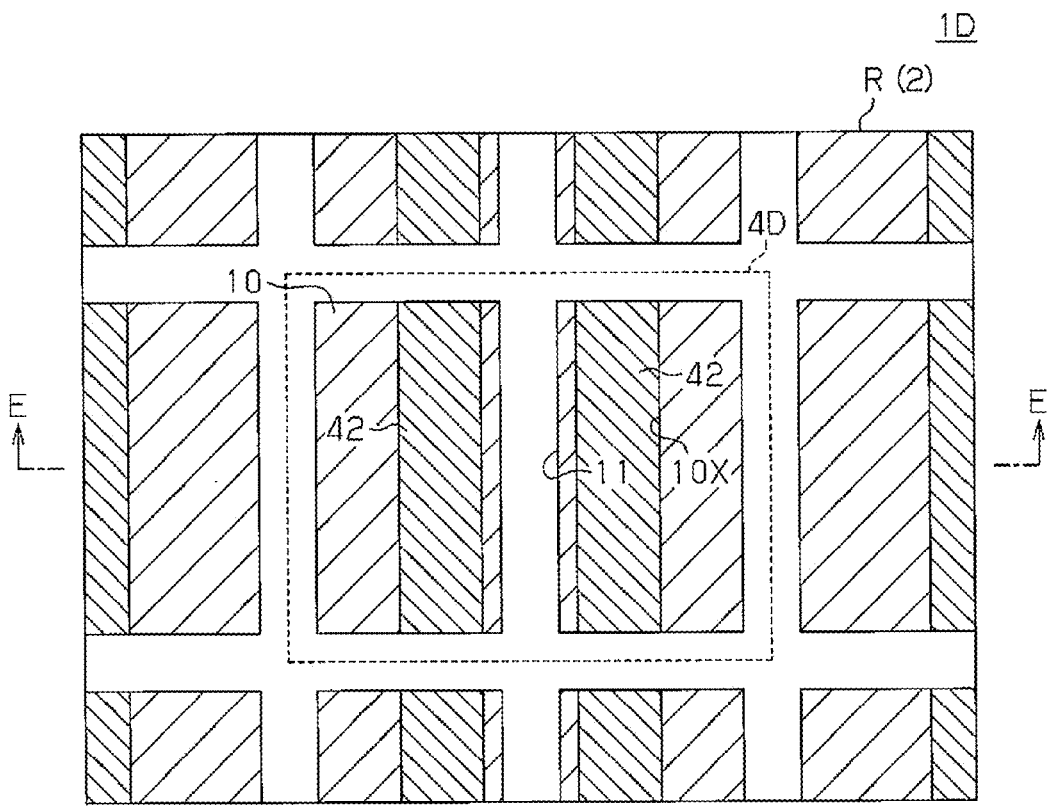
FIG. 16A is an enlarged plan view of a lead frame according to a fifth embodiment.
Figure 16B:
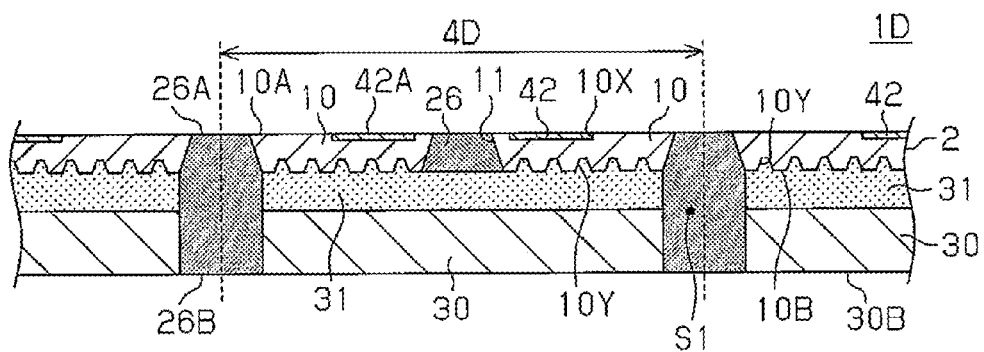
FIG. 16B is a schematic cross sectional view taken along line E-E in FIG. 16A.

As illustrated in FIG. 16B, each unit lead frame 4D includes leads 10, plating layers 42, a resin layer 26, an adhesive layer 31, and a heat radiating plate 30.

Each lead 10 includes a recess 10X formed at a predetermined position in its upper surface 10A (single recess in FIG. 16B). The recess 10X extends from the upper surface 10A to a predetermined level in the thickness direction of the lead 10. That is, the recess 10X has a bottom surface at an intermediate position in the thickness direction of the lead 10. As illustrated in FIG. 16A, the recess 10X is, for example, tetragonal as viewed from above. The recess 10X extends at a middle position in the lateral direction of the lead 10. Thus, as illustrated in FIG. 16B, the recess 10X has its side surfaces formed by the lead 10.

Each lead 10 also includes recesses 10Y having a small diameter at predetermined positions (five recesses in FIG. 16B). Each recess 10Y extends from the lower surface 10B of the lead 10 to a predetermined level in the thickness direction of the lead 10. The recess 10Y has a bottom surface at an intermediate position in the thickness direction of the lead 10. The recess 10Y has, for example, a substantially trapezoidal cross-section. In this manner, multiple recesses 10Y, each having a small diameter, are formed in the lower surface 10B of the lead 10 to form ridges and valleys in the lower surface 10B of the lead 10. The bumpy surface having ridges and valleys differs from a roughened surface, which can be formed by roughening the lower surface 10B of the lead 10. Although not illustrated, the recess 10Y may be, for example, circular as viewed from above. The recess 10Y may have, at its opening, a diameter of, for example, about 10 μm. The recesses 10Y may be in a zigzag or matrix arrangement as viewed from above.

The plating layer 42 is formed in each recess 10X of the lead 10. The plating layer 42 has an upper surface 42A substantially flush with the upper surface 10A of the lead 10. The side surfaces of the plating layer 42 are covered by the lead 10 forming the side walls of the recess 10X. In this manner, the plating layer 42 is embedded in the lead 10. As illustrated in FIG. 16A, the plating layer 41 is substantially tetragonal as viewed from above in the same manner as the lead 10.

The plating layer 42 may be a metal layer including a laminate of a Ni layer and an Au layer formed on the bottom surface of the recess 10X in the stated order. The plating layer 42 may alternatively be a laminate of Ni, Pd, and Au layers arranged in the stated order, a laminate of Ni, Pd, and Ag layers arranged in the stated order, or a laminate of Ni, Pd, Ag, and Au layers arranged in the stated order. When, for example, the plating layer 42 is a Ni—Au laminate layer, the Ni layer may have a thickness of about 1 to 10 μm, and the Au layer may have a thickness of about 0.1 to 1 μm.

The adhesive layer 31 is formed on the lower surfaces 10B of the leads 10 arranged in the unit lead frame 4D. More specifically, the adhesive layer 31 bridges the lower surfaces 10B of the opposed leads 10 arranged in the unit lead frame 4D. The adhesive layer 31 fills the recesses 10Y, which are formed in the lower surface of the lead 10. The adhesive layer 31 is mechanically engaged with each lead 10. This increases the contact between the adhesive layer 31 and the lead 10, and prevents the adhesive layer 31 and the heat radiating plate 30 from separating off the lead 10.

Method for Manufacturing Lead Frame of Fifth Embodiment

Figure 17A:
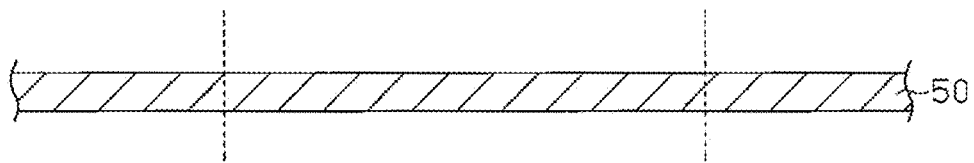
FIGS. 17A to 17E are schematic cross-sectional views illustrating a method for manufacturing the lead frame of a fifth embodiment, each illustrating a cross-section taken along line E-E in FIG. 16A.

As illustrated in FIG. 17A, a conductive substrate 50, which serves as a base material for the substrate frame 2, is prepared.

Figure 17B:
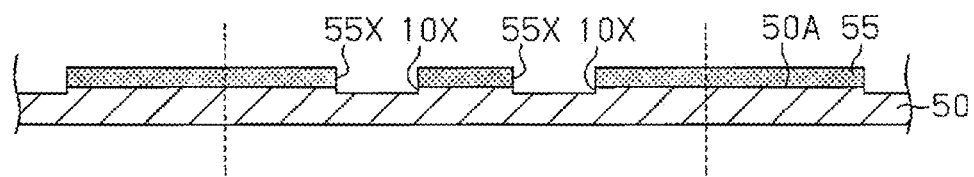

In the process illustrated in FIG. 17B, a resist layer 55, which has an opening pattern 55X at a predetermined position, is formed on the upper surface 50A of the conductive substrate 50. The opening pattern 55X is formed to expose parts of the conductive substrate 50 corresponding to where the recesses 10X are to be formed. The resist layer 55 may be formed from a material resistant to etching and plating. The resist layer 55 may be formed from a photosensitive dry film resist or a liquid photoresist (dry film resist or liquid resist such as novolac resin or acrylic resin). When a photosensitive dry film resist is used, a dry film of the resist is laminated on the upper surface 50A of the conductive substrate 50 through thermocompression. The dry film is then patterned by photolithography to form the resist layer 55. The resist layer 55 can also be formed from a liquid photoresist by the same process as described for the dry film resist.

Subsequently, the conductive substrate 50 undergoes half etching using the resist layer 52 as an etching mask, in which parts of the conductive substrate 50 exposed through the opening pattern 55X are etched. This removes portions to a predetermined depth from the conductive substrate 50, and forms portions of the conductive substrate 50 exposed through the opening pattern 55X in the recesses 10X. An etchant used in this process should be selected in accordance with the material of the conductive substrate 50. In one example, when the conductive substrate 50 is formed from copper and the recess 10X has a depth of less than 5 μm, persulfate may be preferably used as the etchant. In another example, when the conductive substrate 50 is formed from copper and the recess 10X has a depth of 5 μm or greater, a ferric chloride solution or a copper chloride solution may be preferably used as the etchant. The recesses 10X may be formed by methods other than etching (half etching). For example, the recesses 10X may be formed through pressing.

Figure 17C:
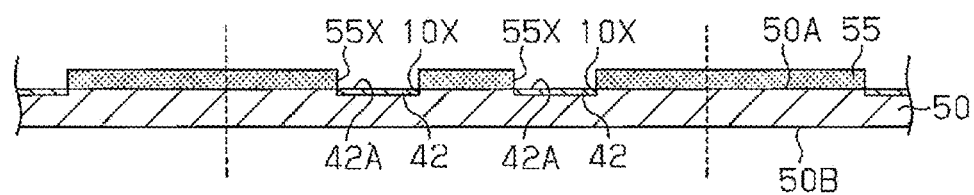

In the subsequent process illustrated in FIG. 17C, the upper surface 50A of the conductive substrate 50 is electrolytically plated by using the resist layer 55 as a plating mask. More specifically, parts of the conductive substrate 50 exposed through the opening pattern 55X of the resist layer 55, or the recesses 10X, are electrolytically plated to form the plating layers 42 in the recesses 10X. When, for example, the plating layer 42 is a Ni—Au layer, a Ni layer and an Au layer are formed in the stated order by electrolytic plating the bottom surfaces of the recesses 10X exposed through the opening pattern 55X of the resist layer 55. In the present example, the plating layer 42 is formed to have the highest layer (e.g., Au layer) substantially flush with the upper surface 50A of the conductive substrate 50. The plating layer 42 formed in the recess 10X may have its upper surface 42A lower than, or recessed from, the upper surface 50A of the conductive substrate 50. Alternatively, the plating layer 42 formed in the recess 10X may have its upper surface 42A higher than, or protruded from, the upper surface 50A of the conductive substrate 50. When the upper surface 42A of the plating layer 42 protrudes from the upper surface 50A of the conductive substrate 50, it is preferable that the degree by which the plating layer 42 protrudes is less than the thickness of the adhesive 51B, which is used in a subsequent process.

The resist layer 55 is removed by using, for example, an alkaline delamination solution.

Figure 17D:
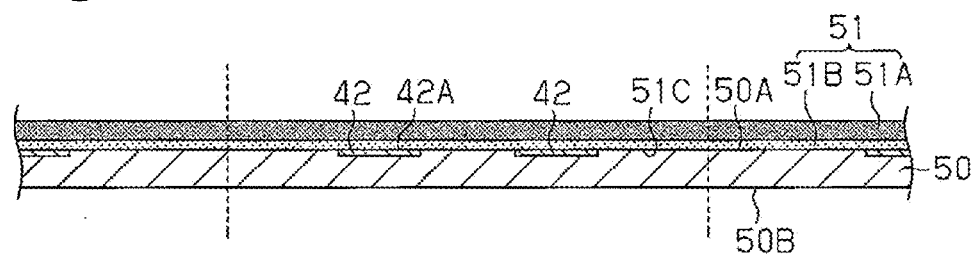

In the subsequent process (first process) illustrated in FIG. 17D, the tape 51 is adhered to the upper surface 50A of the conductive substrate 50. In detail, the tape 51, which is formed by a film of a tape base 51A having an adhesive 51B applied to one side, is adhered to the conductive substrate 50 with the surface 51C of the adhesive 51B adhered to the upper surface 50A. The upper surface 50A of the conductive substrate 50 is substantially flush with the upper surface 42A of the plating layer 42. Thus, the adhesive 51B on the tape 51 can be thin. For example, the adhesive 51B may have a thickness of, for example, 1 to 5 μm. The surfaces on which the adhesive 51B is placed (the upper surface 50A of the conductive substrate 50 and the upper surface 42A of the plating layer 42) are flat surfaces with small irregularities. Even when the adhesive 51B is thin, this structure prevents the adhesiveness and the contact between the tape 51 and the conductive substrate 50, which are adhered to each other by the adhesive 51B, from decreasing due to such irregularities.

Figure 17E:
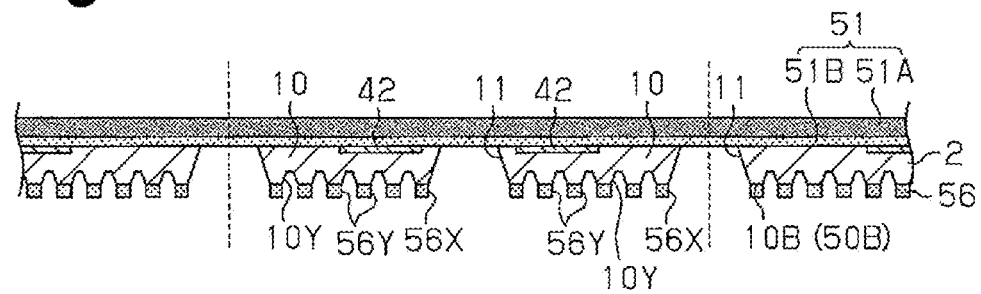

In the subsequent process illustrated in FIG. 17E, the resist layer 56 having openings 56X and 56Y at predetermined positions is formed on the lower surface 50B of the conductive substrate 50. The opening 56X is formed to expose a portion of the lower surface 50B of the conductive substrate 50 corresponding to where the opening 11 is to be formed. The opening 56Y is formed to expose portions of the lower surface 50B of the conductive substrate 50 corresponding to where the recesses 10Y are to be formed. The opening 56Y defines small openings each having a diameter of, for example, about 10 μm. The resist layer 56 may be formed from a material resistant to etching. The resist layer 56 may be formed from a photosensitive dry film resist or a liquid photoresist (dry film resist or liquid resist such as novolac resin or acrylic resin). When a photosensitive dry film resist is used, a dry film of the resist is laminated on the lower surface 50B of the conductive substrate 50 through thermocompression. The dry film is then patterned through photolithography to form the resist layer 56. The resist layer 56 can also be formed from a liquid photoresist through the same process as described for the dry film resist.

Subsequently, the conductive substrate 50 undergoes etching performed on its lower surface 50B using the resist layer 56 as an etching mask to form the substrate frame 2 illustrated in FIG. 17E (second process). More specifically, parts of the conductive substrate 50 exposed through the openings 56X and 56Y of the resist layer 56 are etched through the lower surface 50B to form the opening 11 in the conductive substrate 50. This completes the substrate frame 2. The opening 11 defines a plurality of leads 10 in each unit lead frame 4D. The above etching process also forms portions of the lower surface 10B of each lead 10 exposed from the opening 56Y of the resist layer 56 into the recesses 10Y. In detail, when the opening 56Y has a small opening diameter (e.g., about 10 µm), the etching rate decreases. Parts of the leads 10 exposed from the opening 56Y having such a small diameter are etched to form the recesses 10Y in the leads 10 so that the recesses 10Y do not extend through the leads 10 in the thickness direction. More specifically, forming the resist layer 56 having the opening 56X that corresponds with the opening 11 and the small-diameter opening 56Y enables the opening 11, which extends through the leads 10 in the thickness direction, and the recesses 10Y, which do not extend through the leads 10 in the thickness direction, to be formed at the same time. The small-diameter recesses 10Y are formed by a method that differs from a roughening process. When the opening 11 and the recesses 10Y are formed by wet etching, an etchant used in the wet etching process should be selected in accordance with the material of the conductive substrate 50. When the conductive substrate 50 is formed from copper, a ferric chloride solution may be used as the etchant. This allows for spray etching, or spraying the etchant onto the lower surface 50B of the conductive substrate 50 to form the opening 11 and the recesses 10Y. During such patterning performed by wet etching, side etching can occur in the conductive substrate 50 and the etching proceeds in the in-plane direction of the conductive substrate 50. This shapes the opening 11 and the recesses 10Y to have trapezoidal cross-sections. In this process, the tape 51 functions as an etching stopper layer.

The resist layer 56 is removed by using, for example, an alkaline delamination solution.

Figure 18A:
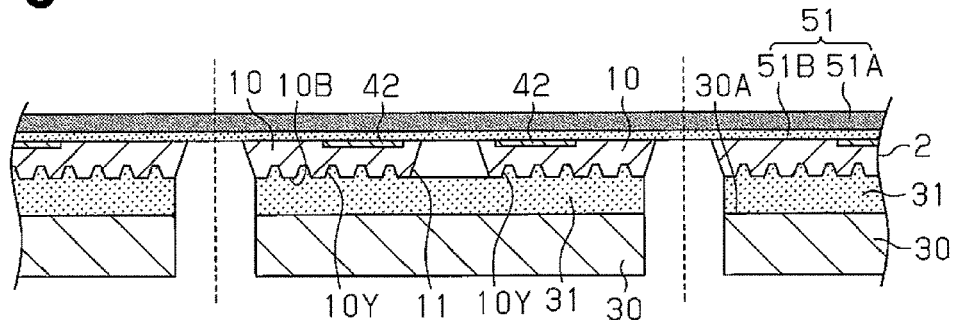
FIGS. 18A to 18D are schematic cross-sectional views illustrating a method for manufacturing the lead frame of the fifth embodiment, among which FIGS. 18A to 18C each illustrate a cross-section taken along line E-E in FIG. 16A.

In the subsequent process illustrated in FIG. 18A, the adhesive layer 31 and the heat radiating plate 30 are placed on the lower surface of this structure illustrated in FIG. 17E from which the resist layer 56 has been removed. More specifically, the adhesive layer 31 and the heat radiating plate 30 are stacked on the lower surface of the structure so that the upper surface of the adhesive layer 31 faces the lower surfaces 10B of the leads 10 and the upper surface of the heat radiating plate 30 faces the lower surface of the adhesive layer 31. In other words, the structure, the adhesive layer 31, and the heat radiating plate 30 are stacked so that the adhesive layer 31 is sandwiched between the leads 10 and the heat radiating plate 30. The adhesive layer 31 is in the B-stage (semi-cured).

The structure, the adhesive layer 31, and the heat radiating plate 30 in the above arrangement are heated and pressurized. This causes the adhesive layer 31 to be pressed into the recesses 10Y. The adhesive layer 31 fills the recesses 10Y. Also, this causes the upper surface of the adhesive layer 31 to come in contact with the lower surfaces 10B of the leads 10, and the upper surface of the heat radiating plate 30 to come in contact with the lower surface of the adhesive layer 31. The adhesive layer 31 is cured to adhere the heat radiating plate 30 to the leads 10. This forms the integrated structure illustrated in FIG. 18A.

Figure 18B:
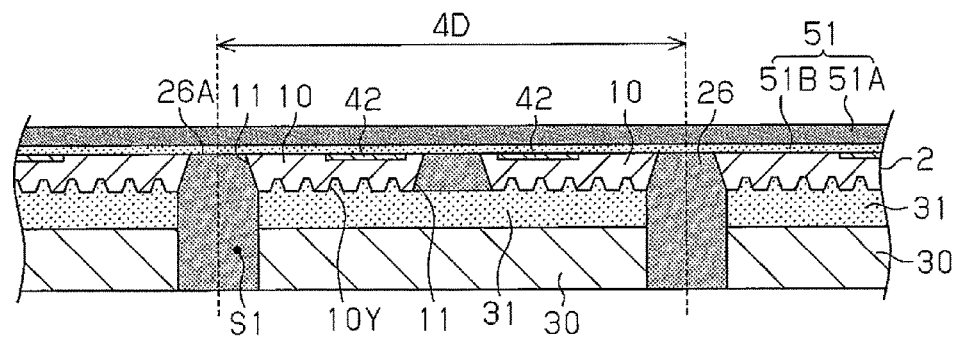
Figure 18C:
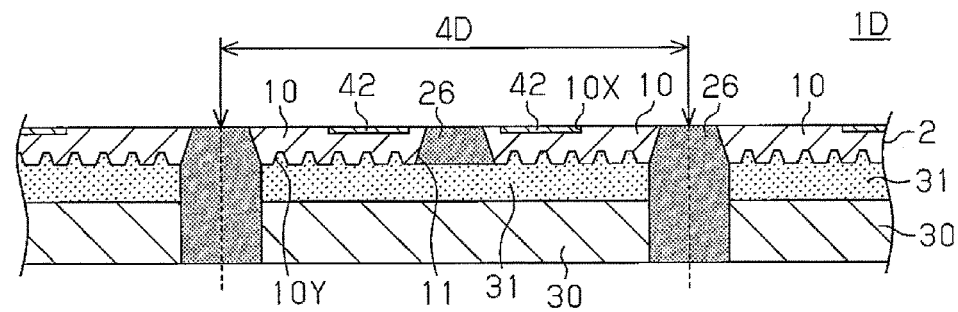

In the subsequent process (third process) illustrated in FIG. 18B, molded array packaging is performed to form the resin layer 26, which fills the opening 11 and the space S1 between adhesive layers 31 and heat radiating plates 30 of adjacent unit lead frames 4D. In the subsequent process (fourth process) illustrated in FIG. 18C, the tape 51 illustrated in FIG. 18B is removed.

Figure 18D:
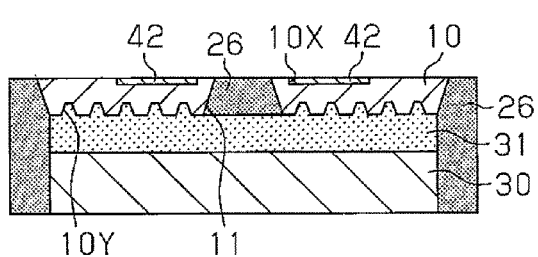

The manufacturing processes described above yield the lead frame 1D having the structure illustrated in FIGS. 16A and 16B, which includes the matrix of unit lead frames 4D each including the leads 10 having the recesses 10X and 10Y, the plating layers 42 formed in the recesses 10X, the adhesive layer 31, the heat radiating plate 30, and the resin layer 21. In one example, one or more semiconductor devices are mounted on each unit lead frame 4D of the lead frame 1D. The lead frame 1D then undergoes molded array packaging, which encapsulates the semiconductor elements mounted on each unit lead frame 4D. Alternatively, the lead frame 1D may be first singulated into individual unit lead frames 4D (lead frames) by cutting the resin layer 26 at positions indicated by the arrows with a dicing saw as illustrated in FIG. 18D. One or more semiconductor elements may then be mounted on each individual unit lead frame 4D.

Advantages

The above embodiment has the advantage described below in addition to advantages (1) to (3) of the first embodiment, advantage (4) of the second embodiment, and advantage (5) of the third embodiment.

(10) The plating layer 42 is formed in the recess 10X formed in the lower surface 10A of the lead 10. In this case, the upper surface 10A of the lead 10 and the upper surface 42A of the plating layer 42 are flat surfaces including small irregularities. Even when the adhesive 51B on the upper surface 10A of the lead 10 and the upper surface 42A of the plating layer 42 is thin, this structure prevents the adhesiveness and the contact between the tape 51 and the conductive substrate 50, which are adhered to each other by the adhesive 51B, from decreasing due to such irregularities. This allows the adhesive 51B to be thin and reduces manufacturing costs.

(11) The multiple small-diameter recesses 10Y are formed on the lower surface 10B of each lead 10 to provide the lower surface 10B of the lead 10 with a bumpy surface having ridges and valleys. The adhesive layer 31 is then adhered to the lower surface 10B of the lead 10 to fill the recesses 10Y. The adhesive layer 31 is mechanically engaged with each lead 10. This increases the contact between the adhesive layer 31 and the lead 10, and prevents the adhesive layer 31 and the heat radiating plate 30 from being separated from the lead 10.

(12) When the conductive substrate 50 is patterned to form the substrate frame 2, the resist layer 56 having the opening 56X that corresponds with the opening 11 and the opening 56Y having a small diameter is formed on the lower surface 50B of the conductive substrate 50. The conductive substrate 50 then undergoes etching performed on its lower surface 50B using the resist layer 56 as an etching mask. This causes the parts corresponding to the small-diameter opening 56Y to be etched at a lower etching rate. Thus, the opening 11, which extends through the lead 10 in the thickness direction, and the recesses 10Y, which do not extend through the lead 10 in the thickness direction, to be formed at the same time.

Modification of Fifth Embodiment

The fifth embodiment may be modified in the following forms.

In the fifth embodiment, the adhesive layer 31 may be omitted. An example of a method for manufacturing a lead frame of this modification will now be described with reference to FIGS. 19A to 19D.

Figure 19A:
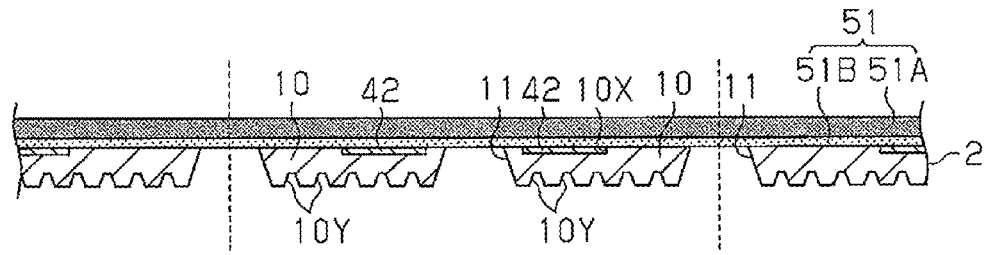
FIGS. 19A to 19D are schematic cross-sectional views illustrating a modification of the method for manufacturing a lead frame.

In the process illustrated in FIG. 19A, the same structure as illustrated in FIG. 17E is formed by the same processes as illustrated in FIGS. 17A to 17E, and the resist layer 56 is removed by using an alkaline delamination solution. In the subsequent process illustrated in FIG. 19B, a resin layer 27 covering the leads 10 and a heat radiating plate 33 are stacked on the surface 51C of the tape 51 in the stated order. The formation of the resin layer 27 as well as the stacking of the resin layer 27 and the heat radiating plate 33 may be performed by, for example, resin molding. When, for example, the resin layer 27 is formed from heat-curable molded resin, the structure illustrated in FIG. 19A and the heat radiating plate 33 are first placed in a mold with a predetermined distance between the structure and the heat radiating plate 33. The resin is then filled from a gate (not illustrated) into the corresponding resin encapsulating area 3 (refer to FIG. 1A), while the structure is being heated and pressurized. This forms the resin layer 27 between the leads 10 and the heat radiating plate 33. The resin layer 27 fills the opening 11 and the recesses 10Y. The resin layer 27 and the heat radiating plate 33 are stacked on the surface 51C of the tape 51. The upper surface 10A of each lead 10 and the upper surface 27A of the resin layer 27, which come in contact with the surface 51C of the tape 51, are formed to correspond with the surface 51C (flat surface) of the tape 51. The upper surface 10A of each lead 10 and the upper surface 20A of the resin layer 27 are flat and flush with each other. The resin is filled by, for example, transfer molding or injection molding.

The stacking of the resin layer 27 and the heat radiating plate 33 may alternatively be achieved through the following method. A structure in which a sheet of the resin layer 27 is adhered to the heat radiating plate 33 is prepared. The structure is arranged on the surface 51C of the tape 51 in the structure illustrated in FIG. 19A so that the resin layer 27 is opposed to the leads 10. The resin layer 27 is in the B-stage. The two structures are heated and pressurized from opposite sides in a vacuum atmosphere at temperatures of about 190 to 250° C. This forms the resin layer 27, which fills the opening 11 and the recesses 10Y. The resin layer 27 covers the leads 10. The resin 27 is cured to adhere to the leads 10.

As described above, the resin layer 27 fills the recesses 10Y of the leads 10. The resin layer 27 is mechanically engaged with each lead 10. This increases the contact between the resin layer 27 and the lead 10, and prevents the resin layer 27 and the heat radiating plate 33 from being separated from the lead 10. The resin layer 27 and the heat radiating plate 33 may have substantially the same size and the same shape as viewed from above as, for example, the resin encapsulating area 3 (refer to FIG. 1A).

Figure 19B:
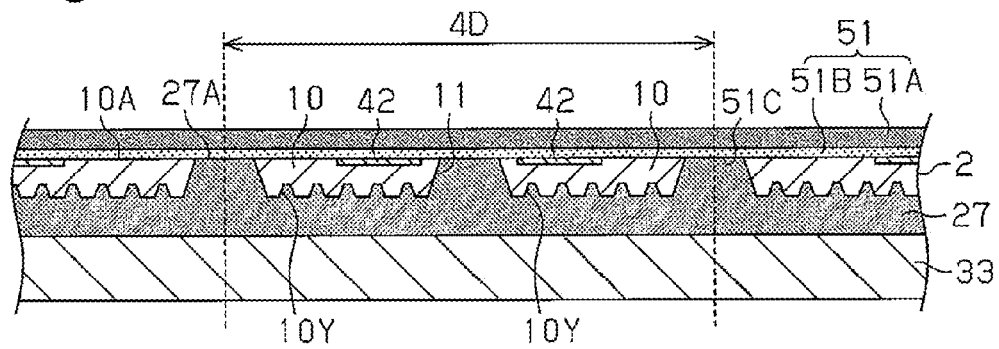
Figure 19C:
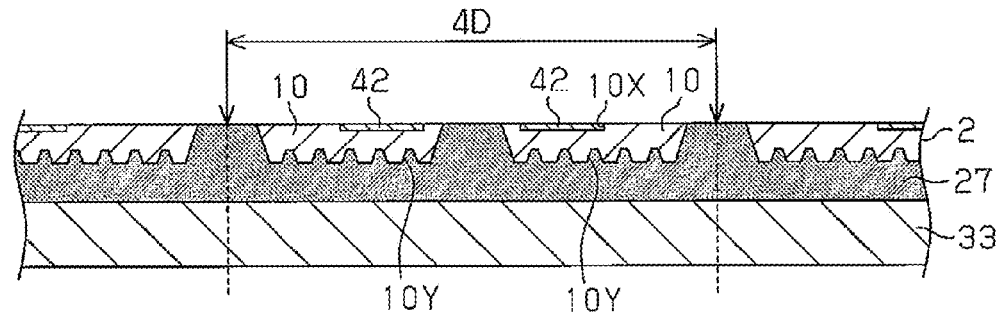

In the process illustrated in FIG. 19C, the tape 51 illustrated in FIG. 19B is removed. The processes described above yield the lead frame having the structure including the matrix of unit lead frames 4D each including the leads 10 having the recesses 10X and 10Y, the plating layers 42 formed in the recesses 10X, the resin layer 27, and the heat radiating plate 33.

The unit lead frames 4D are singulated by cutting the resin layer 27 at positions indicated by the arrows with a dicing saw. This yields individual unit lead frames 4D, (lead frames) one of which is illustrated in FIG. 19D.

Figure 19D:
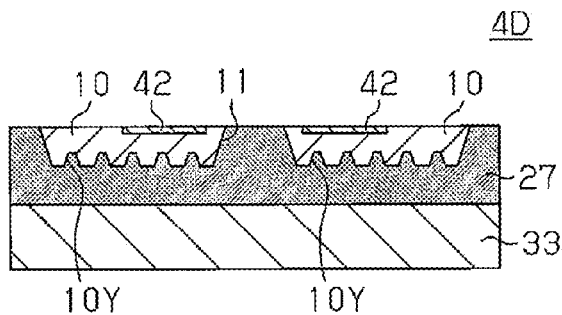
Figure 28A:
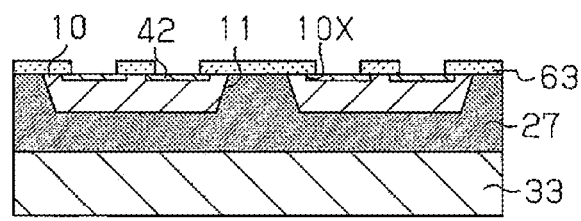
FIGS. 28A to 28D are schematic cross-sectional views illustrating modifications of a lead frame.

FIG. 28A illustrates a modification of the lead frame 4D of FIG. 19D. The lead frame 4D of FIG. 28A includes a solder resist layer 63 partially covering the upper surfaces 10A of the leads 10. The solder resist layer 63 may be a white resist layer. Each lead 10 includes one or more recesses 10X in its upper surface 10A. The lower surface 10B of each lead 10 does not include recesses. Each lead 10 may include a roughened lower surface 10B which includes recesses 10Y. In the illustrated example, the solder resist layer 63 is formed over the upper surface of the resin layer 27, parts of the upper surface of the plating layers 42, and parts of the upper surfaces of the leads 10.

Figure 28B:
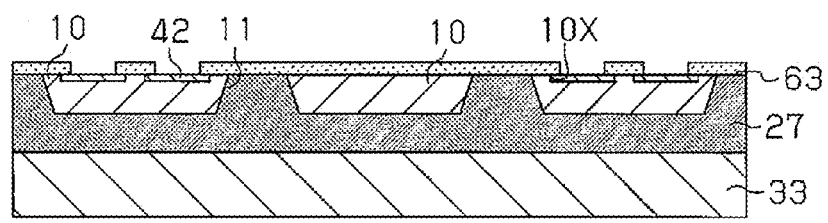

FIG. 28B illustrates a modification of the lead frame of FIG. 28A. The lead frame of FIG. 28B includes first leads 42, each of which includes at least one plating layer 42, and a second lead 42, which includes no plating layer 42. In the illustrated example, the second lead 42 is arranged between the first leads 42. The upper surface of the second lead 42 is entirely covered by the solder resist layer 63.

In the above modification illustrated in FIGS. 19A-19D, a resin layer 34 having a different viscosity from the resin layer 27 may be formed between the resin layer 27 and the heat radiating plate 33. An example of a method for manufacturing a lead frame of this modification will now be described with reference to FIGS. 20A to 20D.

Figure 20A:
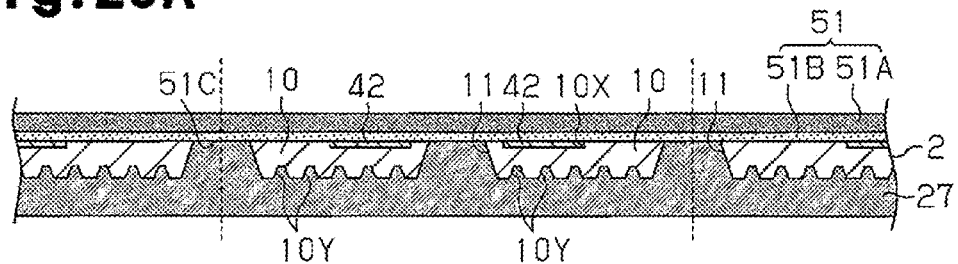
FIGS. 20A to 20D are schematic cross-sectional views illustrating a modification of the method for manufacturing a lead frame.

In the process illustrated in FIG. 20A, the same structure as illustrated in FIG. 17E is formed, and the resist layer 56 is removed. Subsequently, a resin layer 27 having a lower viscosity is formed on the surface 51C of the tape 51 to cover the leads 10. In one example, a sheet of the resin layer 27 in the B-stage may be laminated on the surface 51C of the tape 51 through thermocompression. This forms the leads 10 to be pressed into the resin layer 27. The resin layer 27 fills the opening 11 and the recesses 10Y. The resin layer 27 having a low viscosity can be filled into the opening 11 and the recesses 10Y in a reliable manner. The resin layer 27 is mechanically engaged with each lead 10. This increases the contact between the resin layer 27 and the lead 10, and prevents the resin layer 27 from being separating from the lead 10. The resin layer 27 may have a viscosity of, for example, about 500 Pa·s.

Subsequently, the resin layer 27 is cured at a temperature of about 150° C. (thermal curing process).

Figure 20B:
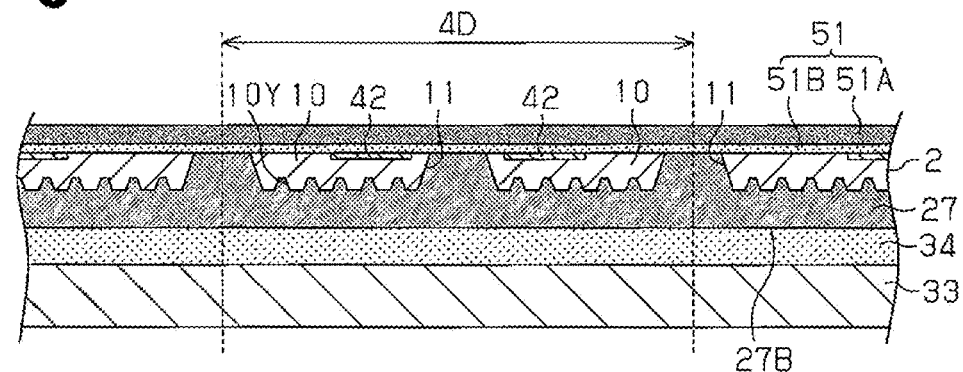

In the process illustrated in FIG. 20B, a resin layer 34 and a heat radiating plate 33 are stacked on the lower surface 27B of the resin layer 27 in the stated order. In one example, the structure in which the resin layer 34 is adhered to the heat radiating plate 33 is prepared. The structure is arranged on the lower surface of the structure illustrated in FIG. 20A so that the resin layer 34 is opposed to the resin layer 27. The resin layer 34 is in the B-stage. The two structures are heated and pressurized from opposite sides in a vacuum atmosphere at temperatures of about 100 to 200° C. This causes the upper surface of the resin layer 34 to come in contact with the lower surface 27B of the resin layer 27, and the upper surface of the heat radiating plate 33 to come in contact with the lower surface of the resin layer 34. The resin 34 is cured to adhere to the resin layer 27. The resin layer 34, which has a higher viscosity than the resin layer 27, may have a desired thickness after undergoing the pressurizing process described above. This improves the insulation between the heat radiating plate 33 and the leads 10, as compared with when only the resin layer 27 having a low viscosity is formed between the heat radiating plate 33 and the leads 10. The resin layer 34 may have a viscosity of, for example, about 2000 Pa·s. The resin layer 34 and the heat radiating plate 33 may have substantially the same size and the same shape as viewed from above as, for example, the resin encapsulating area 3 (refer to FIG. 1A). The resin layer 34 may be referred to as an adhesive resin layer.

Figure 20C:
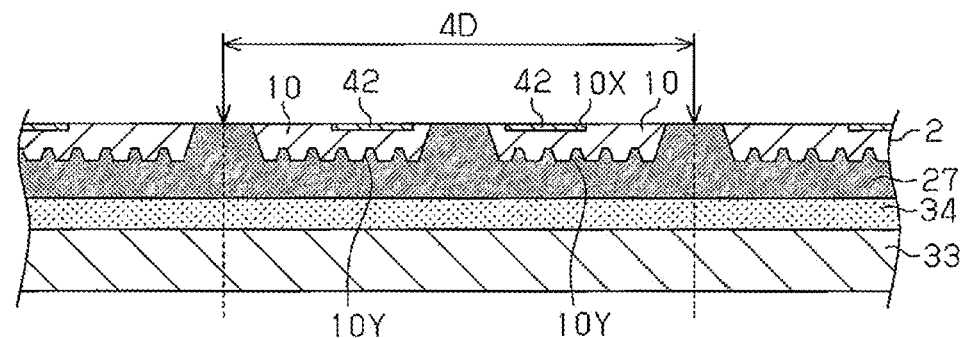

In the process illustrated in FIG. 20C, the tape 51 illustrated in FIG. 20B is removed. The processes described above yield the lead frame having the structure including the matrix of unit lead frames 4D each including the leads 10 having the recesses 10X and 10Y, the plating layers 42 formed in the recesses 10X, the resin layer 27, the resin layer 34, and the heat radiating plate 33.

The structure illustrated in FIG. 20C may be, for example, formed through the following method. More specifically, the resin layer 34 having a high viscosity, the resin layer 27 having a low viscosity, the substrate frame 2 on which the tape 51 is adhered, and the substrate frame 2 are stacked on the heat radiating plate 33 in the stated order. The tape 51 is removed from the substrate frame 2. The resin layers 27 and 34 are cured. This completes the substrate illustrated in FIG. 20C.

The unit lead frames 4D are singulated by cutting the resin layer 27, the resin layer 34, and the heat radiating plate 33 at positions indicated by the arrows with a dicing saw. This yields individual unit lead frames 4D (lead frames), one of which is illustrated in FIG. 20D.

Figure 20D:
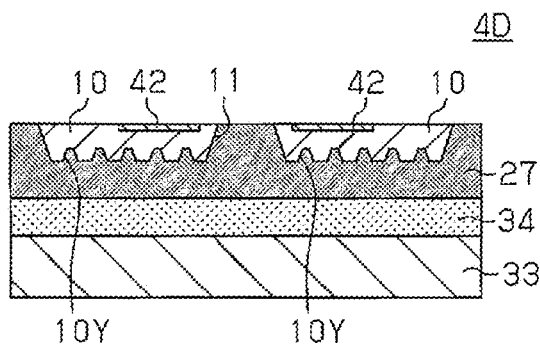
Figure 28C:
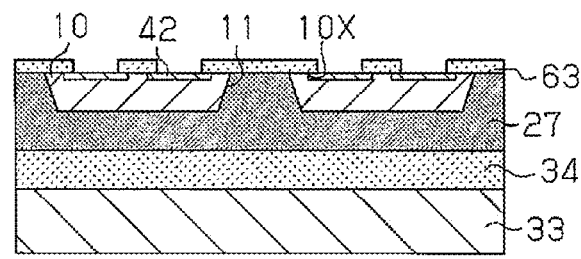

FIG. 28C illustrates a modification of the lead frame 4D of FIG. 20D. The lead frame 4D of FIG. 28C includes a solder resist layer 63 partially covering the upper surfaces 10A of the leads 10. The solder resist layer 63 may be a white resist layer. Each lead 10 includes one or more recesses 10X in its upper surface 10A. The lower surface 10B of each lead 10 does not include recesses. Each lead 10 may include a roughened lower surface 10B which includes recesses 10Y. In the illustrated example, the solder resist layer 63 are formed over the upper surface of the resin layer 27, parts of the upper surface of the plating layers 42, and parts of the upper surfaces of the leads 10.

Figure 28D:
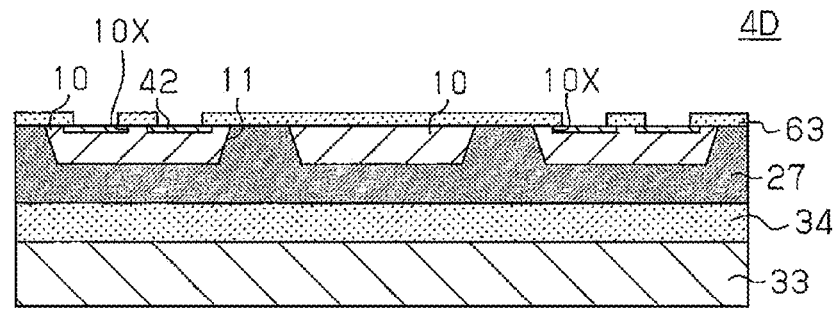

FIG. 28D illustrates a modification of the lead frame of FIG. 28C. The lead frame of FIG. 28D includes first leads 42, each of which includes at least one plating layer 42, and a second lead 42, which includes no plating layer 42. In the illustrated example, the second lead 42 is arranged between the first leads 42. The upper surface of the second lead 42 is entirely covered by the solder resist layer 63.

Other Embodiments

The above embodiments and modifications may be modified in the following forms.

The unit lead frames 4 and 4A to 4D in the above embodiments each include two leads 10. The embodiments and modifications should not be limited to this structure. For example, each unit lead frame may include three or more leads 10. An example of a lead frame including such unit lead frames will now be described with reference to FIGS. 21A and 21B.

As illustrated in FIG. 21B, each unit lead frame 4E includes three leads 10, plating layers 40 and 43 formed on the upper surfaces 10A of the leads 10, plating layers 41 formed on the lower surfaces 10B of the leads 10, an adhesive layer 31, a heat radiating plate 30, and a resin layer 28.

As illustrated in FIGS. 21A and 21B, the plating layer 43 covers the entire upper surface 10A of the lead 10 arranged in the middle of the unit lead frame 4E. The plating layer 43 also covers part of the upper surface 28A of the resin layer 28, which is formed between facing leads 10 arranged in each unit lead frame 4E. An opening 43X, which has a smaller opening width than the opening 11 defining the leads 10, is formed between the facing plating layers 43 arranged in each unit lead frame 4E. As illustrated in FIG. 21A, the plating layer 43 is substantially tetragonal as viewed from above. The plating layer 43 may be formed from the same metal layer as the plating layer 40. The plating layer 43 may be used as a lead, which is electrically connected to a semiconductor element, or as a die pad, onto which a semiconductor element is mounted. Although the plating layer 43 covers the entire upper surface 10A of the lead 10 in FIGS. 21A and 21B, the plating layer 43 may cover part of the upper surface 10A of the lead 10.

The adhesive layer 31 is formed on the lower surfaces 41B of the three plating layers 41 arranged in the unit lead frame 4E. More specifically, the adhesive layer 31 bridges the lower surfaces 41B of the three plating layers 41 arranged in the unit lead frame 4D. The adhesive layer 31 is used to adhere the plating layers 41 to the heat radiating plate 30 and also to insulate the plating layers 41 from the heat radiating plate 30.

The resin layer 28 fills the openings 11 and 41X and the space S1. The resin layer 28 has an upper surface 28A, which is substantially flush with the upper surface 10A of each lead 10, and a lower surface 28B, which is substantially flush with the lower surface 30B of the heat radiating plate 30. The resin layer 28 supports the leads 10 arranged in each unit lead frame 4E on the rails 5 and 6 (refer to FIG. 1A).

Although FIGS. 21A and 21B illustrate the modification of the unit lead frame 4C of the fourth embodiment, the unit lead frames 4, 4A, 4B, and 4D of the first to third and fifth embodiments may be modified in the same manner.

The leads 10 may be eliminated from the unit lead frames 4B and 4C in the lead frames 1B and 1C of the third and fourth embodiments, namely, the unit lead frames 4B and 4C including the plating layers 40. An example of a method for manufacturing a lead frame of this modification will now be described with reference to FIGS. 22A to 22D.

Figure 22A:
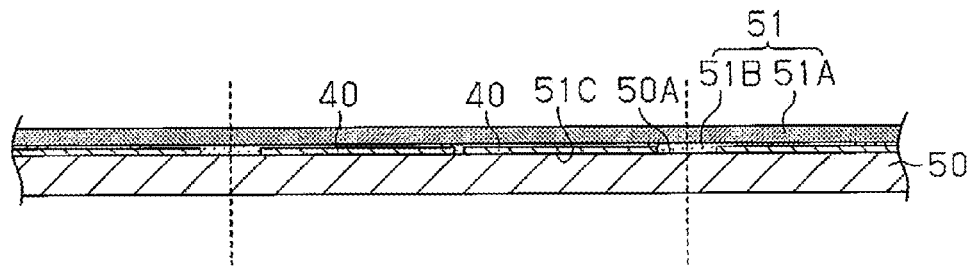
FIGS. 22A to 22E are schematic cross-sectional views illustrating a modification of the method for manufacturing a lead frame.

In the process illustrated in FIG. 22A, the same structure as that illustrated in FIG. 9D is formed through processes that are the same as those illustrated in FIGS. 9A to 9D.

Figure 22B:
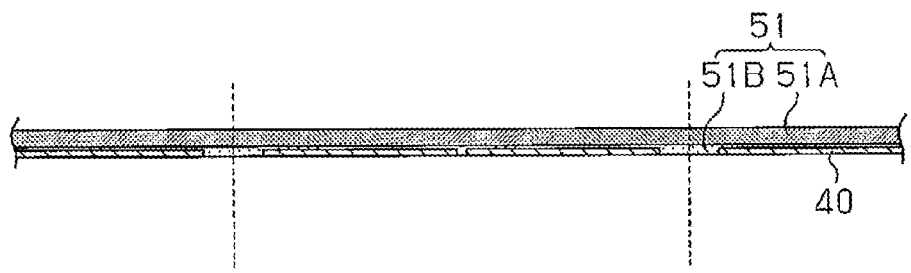

In the subsequent process illustrated in FIG. 22B, the conductive substrate 50 illustrated in FIG. 22A is removed. When, for example, the conductive substrate 50 is formed from copper, the conductive substrate 50 can be removed through wet etching using a ferric chloride solution, a copper chloride solution, or an ammonium persulfate solution. The tape base 51A is exposed on the upper surface of the structure illustrated in FIG. 22A, and the adhesive 51B of the tape 51 and the plating layers 40 (e.g., Ni layers) are exposed on the lower surface of the structure. This allows only the conductive substrate 50, which is a copper plate, to be selectively etched.

Figure 22C:
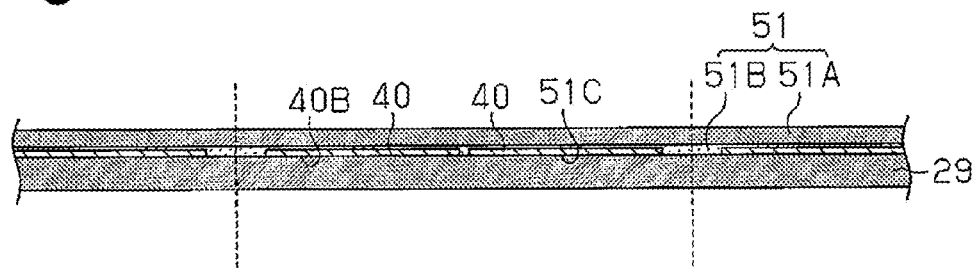

In the subsequent process illustrated in FIG. 22C, a resin layer 29 is formed on the surface 51C of the tape 51 to encapsulate the plating layers 40. This forms the resin layer 29, which covers the lower surface 40B of the plating layers 40.

Figure 22D:
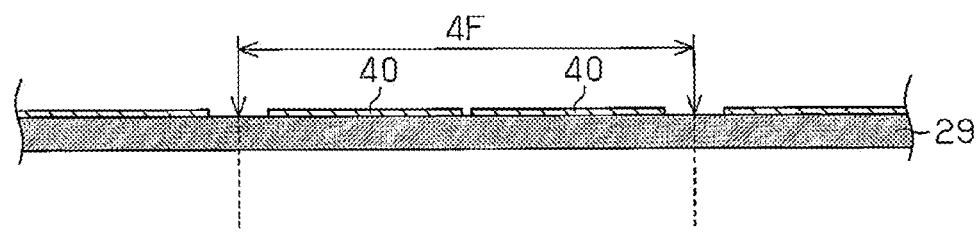

In the subsequent process illustrated in FIG. 22D, the tape 51 illustrated in FIG. 22C is removed. These processes yield the lead frame including the matrix of unit lead frames 4F, each including the plating layers 40 and the resin layer 29.

Figure 22E:
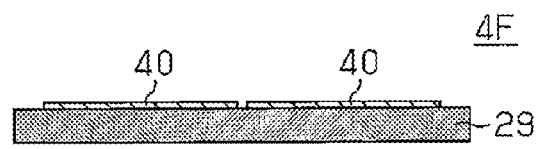

The unit lead frames 4F may be singulated by, for example, cutting the resin layer 29 at positions indicated by the arrows in FIG. 22D with a dicing saw. This yields individual unit lead frames (lead frames) 4E, one of which is illustrated in FIG. 22E.

In the first to fourth embodiments and their modifications, the lower surface 10B of each lead 10 may be a roughened surface. The side surfaces 10C of each lead 10 may also be roughened surfaces. The roughened lower surface 10B (and side surfaces 10C) may increase the contact between the leads 10 and the resin layers 20 to 26 and 28.

The upper surface 10A of each lead 10 in the above embodiments and modifications may be roughened.

The lower surface 41B of each plating layer 41 in the above embodiments and modifications may be roughened. The roughened surface can increase the contact between the plating layers 41 and the resin layers 24 and 25.

The unit lead frames 4A to 4E in the second to fifth embodiments and their modifications include the resin layers 21, 24, 26, and 28 having the lower surfaces 21B, 24B, 26B, and 28B, which are flush with the lower surface 30B of the heat radiating plate 30. The embodiments and modifications should not be limited to this structure. For example, the resin layers 21, 24, 26, and 28 may cover the lower surface 30B of the heat radiating plate 30.

The resin layers 20 to 29 in the above embodiments and modifications are formed by resin molding. Alternatively, the resin layers 20 to 29 may be formed through, for example, potting.

The unit lead frames 4 and 4A to 4E in the above embodiments and modifications should not be limited to particular shapes. The unit lead frames 4 and 4A to 4E may be in any shapes. The resin layer arranged in each of these lead frames only needs to fill the opening 11, which defines the leads 10, and support the leads 10.

The above embodiments and modifications provide the lead frame including the matrix of the unit lead frames 4 and 4A to 4F. Alternatively, the embodiments and modifications may provide a lead frame including the unit lead frames 4 and 4A to 4F arranged to form a belt-like structure. The lead frame only needs to include an array of unit lead frames, which may be in any arrangement.

The lead frames 1 and 1A to 1D of the above embodiments and modifications may be used, for example, for light emitting devices. Alternatively, the lead frames may be used for surface-mount packages that expose from one surface a plurality of terminals for connection to external devices. Such surface-mount packages include QFN, BGA (Ball Grid Array), LGA (Land Grid Array), CSP (Chip Size Package), and SON (Small Outline Non-lead Package).

Mounting Examples of Semiconductor Elements

FIGS. 23A to 26D and 29A to 29D are cross-sectional views of semiconductor devices formed by mounting semiconductor elements 60 or 66 onto the unit lead frame of one of the above embodiments and modifications.

Semiconductor Element Mounting Example 1

Figure 3D:
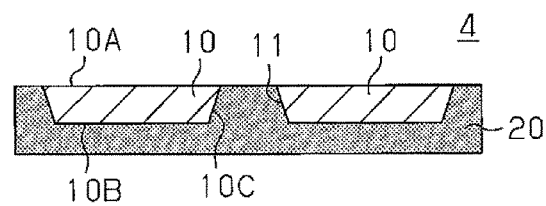
Figure 23A:
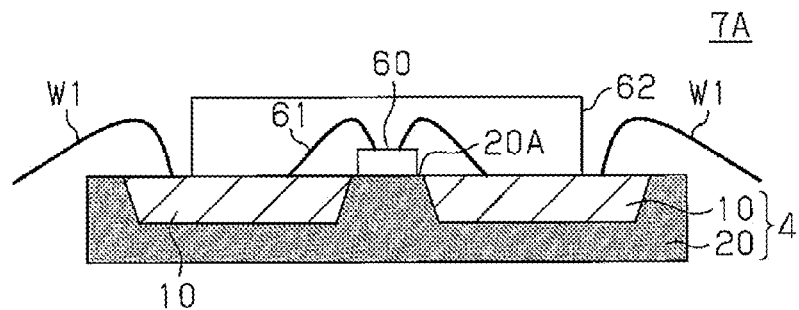
FIGS. 23A to 23D are schematic cross-sectional views of a semiconductor device.

A semiconductor device 7A illustrated in FIG. 23A includes the unit lead frame 4 illustrated in FIG. 3D. One or more semiconductor elements 60 are mounted on the upper surface 20A of the resin layer 20, which is formed between the leads 10 arranged in the unit lead frame 4. The electrodes (not illustrated) of the semiconductor element 60 are electrically connected to the leads 10 with bonding leads 61. The semiconductor element 60 and the bonding leads 61 are encapsulated by an encapsulating resin portion 62. The leads 10 are electrically connected to a mount substrate (not illustrated) by using wires W1, which are for connection to external devices, extending from parts of the leads 10 exposed from the encapsulating resin portion 62. Alternatively, the encapsulating resin portion 62 may have an opening at the position where each external-device connection wire W1 is connected. In this case, the leads 10 are electrically connected to the mount substrate by using the wires W extending from parts of the leads 10 exposed through the openings of the encapsulating resin portion 62.

The semiconductor element 60 may be, for example, a light emitting device such as a light emitting diode, an IC chip, or a LSI chip. The bonding wires 61 may be gold or aluminum thin wires. The encapsulating resin portion 62 may be formed from, for example, an insulating resin, such as epoxy resin, polyimide resin, or silicone resin.

An example of method for manufacturing the semiconductor device 7A will now be briefly described.

The lead frame 1 is manufactured with the method illustrated in FIGS. 2A to 3C. One or more semiconductor elements 60 are mounted on the resin layer 20, which is formed between the leads 10 of each unit lead frame 4. Subsequently, the electrodes of the semiconductor element 60 are electrically connected to the leads 10 with the bonding wires 61. This completes the mounting of the semiconductor element 60 onto each unit lead frame 4. Then, each unit lead frame 4 undergoes molded array packaging, which encapsulates the semiconductor element 60 and the bonding wires 61 with the encapsulating resin portion 62. The lead frame 4 is then singulated into individual semiconductor devices 7A by cutting the resin layer 20 at predetermined positions (refer to, for example, the arrows in FIG. 3C). This yields individual semiconductor devices 7A, one of which is illustrated in FIG. 23A. Subsequently, the semiconductor device 7A is mounted onto a mount substrate. The leads 10 and the mount substrate are electrically connected to each other by using the external-device connecting wires W1.

Semiconductor Element Mounting Example 2

Figure 23B:
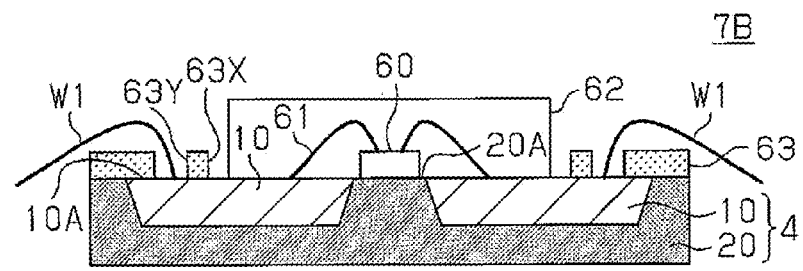

A semiconductor device 7B illustrated in FIG. 23B includes the unit lead frame 4 illustrated in FIG. 3D, a solder resist layer 63, one or more semiconductor elements 60, bonding wires 61, and an encapsulating resin portion 62.

The solder resist layer 63 partially covers the upper surfaces 10A of the leads 10 and the upper surface 20A of the resin layer 20. More specifically, the solder resist layer 63 has an opening 63X, through which the leads 10 and the resin layer 20 serving as a mount area for the semiconductor element 60 are exposed, and an opening 63Y, through which part of the lead 10 serving as an electrode terminal electrically connected to the mount substrate (not illustrated) is exposed. The solder resist layer 63 may be formed from an insulating resin, such as epoxy resin. When the semiconductor element 60 is a light emitting element, the solder resist layer 63 is preferably a reflective film having a high reflectivity. More specifically, the solder resist layer 63 has a reflectivity of 50% or greater (preferably, 80% or greater) at wavelengths of 450 to 700 nm. This solder resist layer 63 may be called a white resist layer. The solder resist layer 63 may be formed from, for example, a white insulating resin. The white insulating resin may be, for example, epoxy resin or organopolysiloxane resin containing a filler or a pigment formed from white titanium oxide or barium sulfate. The solder resist layer 63 may alternatively be formed from a black insulating resin. The black insulating resin may be a lightproof black resist, which may be formed from a lightproof black resin containing a photosensitive material. The black pigment may be a mixture of a plurality of pigments. One such example is a carbon black pigment or a titanium dioxide pigment.

The electrodes (not illustrated) of the semiconductor element 60, which is mounted on the surface 20A of the resin layer 20 formed between the leads 10, are electrically connected to portions of the leads 10 exposed through the opening 63X of the solder resist layer 63 by using the bonding wires 61. To encapsulate the semiconductor element 60 and the bonding wires 61, the encapsulating resin portion 62 is formed on portions of the leads 10 exposed through the opening 63X of the solder resist layer 63 and the resin layer 20. The leads 10 are electrically connected to the mount substrate (not illustrated) by using the external-device connecting wires W1, which extend from parts of the leads 10 exposed through the opening 63Y of the solder resist layer 63.

Semiconductor Element Mounting Example 3

Figure 23C:
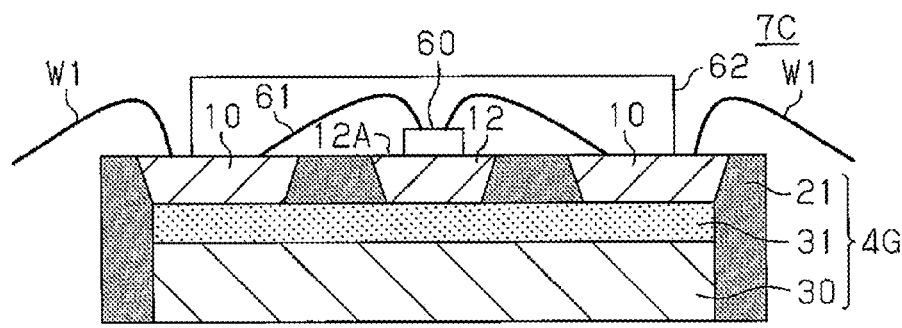

A semiconductor device 7C illustrated in FIG. 23C includes a unit lead frame 4G, which has the same structure as the unit lead frame 4A illustrated in FIG. 5D except that it includes a die pad 12. The unit lead frame 4G includes an adhesive layer 31 that bridges two leads 10 and the die pad 12. The adhesive layer 31 is used to adhere the leads 10, the die pad 12, and the heat radiating plate 30 to one another, and is used to insulate the leads 10, the die pad 12, and the heat radiating plate 30 from one another. One or more semiconductor elements 60 are mounted on the die pad 12 of the unit lead frame 4G. The electrodes (not illustrated) of the semiconductor element 60 are electrically connected to the leads 10 with the bonding wires 61. The die pad 12 is formed at the same time as the leads 10 when the substrate frame 2 is formed from the conductive substrate 50 by performing etching.

In the unit lead frame 4G, the adhesive layer 31 may be formed on only the lower surface of the die pad 12 and not on the lower surfaces of the leads 10. In this case, the adhesive layer 31 is used to adhere the heat radiating plate 30 to the die pad 12. In other words, this structure eliminates thermal coupling between the leads 10 and the heat radiating plate 30. Thus, there is no need to electrically insulate the die pad 12 from the heat radiating plate 30. This allows the adhesive layer 31 to be formed from a conductive material, such as a silver paste.

Semiconductor Element Mounting Example 4

Figure 23D:
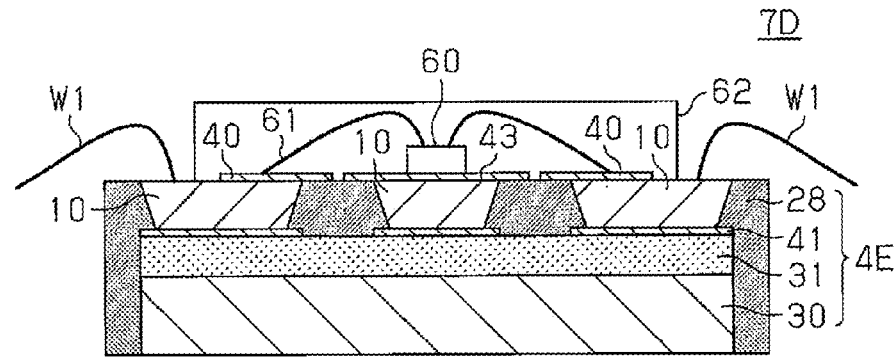

A semiconductor device 7D illustrated in FIG. 23D includes the unit lead frame 4E illustrated in FIG. 21B. One or more semiconductor elements 60 are mounted over the lead 10 arranged in the middle of the unit lead frame E, or more specifically, on the plating layer 43 formed on the lead 10 in the middle. The electrodes (not illustrated) of the semiconductor element 60 are electrically connected by the bonding wires 61 to two leads 10 sandwiching the lead 10 on which the semiconductor element 60 is mounted. This allows the lead 10 on which the plating layer 43 is formed to function as a die pad.

Semiconductor Element Mounting Example 5

Figure 24A:
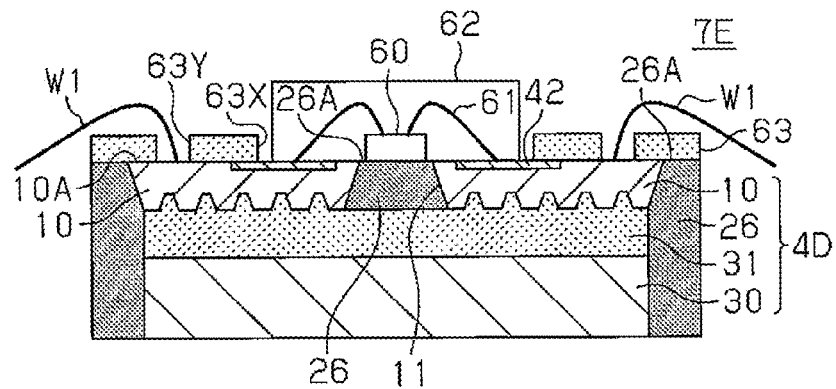
FIGS. 24A to 24C are schematic cross-sectional views of semiconductor devices.

A semiconductor device 7E illustrated in FIG. 24A includes the unit lead frame 4D illustrated in FIG. 18D, a solder resist layer 63, one or more semiconductor elements 60, bonding wires 61, and an encapsulating resin portion 62.

The solder resist layer 63 partially covers the upper surfaces 10A of the leads 10, the upper surfaces of the plating layers 42, and the upper surface 26A of the resin layer 26. More specifically, the solder resist layer 63 includes an opening 63X and an opening 63Y. The opening 63X exposes the mount area for the semiconductor element 60, namely, each lead 10, the plating layer 42, and the resin layer 26. The opening 63Y exposes a portion of each lead 10 serving as an electrode terminal, which is electrically connected to the mount substrate (not illustrated).

The electrodes (not illustrated) of the semiconductor element 60, which is mounted on the upper surface 26A of the resin layer 26 formed between the leads 10, are electrically connected to the plating layers 42 embedded in the leads 10 by using the bonding wires 61. To encapsulate the semiconductor element 60 and the bonding wires 61, the encapsulating resin portion 62 is formed on parts of the leads 10 exposed through the opening 63X of the solder resist layer 63, the plating layers 42, and the resin layer 26. The leads 10 are electrically connected to the mount substrate (not illustrated) by using the external-device connecting wires W1, which extend from portions of the leads 10 exposed through the opening 63Y of the solder resist layer 63.

Semiconductor Element Mounting Example 6

Figure 24B:
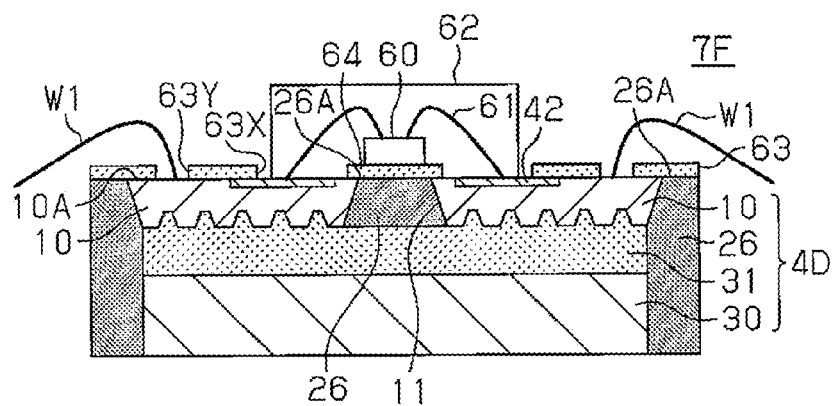

A semiconductor device 7F illustrated in FIG. 24B includes the unit lead frame 4D illustrated in FIG. 18D, a solder resist layer 63, a reflective layer 64, one or more semiconductor elements 60, bonding wires 61, and an encapsulating resin portion 62. The semiconductor device 7F differs from the semiconductor device 7E in that it includes the reflective layer 64.

The reflective layer 64 covers the upper surface 26A of the resin layer 26, which is formed between the leads 10. The reflective layer 64 has a high reflectivity. More specifically, the reflective layer 64 has a reflectivity of 50% or greater (preferably, 80% or greater) at wavelengths of 450 to 700 nm. The reflective layer 64 may be referred to as a white resist layer. This allows the reflective layer 64 to be formed from, for example, a white insulating resin. The white insulating resin may be, for example, epoxy resin or organopolysiloxane resin containing a filler or a pigment formed from white titanium oxide or barium sulfate. The solder resist layer 63 of the present example may be formed from the same white resist layer as used for the reflective layer 64. This allows the reflective layer 64 and the solder resist layer 63 to be formed at the same time.

The semiconductor element 60 is mounted on the reflective layer 64. The electrodes (not illustrated) of the semiconductor element 60 are electrically connected to the plating layers 42 embedded in the leads 10 by using the bonding wires 61. The reflective layer 64 formed on the lower surface of the semiconductor element 60 can improve, for example, the luminous efficiency of a light emitting device used as the semiconductor element 60.

Semiconductor Element Mounting Example 7

Figure 24C:
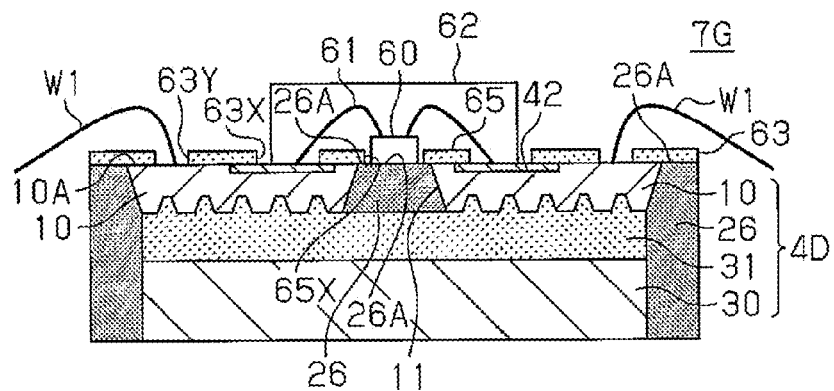

A semiconductor device 7G illustrated in FIG. 24C includes the unit lead frame 4D illustrated in FIG. 18D, a solder resist layer 63, a reflective layer 65, one or more semiconductor elements 60, bonding wires 61, and an encapsulating resin portion 62. The semiconductor device 7G differs from the semiconductor device 7E in that it includes the reflective layer 65.

The reflective layer 65 surrounds the semiconductor element 60, which is mounted on the resin layer 26 formed between the leads 10. More specifically, the reflective layer 65 has an opening 65X, through which the upper surface 26A of the resin layer 26 serving as a mount area for the semiconductor element 60 is exposed. The reflective layer 65 has a high reflectivity. The reflective layer 65 may be formed from the same material as the reflective layer 64. The solder resist layer 63 of the present example may be formed from the same white resist layer as used for the reflective layer 65. This allows the reflective layer 65 and the solder resist layer 63 to be formed at the same time.

The reflective layer 65 surrounding the semiconductor element 60 can improve, for example, the luminous efficiency of a light emitting device used as the semiconductor element 60.

Semiconductor Element Mounting Example 8

A semiconductor device 7H illustrated in FIG. 25A includes the unit lead frame 4H, which is obtained by adding a die pad 13 to the unit lead frame 4D illustrated in FIG. 18D. The semiconductor device 7H also includes a solder resist layer 63, a plurality of semiconductor elements 60, and an encapsulating resin portion 62. The semiconductor device 7H includes an adhesive layer 31 that bridges two leads 10 and the die pad 13. The adhesive layer 31 is used to adhere the leads 10, the die pad 13, and the heat radiating plate 30 to one another and to insulate the lead 10, the die pad 13, and the heat radiating plate 30 from one another.

The plurality of (e.g., four) semiconductor elements 60 are mounted on the upper surface 13A of the die pad 12. The electrodes (not illustrated) of the outermost semiconductor element 60 mounted on the die pad 13 are electrically connected to the plating layers 42 embedded in the leads 10 with the bonding wires 61. The electrodes of adjacent semiconductor elements 60 are connected to each other with the bonding wires 61. The lower surface of the die pad 13 has recesses 13Y having a small diameter in the same manner as the leads 10 having the recesses 10Y. The die pad 13 and the recesses 13Y are formed at the same time as the leads 10 and the recesses 10Y when the substrate frame 2 is formed from the conductive substrate 50 by performing etching.

As described above, the semiconductor elements 60 are mounted on the die pad 13 (copper layer). The die pad 13 efficiently radiates heat generated during operation of the semiconductor elements 60.

Semiconductor Element Mounting Example 9

A semiconductor device 7I illustrated in FIG. 25B includes the unit lead frame 4H described above, a solder resist layer 63, a reflective layer 64, a plurality of semiconductor elements 60, and an encapsulating resin portion 62. The semiconductor device 7I differs from the semiconductor device 7H described above in that it includes the reflective layer 64.

The reflective layer 64 covers the upper surface 13A of the die pad 13 and also covers a portion of the upper surface 26A of the resin layer 26, which is formed between the leads 10 and the die pad 13.

The plurality of semiconductor elements 60 are mounted on the reflective layer 64. The electrodes (not illustrated) of the outermost semiconductor element 60 mounted on the reflective layer 64 are electrically connected to the plating layers 42 embedded in the leads 10 with the bonding wires 61. The electrodes of adjacent semiconductor elements 60 are connected to each other with the bonding wires 61. The reflective layer 64 formed on the lower surface of the semiconductor element 60 improves, for example, the luminous efficiency of a light emitting device used as each semiconductor element 60.

Semiconductor Element Mounting Example 10

A semiconductor device 7J illustrated in FIG. 25C includes the unit lead frame 4H described above, a plating layer 44 embedded in a die pad 13, a plurality of semiconductor elements 60, and an encapsulating resin portion 62. The semiconductor device 7J differs from the semiconductor device 7H in that it includes the plating layer 44.

The upper surface 13A of the die pad 13 has a recess 13X at a predetermined position (single recess in FIG. 25C). The recess 13X extends from the upper surface 13A of the die pad 13 to a predetermined level in the thickness direction of the die pad 13. The recess 13X has a bottom surface at an intermediate position in the thickness direction of the die pad 13. The recess 13X is, for example, tetragonal as viewed from above.

The plating layer 44 is formed in the recess 13X of the die pad 13. The plating layer 44 has an upper surface 44A substantially flush with the upper surface 13A of the die pad 13. The side surfaces of the plating layer 44 are covered by the die pad 13, which forms the side walls of the recess 13X. In this manner, the plating layer 44 is embedded in the die pad 13. The plating layer 44 may be a metal layer having an Ag layer as its outermost layer exposed from the die pad 13.

The plurality of semiconductor elements 60 are mounted on the plating layer 44 (Ag layer). The electrodes (not illustrated) of the outermost semiconductor element 60 mounted on the plating layer 44 are electrically connected to the plating layers 42 embedded in the leads 10 with the bonding wires 61. The electrodes of adjacent semiconductor elements 60 are connected to each other with the bonding wires 61. The Ag layer (plating layer 44) having a high reflectivity formed on the lower surface of the semiconductor element 60 improves, for example, the luminous efficiency of a light emitting device used as each semiconductor element 60.

Semiconductor Element Mounting Example 11

Figure 26A:
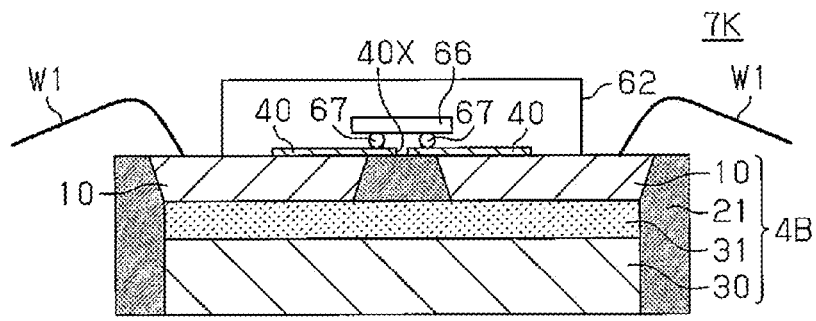
FIGS. 26A to 26D are schematic cross-sectional views of semiconductor devices.

A semiconductor device 7K illustrated in FIG. 26A includes the unit lead frame 4B illustrated in FIG. 10D. One or more semiconductor elements 66 are mounted on a pair of plating layers 40 arranged in the unit lead frame 4B. More specifically, the semiconductor element 66 is flip-chip mounted on the two plating layers 40 between which an opening 40X is formed. The semiconductor element 66 bridges the opening 40X. A bump 67, which is formed on one surface (e.g., lower surface) of the semiconductor element 66, is flip-chip bonded to one of the two plating layers 40. Another bump 67, which is formed on the surface of the semiconductor element 66, is flip-chip bonded to the other plating layer 40. This electrically connects the bumps 67 on the semiconductor element 66 to the leads 10 with the plating layers 40. The semiconductor element 66 and the bumps 67 are encapsulated by the encapsulating resin portion 62. The leads 10 are electrically connected to the mount substrate (not illustrated) by using the external-device connecting wires W1, which extend from parts of the lead 10 exposed from the encapsulating resin portion 62.

Each semiconductor element 66 may be, for example, a light emitting device such as a light emitting diode, an IC chip, or a LSI chip. The bumps 67 may be, for example, gold bumps or solder bumps. The solder bumps may be formed from an alloy containing Pb, a Sn—Au alloy, a Sn—Cu alloy, a Sn—Ag alloy, or a Sn—Ag—Cu alloy.

Semiconductor Element Mounting Example 12

Figure 26B:
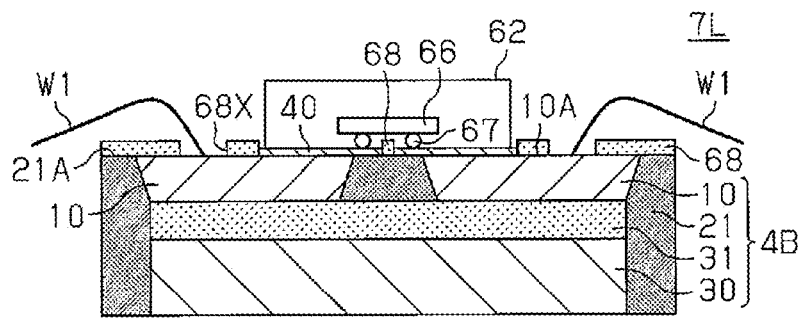

A semiconductor device 7L illustrated in FIG. 26B includes the unit lead frame 4B illustrated in FIG. 10D, a solder resist layer 68, one or more semiconductor elements 66, and an encapsulating resin portion 62.

The solder resist layer 68 covers portions of the upper surfaces 10A of the leads 10 exposed from the plating layer 40 and the upper surface 21A of the resin layer 21. The solder resist layer 68 has an opening 68X, through which a portion of the lead 10 is exposed to function as an electrode terminal, which is electrically connected to the mounting substrate (not illustrated). The solder resist layer 68 is formed from, for example, an insulating resin, such as epoxy resin. When the semiconductor element 66 is a light emitting element, the solder resist layer 68 is preferably a reflective film having a high reflectivity. More specifically, the solder resist layer 68 has a reflectivity of 50% or greater (preferably, 80% or greater) at wavelengths of 450 to 700 nm. This solder resist layer 68 may be called a white resist layer. The solder resist layer 68 may be formed from, for example, a white insulating resin. The white insulating resin may be, for example, epoxy resin or organopolysiloxane resin containing a filler or a pigment formed from white titanium oxide or barium sulfate. The solder resist layer 68 may alternatively be formed from a black insulating resin. The black insulating resin may be a lightproof black resist, which may be formed from a lightproof black resin containing a photosensitive material. The black pigment may be a mixture of a plurality of pigments. One such example is a carbon black pigment or a titanium dioxide pigment.

The semiconductor element 66 is flip-chip mounted on the plating layers 40 between which the solder resist layer 68 is formed. The semiconductor element 66 bridges the solder resist layer 68, which is formed between the two plating layers 40. This electrically connects the bumps 67 of the semiconductor element 66 to the leads 10 via the plating layers 40. To encapsulate the semiconductor element 66 and the bumps 67, the encapsulating resin portion 62 is formed on the plating layer 40. The leads 10 are electrically connected to the mount substrate (not illustrated) by using the external-device connecting wires W1, which extend from parts of the leads 10 exposed from the openings 68X of the solder resist layer 68.

Semiconductor Element Mounting Example 13

Figure 26C:
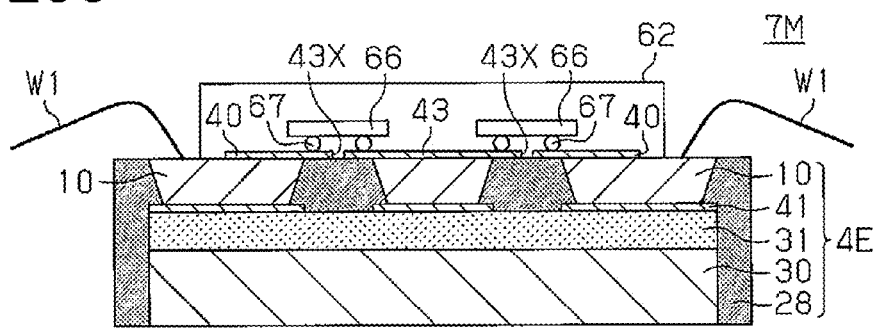

A semiconductor device 7M illustrated in FIG. 26C includes the unit lead frame 4E illustrated in FIG. 21B. A semiconductor element 66 is mounted on the plating layer 43 and one of the plating layers 40 arranged in the unit lead frame 4E. Another semiconductor element 66 is mounted on the plating layer 43 and the other plating layer 40. More specifically, each semiconductor element 66 is flip-chip mounted on the two plating layers 40 and 43 between which an opening 43X is formed. Each semiconductor element 66 bridges the opening 43X formed between the plating layers 40 and 43. More specifically, one bump 67 formed on the lower surface of each semiconductor element 66 is flip-chip mounted on the plating layer 40. Another bump 67 is flip-chip bonded to the plating layer 43. This electrically connects the bumps 67 arranged in each semiconductor element 66 to the lead 10 with the plating layers 40 and 43. The semiconductor elements 66 and the bumps 67 are encapsulated by the encapsulating resin portion 62.

This allows the lead 10 on which the plating layer 43 is formed to function as a lead.

Semiconductor Element Mounting Example 14

Figure 26D:
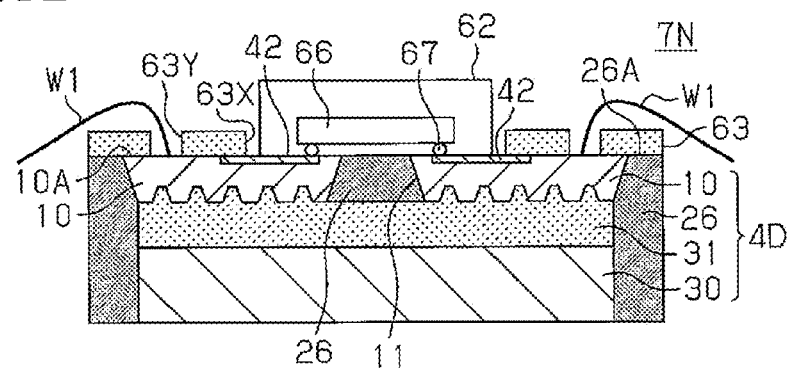
Figure 27A:
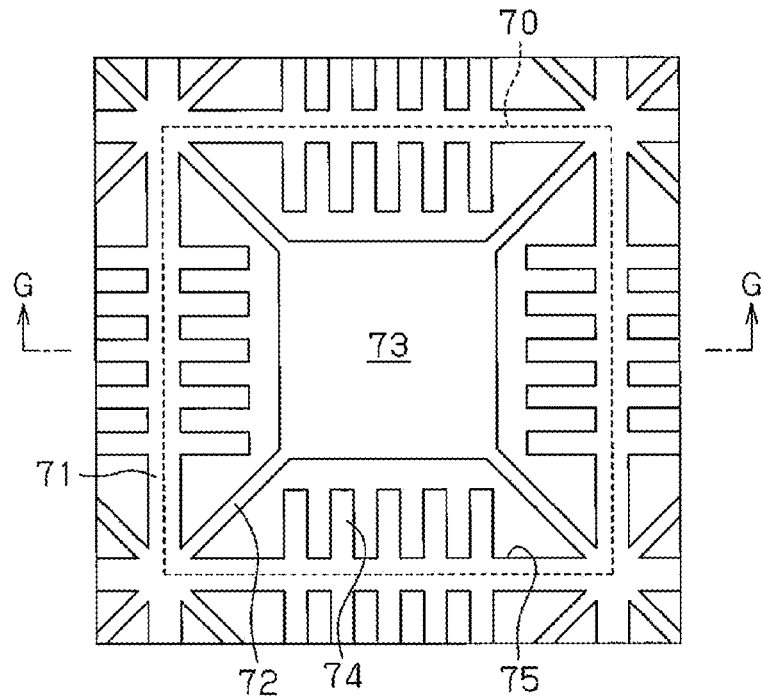
FIG. 27A is an enlarged plan view of a conventional lead frame.
Figure 27B:
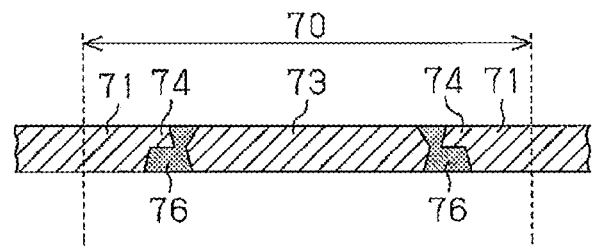
FIG. 27B is a schematic cross-sectional view taken along line G-G of FIG. 27A.
Figure 27C:
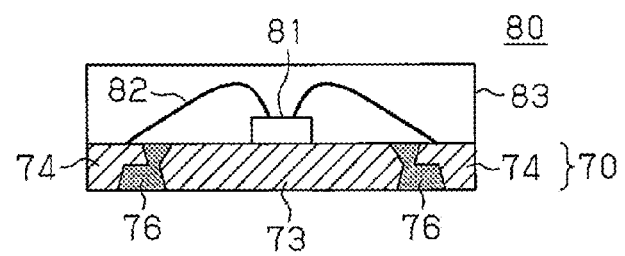
FIG. 27C is a schematic cross-sectional view of a conventional semiconductor device.

A semiconductor device 7N illustrated in FIG. 26D includes the unit lead frame 4D illustrated in FIG. 18D, a solder resist layer 63, one or more semiconductor elements 60, and an encapsulating resin portion 62.

The solder resist layer 63 covers portions of the upper surfaces 10A of the leads 10, portions of the upper surfaces of the plating layers 42, and a portion of the upper surface 26A of the resin layer 26. More specifically, the solder resist layer 63 has an opening 63X and an opening 63Y. The opening 63X exposes the leads 10, the plating layers 42, and the resin layer 26 serving as a mount area for the semiconductor element 60. The opening 63Y exposes a portion of the lead 10 serving as an electrode terminal electrically connected to the mount substrate (not illustrated).

The semiconductor element 66 is flip-chip mounted on the two plating layers 42, between which the leads 10 and the resin layer 26 are formed. The semiconductor element 66 bridges the leads 10 and the resin layer 26 formed between the two plating layers 42. This electrically connects the bumps 67 of the semiconductor element 66 to the leads 10 via the plating layers 42. The semiconductor element 66 and the bumps 67 are encapsulated by the encapsulating resin portion 62. The leads 10 are electrically connected to the mount substrate (not illustrated) by using the external-device connecting wires W1, which extend from parts of the leads 10 exposed from the encapsulating resin portion 62.

Semiconductor Element Mounting Example 15

Figure 29A:
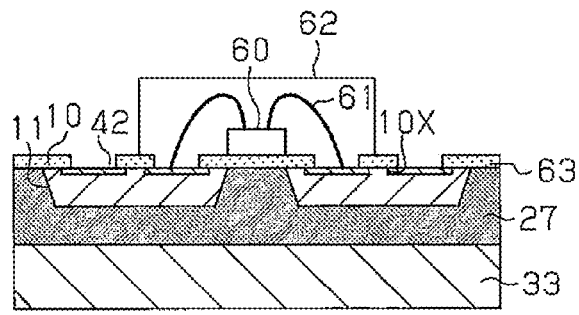
FIGS. 29A to 29D are schematic cross-sectional views illustrating modifications of a semiconductor device.

A semiconductor device illustrated in FIG. 29A includes a semiconductor element 60 mounted on the lead frame 4D illustrated in FIG. 28A. The bottom of the semiconductor element 60 is in direct contact with the upper surface of the solder resist layer 63. The semiconductor element 60 may be arranged on the solder resist layer 63 above the resin layer 27 between the leads 10. The electrodes (not illustrated) of the semiconductor element 60 are electrically connected to the plating layers 42 embedded in the leads 10 by using the bonding wires 61. The encapsulating resin portion 62 is formed to encapsulate the semiconductor element 60 and the bonding wires 61. The encapsulating resin portion 62 may entirely cover the plating layers 42 connected to the bonding wires 61. The encapsulating resin portion 62 may not encapsulate the plating layers 42 that are not connected to the bonding wires 61.

Semiconductor Element Mounting Example 16

Figure 29B:
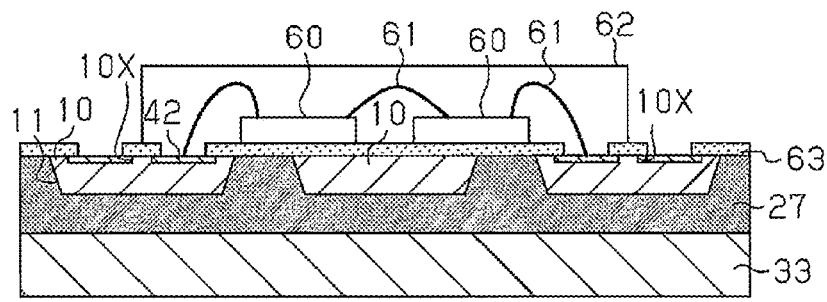

A semiconductor device illustrated in FIG. 29B includes semiconductor elements 60 mounted on the lead frame 4D illustrated in FIG. 28B. The bottom of each semiconductor element 60 is in direct contact with the upper surface of the solder resist layer 63. The semiconductor elements 60 may be arranged on a part of the solder resist layer 63 extending over a part of the resin layer 27 and the second lead 10 between the first leads 10. The electrodes (not illustrated) of one of the semiconductor elements 60 are electrically connected to the plating layer 42 embedded in the first lead 10 and to an electrode of the other one of the semiconductor elements 60 by using the bonding wires 61.

The encapsulating resin portion 62 is formed to encapsulate the semiconductor elements 60 and the bonding wires 61. The encapsulating resin portion 62 may entirely cover the plating layers 42 connected to the bonding wires 61. The encapsulating resin portion 62 may not encapsulate the plating layers 42 that are not connected to the bonding wires 61.

Semiconductor Element Mounting Example 17

Figure 29C:
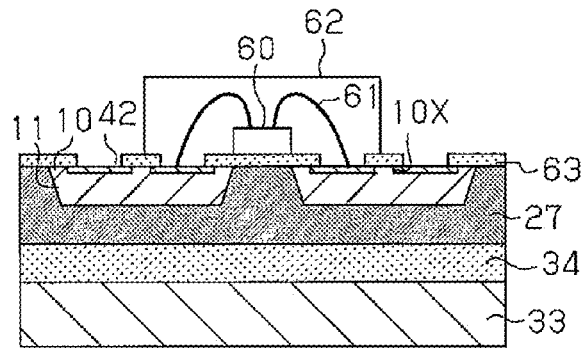

A semiconductor device illustrated in FIG. 29C includes a semiconductor element 60 mounted on the lead frame illustrated in FIG. 28C. The bottom of the semiconductor element 60 is in direct contact with the upper surface of the solder resist layer 63. The semiconductor element 60 may be arranged on a part of the solder resist layer 63 extending over a part of the resin layer 27 between the leads 10. The electrodes (not illustrated) of the semiconductor element 60 are electrically connected to the plating layers 42 embedded in the leads 10 by using the bonding wires 61. The encapsulating resin portion 62 is formed to encapsulate the semiconductor element 60 and the bonding wires 61. The encapsulating resin portion 62 may entirely cover the plating layers 42 connected to the bonding wires 61. The encapsulating resin portion 62 may not encapsulate the plating layers 42 that are not connected to the bonding wires 61.

Semiconductor Element Mounting Example 18

Figure 29D:
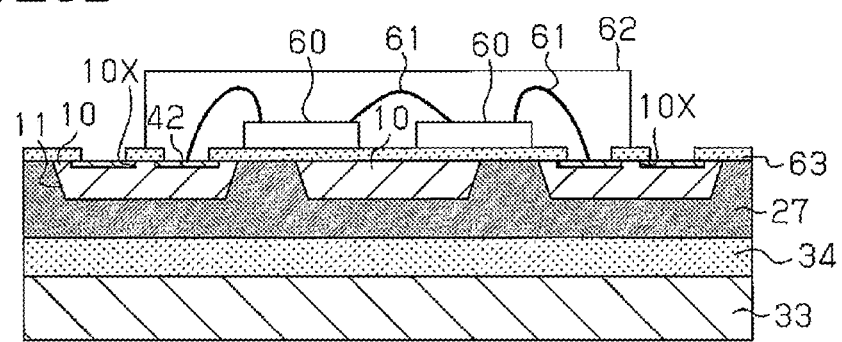

A semiconductor device illustrated in FIG. 29D includes semiconductor elements 60 mounted on the lead frame 4D illustrated in FIG. 28D. The bottom of each semiconductor element 60 is in direct contact with the upper surface of the solder resist layer 63. The semiconductor elements 60 may be arranged on a part of the solder resist layer 63 extending over a part of the resin layer 27 and the second lead 10 between the first leads 10. The electrodes (not illustrated) of one of the semiconductor elements 60 are electrically connected to the plating layer 42 embedded in the first lead 10 and to an electrode of the other one of the semiconductor elements 60 by using the bonding wires 61. The encapsulating resin portion 62 is formed to encapsulate the semiconductor elements 60 and the bonding wires 61. The encapsulating resin portion 62 may entirely cover the plating layers 42 connected to the bonding wires 61. The encapsulating resin portion 62 may not encapsulate the plating layers 42 that are not connected to the bonding wires 61.

The above modifications and the embodiments may be combined with each other.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A lead frame comprising:
a plurality of leads defined by an opening extending in a thickness direction; and
an insulating resin layer that fills the opening to entirely cover all side surfaces of each lead and to support the leads,
wherein
a first surface of each lead is exposed from and is substantially flush with a first surface of the insulating resin layer,
each lead includes a second surface opposing the first surface of the lead, and
the lead frame further includes a metal or alloy heat radiating plate adhered by an adhesive layer to the second surfaces of the leads wherein the heat radiating plate is electrically insulated from the plurality of leads.

2. The lead frame according to claim 1, further comprising a first plating layer formed over the first surface of each lead.

3. The lead frame according to claim 2, wherein
the first surface of each lead includes a recess, and
the first plating layer is formed in the recess.

4. The lead frame according to claim 1, wherein the second surface is a roughened surface or a bumpy surface.

5. The lead frame according to claim 1, wherein the insulating resin layer entirely covers all side surfaces of the heat radiating plate and all side surfaces of the adhesive layer.

6. A semiconductor device comprising:
a lead frame including a plurality of leads, defined by an opening extending in a thickness direction, and an insulating resin layer filling the opening to entirely cover all side surfaces of the leads and to support the leads, wherein
the insulating resin layer includes a first surface and a second surface opposing the first surface,
a first surface of each lead is exposed from and is substantially flush with the first surface of the insulating resin layer, and
the lead frame further includes a metal or alloy heat radiating plate arranged on the second surface of the insulating resin layer wherein the heat radiating plate is electrically insulated from the plurality of leads;
a semiconductor element mounted on the lead frame and connected to the leads; and
an encapsulating resin encapsulating the semiconductor element,
wherein the first surface of each lead is defined on a side where the semiconductor device is mounted on the lead frame.

7. The semiconductor device according to claim 6, wherein the semiconductor element is flip-chip-connected to the lead frame.

8. The semiconductor device according to claim 6, further comprising a solder resist layer covering a portion of each lead.

9. A lead frame comprising:
a plurality of leads physically separated from one another by a patterned opening, wherein each lead includes a first surface, an opposite second surface, and a plurality of side surfaces excluding the first surface and the second surface;
an insulating resin layer that fills at least the patterned opening and entirely covers the second surface and all of the side surfaces of each lead without covering the first surface of each lead, wherein the insulating resin layer is in direct contact entirely with all of the side surfaces of each lead; and the first surface of each lead is exposed from and is substantially flush with a first surface of the insulating resin layer, and
a metal or alloy heat radiating plate arranged on the insulating resin layer and opposed to the second surfaces of the leads wherein the heat radiating plate is electrically insulated from the plurality of leads.

10. The lead frame according to claim 9, further comprising an adhesive resin layer arranged between and adhered to the insulating resin layer and the heat radiating plate.

11. The lead frame according claim 9, further comprising a solder resist layer formed over at least a part of the first surface of each lead.

12. A semiconductor device comprising:
a lead frame, including
a plurality of leads physically separated from one another by a patterned opening, wherein each lead includes a first surface, an opposite second surface, and a plurality of side surfaces excluding the first surface and the second surface,
an insulating resin layer that fills at least the patterned opening and entirely covers the second surface and all of the side surfaces of each lead without covering the first surface of each lead, wherein the insulating resin layer is in direct contact entirely with all of the side surfaces of each lead, and the first surface of each lead is exposed from and is substantially flush with a first surface of the insulating resin layer, a metal or alloy heat radiating plate arranged on the insulating resin layer and opposed to the second surfaces of the leads wherein the heat radiating plate is electrically insulated from the plurality of leads, and a solder resist layer formed over at least a part of the first surface of each lead; and a semiconductor element mounted on the solder resist layer, wherein a bottom of the semiconductor element is in direct contact with the solder resist layer.

13. The lead frame according to claim 9, further comprising a first plating layer formed over the first surface of each lead.

14. The lead frame according to claim 13, wherein
the first surface of each lead includes a recess, and
the first plating layer is formed in the recess.

15. The lead frame according to claim 9, wherein the second surface is a roughened surface or a bumpy surface.

* * * * *

UNITED STATES PATENT AND TRADEMARK OFFICE
CERTIFICATE OF CORRECTION

PATENT NO. : 8,928,130 B2
APPLICATION NO. : 13/848225
DATED : January 6, 2015
INVENTOR(S) : Toshio Kobayashi et al.

It is certified that error appears in the above-identified patent and that said Letters Patent is hereby corrected as shown below:

In the Claims

Col. 36, line 43, Claim 9, delete "lead;" and insert -- lead, --, therefor.

Col. 36, line 45, Claim 9, delete "layer," and insert -- layer; --, therefor.

Col. 36, line 53, Claim 11, after "according" insert -- to --.

Signed and Sealed this
Twenty-first Day of April, 2015

Michelle K. Lee
*Director of the United States Patent and Trademark Office*